US012709536B2

(12) United States Patent
Melnikov et al.

(10) Patent No.: US 12,709,536 B2
(45) Date of Patent: Aug. 18, 2026

(54) MEMS DEVICE, NEARFIELD LOUDSPEAKER, HEARABLE, MEMS PUMP, LOUDSPEAKER AND METHOD FOR CONTROLLING AN MEMS DEVICE

(71) Applicants: Fraunhofer-Gesellschaft zur Förderung der angewandten Forschung e.V., Munich (DE); Robert Bosch GmbH, Stuttgart (DE)

(72) Inventors: Anton Melnikov, Dresden (DE); Lutz Ehrig, Dresden (DE); Hermann Schenk, Dresden (DE)

(73) Assignees: Fraunhofer-Gesellschaft zur Förderung der angewandten Forschung e. V., Munich (DE); Robert Bosch GmbH, Stuttgart (DE)

( * ) Notice: Subject to any disclaimer, the term of this patent is extended or adjusted under 35 U.S.C. 154(b) by 614 days.

(21) Appl. No.: 18/182,758

(22) Filed: Mar. 13, 2023

(65) Prior Publication Data

US 2023/0212002 A1 Jul. 6, 2023

Related U.S. Application Data

(63) Continuation of application No. PCT/EP2020/075654, filed on Sep. 14, 2020.

(51) Int. Cl.
*B81B 3/00* (2006.01)

(52) U.S. Cl.
CPC .... *B81B 3/0021* (2013.01); *B81B 2201/0257* (2013.01); *B81B 2201/036* (2013.01);
(Continued)

(58) Field of Classification Search
CPC .......... B81B 3/0021; B81B 2201/0257; B81B 2201/036; B81B 2203/0163;
(Continued)

(56) References Cited

U.S. PATENT DOCUMENTS

| | | | | |
|---|---|---|---|---|
| 3,780,824 | A | 12/1973 | Prince | |
| 2004/0120057 | A1 * | 6/2004 | Niendorf | B81B 3/007 359/872 |

(Continued)

FOREIGN PATENT DOCUMENTS

| | | | |
|---|---|---|---|
| DE | 102014225934 | A1 | 6/2016 |
| DE | 102015206774 | A1 | 10/2016 |

(Continued)

OTHER PUBLICATIONS

Ehrig Lutz et al,. "Acoustic Validation of Electrostatic All-Silicon MEMS-Speakers" Conference: 2019 AES International Conference on Headphone Technology; Aug. 2019, AES, 60 East 42nd Street, Room 2520 New York 10165-2520, USA, Aug. 21, 2019 (Aug. 21, 2019) XP 040706733.

*Primary Examiner* — Moazzam Hossain
(74) *Attorney, Agent, or Firm* — Bridgeway IP Law Group, PLLC; Jihun Kim

(57) ABSTRACT

An MEMS device includes a substrate with a substrate plane, a mass element having a rest position and configured to perform a deflection from the rest position parallel to the substrate plane and in a fluid surrounding the mass element. Further, the MEMS device includes a spring arrangement that is coupled between the substrate and the mass element and configured to deform based on the deflection. An actuator structure is provided that is coupled to the mass element by means of a coupling and configured to apply a force to the mass element by means of the coupling to cause the deflection and a movement of the fluid.

33 Claims, 34 Drawing Sheets

(52) U.S. Cl.
CPC ................. *B81B 2203/0163* (2013.01); *B81B 2203/0315* (2013.01); *B81B 2203/04* (2013.01); *B81B 2203/051* (2013.01)

(58) Field of Classification Search
CPC ........ B81B 2203/0315; B81B 2203/04; B81B 2203/051; B81B 2201/032; H04R 19/005; H04R 1/2811; H04R 1/2834; H04R 17/00; H04R 2201/003
See application file for complete search history.

(56) References Cited

U.S. PATENT DOCUMENTS

| | | | | |
|---|---|---|---|---|
| 2009/0189481 | A1 | 7/2009 | Kaajakari | |
| 2013/0121509 | A1* | 5/2013 | Hsu | H04R 19/013 438/22 |
| 2013/0301101 | A1 | 11/2013 | Conrad et al. | |
| 2016/0173001 | A1 | 6/2016 | Langa et al. | |
| 2016/0304333 | A1 | 10/2016 | Gaudet et al. | |
| 2017/0051874 | A1 | 2/2017 | Strobel | |
| 2018/0098139 | A1* | 4/2018 | Arevalo Carreno | H04R 31/006 |
| 2018/0179048 | A1* | 6/2018 | Schenk | B81C 1/00158 |
| 2018/0216935 | A1* | 8/2018 | Senkal | G01C 19/5747 |
| 2019/0082252 | A1 | 3/2019 | Grazian et al. | |
| 2020/0087138 | A1 | 3/2020 | Schenk et al. | |
| 2020/0189907 | A1 | 6/2020 | Gaudet et al. | |
| 2021/0061648 | A1* | 3/2021 | Towfighian | B81B 7/008 |
| 2021/0204067 | A1* | 7/2021 | Lo | H04R 31/003 |
| 2021/0229979 | A1 | 7/2021 | Schenk et al. | |
| 2023/0091340 | A1 | 3/2023 | Melnikov et al. | |
| 2023/0271822 | A1* | 8/2023 | de Boer | B81B 3/0021 257/415 |

FOREIGN PATENT DOCUMENTS

| | | | |
|---|---|---|---|
| DE | 102015210910 | A1 | 12/2016 |
| DE | 102015210919 | A1 | 12/2016 |
| DE | 102015215919 | A1 | 2/2017 |
| DE | 102017215276 | A1 | 2/2019 |
| EP | 0284051 | A1 | 9/1988 |
| EP | 0702796 | A1 | 3/1996 |
| EP | 0702796 | B1 | 1/2003 |
| EP | 3531713 | A1 | 8/2019 |
| TW | 201902812 | A | 1/2019 |
| WO | 2012/095185 | A1 | 7/2012 |
| WO | 2016/202790 | A2 | 12/2016 |
| WO | 2020/078541 | A1 | 4/2020 |
| WO | 2021/223886 | A1 | 11/2021 |

* cited by examiner 20
12
$36_2$
$36_1$
$38_1$
$22_3$
$22_4$
18
16
$38_2$
$22_1$
$22_2$
$24_1$
34
$24_2$ 45
45C
12
45B
45A
44 x
y
z

110'

Figure 13A:
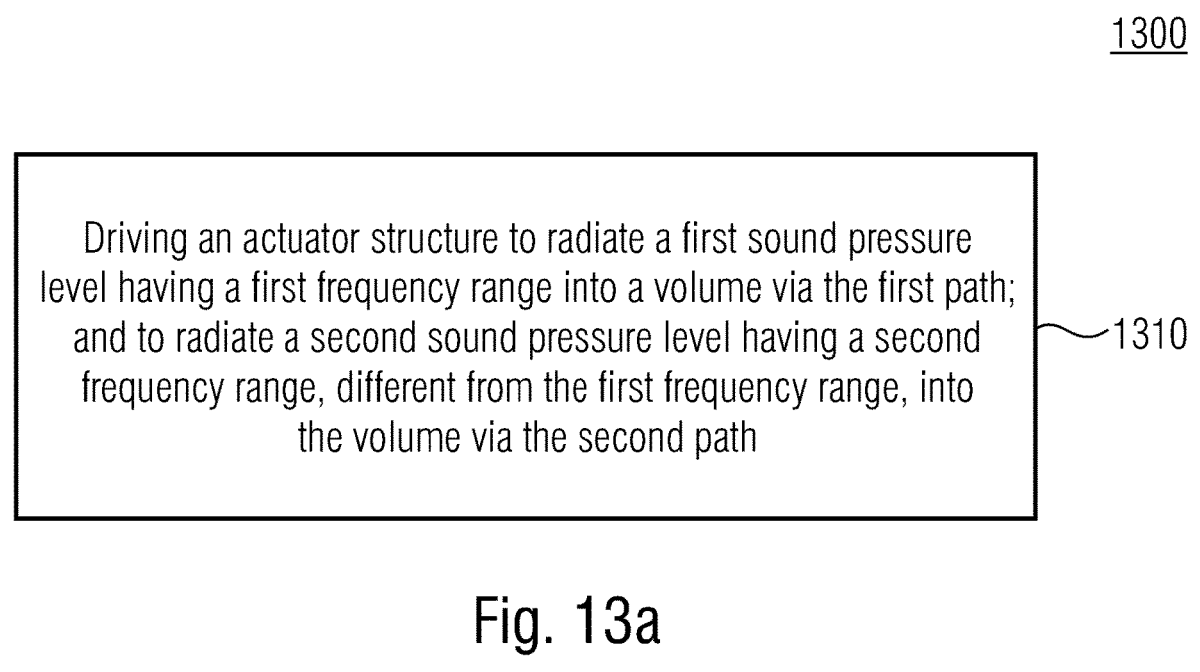

1300

Driving an actuator structure to radiate a first sound pressure level having a first frequency range into a volume via the first path; and to radiate a second sound pressure level having a second frequency range, different from the first frequency range, into the volume via the second path

MEMS DEVICE, NEARFIELD LOUDSPEAKER, HEARABLE, MEMS PUMP, LOUDSPEAKER AND METHOD FOR CONTROLLING AN MEMS DEVICE

CROSS-REFERENCE TO RELATED APPLICATIONS

This application is a continuation of copending International Application No. PCT/EP2020/075654, filed Sep. 14, 2020, which is incorporated herein by reference in its entirety.

The present invention relates to an MEMS device, a near-field loudspeaker, a hearable and an MEMS pump having such an MEMS device, and to a method for controlling an MEMS device. In particular, the present invention relates to an MEMS-based near-field loudspeaker.

BACKGROUND OF THE INVENTION

A mechanical resonator is an elastic or acoustic spring-mass oscillator. Such a resonator has an eigenfrequency. If a resonator is excited with a harmonic signal very close to or exactly at the eigenfrequency, large oscillation amplitudes occur, which is also called resonance. This means a supply of small energies can cause very large amplitudes, which in turn can be used specifically to adjust the frequency responses of acoustic or elastic systems. Below the eigenfrequency, the behavior of the resonator is dominated by the static stiffness (potential energy) and the deflection is in phase with the excitation. Above the eigenfrequency, the oscillation behavior is determined by the mass (kinetic energy) and the deflection is in phase opposition to the excitation. The eigenfrequency is calculated as the square root of the effective stiffness divided by the effective mass.

The difficulty with MEMS, especially with MEMS loudspeakers, is to construct resonators with low eigenfrequencies and to couple them into the sound guide. A low-frequency Helmholtz resonator (purely acoustic spring-mass system) would couple very well into the sound field, but involves too much space, so that an implementation as MEMS is not economical. However, a passive elastic low-frequency resonator can be configured such that the same can be accommodated in the MEMS. Nevertheless, such a design is much more expensive than is known from general engineering mechanics. If springs are made with very small dimensions, which are common for MEMS, this leads to large stiffness and at the same time the oscillating masses are very small. This in turn leads to the fact that the eigenfrequencies of such small oscillators are generally much higher and can only be implemented to a limited extent in the range of low resonant frequencies. Further, coupling of purely mechanical oscillations into the acoustic region is also non-trivial and constructively very complex.

US 2009/0189481 A1 describes a design for a micromechanical resonator. Here, a spring element is shown that is connected to comb electrodes. The width of the spring element is larger than the width of the comb electrodes. By selecting a suitable width of the spring element, the stiffness of the entire system can be influenced. However, the stiffness of the entire system cannot be adjusted during operation.

A miniature loudspeaker assembly including a Helmholtz resonator is described in US 2019/0082252 A1. The solution presented aims to increase the frequency bandwidth for micro loudspeakers. Although the solution appears suitable for MEMS, it is based on an expensive use of diaphragms.

The system described comprises a low eigenfrequency because viscous losses of the surrounding fluid, in this case air, can be assumed. In this document, the surrounding air serves as the fluidic mass. However, no features can be adopted for an implementation as an MEMS device.

EP 3 531 713 A1 discloses a miniature loudspeaker characterized by a diaphragm. This is surrounded by sound channels such that the fluid interacting with the diaphragm represents an acoustic mass. The acoustic mass ensures that the second resonance in the frequency response of the loudspeaker is located in an audible range. However, no features are disclosed that disclose adjustability of the resonator's eigenfrequency. Also in this document, the surrounding air serves as fluidic mass.

SUMMARY

According to an embodiment, an MEMS device may have: a substrate with a substrate plane; a mass element including a rest position and configured to perform deflection from the rest position in parallel to the substrate plane and in a fluid surrounding the mass element; a spring arrangement coupled between the substrate and the mass element and configured to deform based on the deflection; an actuator structure coupled to the mass element by means of a coupling and configured to apply a force to the mass element by means of the coupling to cause the deflection and to cause a movement of the fluid.

According to another embodiment, an apparatus may have an inventive MEMS device, wherein the apparatus is configured as one of a near-field loudspeaker, a hearable and an MEMS loudspeaker.

According to another embodiment, an MEMS loudspeaker may have an inventive MEMS device.

According to another embodiment, a method for controlling an MEMS device including a substrate with a substrate plane; a mass element including a rest position and configured to perform deflection from the rest position in parallel to the substrate plane and in a fluid surrounding the mass element; a spring arrangement coupled between the substrate and the mass element and configured to deform based on the deflection; and an actuator structure coupled to the mass element by means of a coupling and configured to apply a force to the mass element by means of the coupling to cause the deflection and to cause a movement of the fluid, wherein the actuator structure is coupled to a volume via a first path and the mass element is coupled to the volume via a second path on a side facing away from the actuator structure; may have the step of: controlling the actuator structure to radiate a first sound pressure level with a first frequency range into the volume via the first path; and to radiate a second sound pressure level with a second different frequency range into the volume via the second path.

According to an embodiment, an MEMS device comprises a substrate having a substrate plane. The MEMS device includes a mass element having a rest position and being configured to perform a deflection from the rest position parallel to the substrate plane and in a fluid surrounding the mass element. The MEMS device includes a spring arrangement coupled between the substrate and the mass element and configured to deform based on the deflection. Further, an actuator structure is provided, which is coupled to the mass element by means of a coupling and configured to apply a force to the mass element by means of the coupling to cause the deflection and to cause a movement of the fluid.

The core idea of the present invention is to provide an eigenfrequency of such an oscillator by means of a mass element suspended parallel to the substrate plane (in-plane) by means of a spring arrangement, which is then excited by the coupling by means of an actuator structure. Such structures can be adjusted in numerous degrees of freedom, can be manufactured small and inexpensively and can be used in numerous applications.

Further embodiments relate to a near-field loudspeaker, a hearable (smart or intelligent headphones/earphones), to an MEMS microphone, to an MEMS pump comprising one or more such MEMS devices.

Another embodiment relates to a method for controlling an MEMS device comprising a substrate having a substrate plane, a mass element comprising a rest position and configured to perform a deflection from the rest position parallel to the substrate plane and in a fluid surrounding the mass element, a spring arrangement coupled between the substrate and the mass element and configured to deform based on the deflection, and an actuator structure coupled by a coupling to the mass element and configured to apply a force to the mass element by means of the coupling to cause the deflection and to cause a movement of the fluid. The actuator structure is coupled to a volume via a first path and the mass element is coupled to the volume at a side facing away from the actuator structure via a second path. The method comprises a controlling actuator structure to radiate a first sound pressure level into the volume via the first path and to radiate a second, different sound pressure level into the volume via the second path.

Due to the coupling between the actuator structure and the mass element, the mass element can be excited such that a sound pressure amplitude is different and in particular higher than a sound pressure amplitude generated by means of the actuator, which is advantageous, in particular for small structures that can be implemented for high sound pressure levels, for example in an application as a near-field loudspeaker.

BRIEF DESCRIPTION OF THE DRAWINGS

Embodiments of the present invention will be detailed subsequently referring to the appended drawings, in which:

FIG. 13*a* is a schematic flow diagram of a method according to an embodiment.

DETAILED DESCRIPTION OF THE INVENTION

Before embodiments of the present invention are explained in detail below with reference to the drawings, it is pointed out that identical, functionally equal or equal elements, objects and/or structures are provided with the same reference numbers in the different figures, so that the description of these elements shown in different embodiments is interchangeable or interapplicable.

Embodiments described below are described in the context of a variety of details. However, embodiments can also be implemented without these detailed features. Further, for the sake of clarity, embodiments are described using block diagrams as a substitute for a detailed representation. Further, details and/or features of individual embodiments can be combined with each other without further ado, as long as it is not explicitly described to the contrary.

The following embodiments relate to microelectromechanical devices (MEMS devices). Some of the MEMS devices described herein can be multilayered layer structures. Such MEMS can be obtained, for example, by processing semiconductor materials at wafer level, which can also include combining multiple wafers or depositing layers at wafer levels. Some of the embodiments described herein address MEMS planes. An MEMS plane is understood to be a not necessarily two-dimensional or uncurved plane extending substantially parallel to a processed wafer, such as parallel to a main side of the wafer or subsequent MEMS. A plane direction can be understood as a direction within this plane, which can also be referred to as "in-plane". A direction perpendicular to this, i.e. perpendicular to a plane direction, can be simplified as a thickness direction, wherein the term thickness does not have any limitation in the sense of an orientation of this direction in space. It is understood that terms used herein, such as "length", "width", "height", "top", "bottom", "left", "right" and the like, are used only to illustrate embodiments described herein, as their position in space can be varied arbitrarily.

Some of the embodiments described herein are described in the context of a loudspeaker configuration or loudspeaker function of a corresponding MEMS device. It is understood that these embodiments, with the exception of the alternative or additional function of a sensory evaluation of the MEMS device or the movement or position of movable elements thereof, are transferable to a microphone configuration or microphone function of the MEMS device, so that such microphones represent further embodiments of the present invention without any limitations.

Figure 1A:
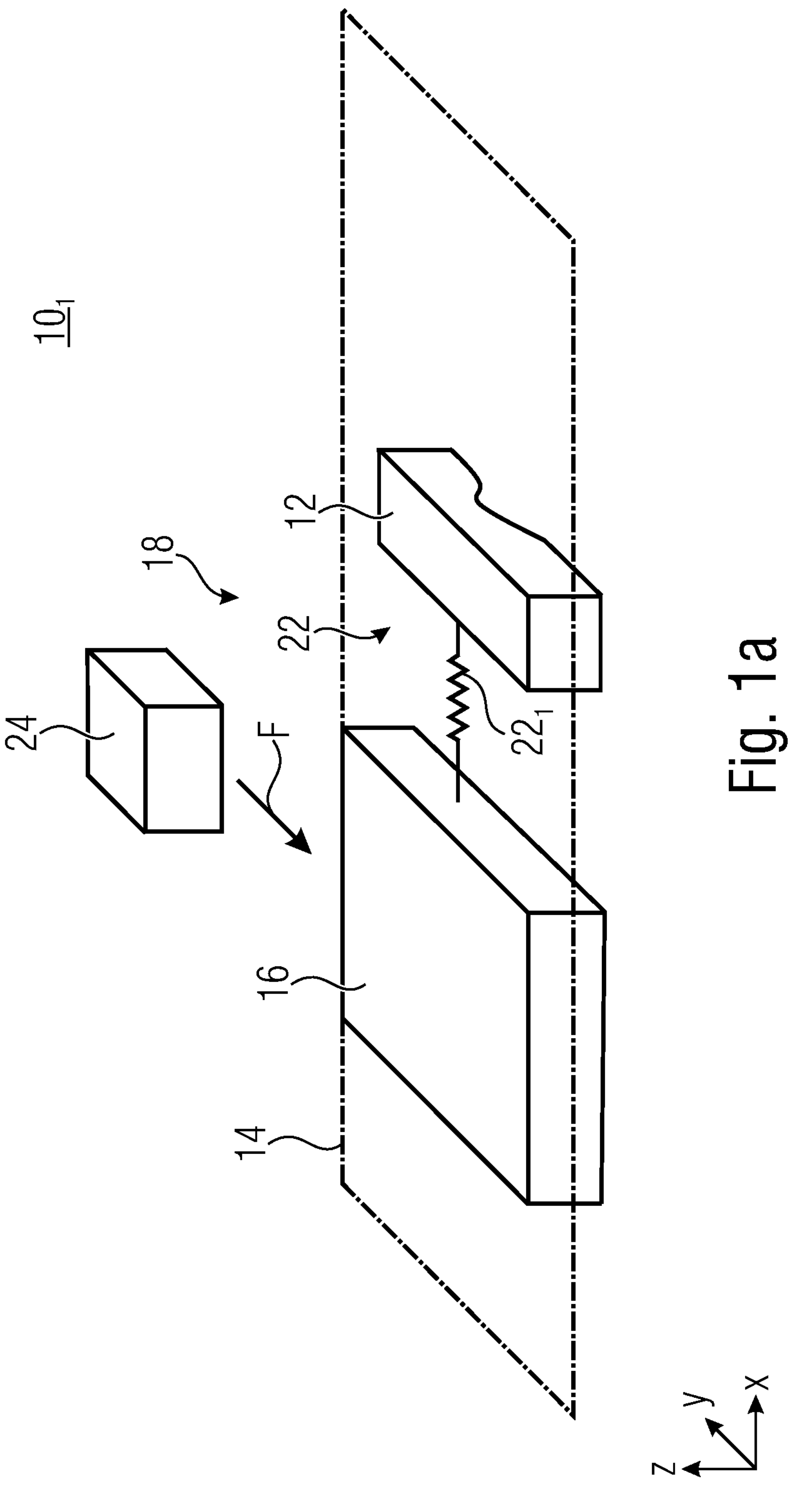
FIG. 1*a* is a schematic perspective view of an MEMS device with single-sided mass suspension according to an embodiment.

FIG. 1*a* shows a schematic perspective view of an MEMS device $\mathbf{10}_1$ according to an embodiment. The MEMS device $\mathbf{10}_1$ includes a substrate 12 arranged in a substrate plane 14. The substrate can be, for example, a comparatively rigid material, for example including a semiconductor material such as silicon or gallium arsenide, which also includes combinations of materials, for example silicon oxide, silicon nitride, and does not exclude other materials, for example metals, ceramics and/or glass materials.

The MEMS device $\mathbf{10}_1$ includes a mass element 16 comprising a rest position. A rest position can be understood as a location, orientation and/or position that is assumed by the mass element 16 without any additional force influence being introduced into the system, for example by actuators and the like. However, the rest position can easily include the presence of various forces, such as weight forces and/or forces introduced by arranged spring elements or by forces based on non-deflected actively deformable elements, which are connected with an e.g. electric signal, or the like. The mass element 16 is configured to perform a deflection from the rest position parallel to the substrate plane and in a fluid surrounding the mass element. For example, the substrate plane 14 is illustrated parallel to an x/y plane. In this respect, the movement parallel to the substrate plane or in-plane can include a movement of the mass element 16 along the x-direction and/or y-direction.

The MEMS device $\mathbf{10}_1$ further includes a spring arrangement 22 coupled between the substrate 12 and the mass element 16 and configured to deform based on the deflection. The spring arrangement 22 includes at least one spring element $\mathbf{22}_1$ that performs such a deformation. The spring element $\mathbf{22}_1$ can be, for example, resiliently formed and act as a mechanical spring. Although the spring element $\mathbf{22}_1$ can include materials differing from a material of the substrate 12 and/or a material of the mass element 16, at least two of the elements or all three of the substrate 12, the mass element 16 and the spring element $\mathbf{22}_1$ can be integrally formed and formed, for example, by local selective etching or other mechanically effective subtractive or additive methods.

The MEMS device $\mathbf{10}_1$ includes an actuator structure 24 coupled to the mass element 16 by means of a coupling and configured to apply a force F to the mass element 16 by means of the coupling to cause the deflection of the mass element 16, which causes movement of the fluid 18. By cyclically or even resonantly reciprocating the mass element 16, a sound pressure level can be generated in the fluid 18, which can be used, for example, for loudspeaker applications and/or microphone applications or also other concepts of fluidic transport, for example, for MEMS pumps.

Although the MEMS device $\mathbf{10}_1$ is shown such that the force F is oriented substantially perpendicular to a direction along which the spring element $\mathbf{22}_1$ connects the substrate 12 to the mass element 16, the actuator structure 24 can also be arranged such that the force F acts substantially parallel, for example in the same or opposite direction, to the direction along which the spring element $\mathbf{22}_1$ is arranged, namely along the x-direction.

The coupling between the actuator structure 24 and the mass element 16 can include a mechanical element, for example a comparatively rigid, stiff or inelastic element, an elastic element, such as a spring element and/or can include a fluidic coupling, wherein the fluid 18 provides a force transfer between the actuator structure 24 and the mass element 16. For example, the actuator structure 24 can be used to cause the fluid 18 to move, which in turn can cause a force input, force F, to act on the mass element 16 to cause the deflection of the mass element 16.

The actuator structure 24 can include electrostatic, piezoelectric and/or thermomechanical electrodes, although other elements can also be provided, which can provide movement of the mass element 16, for example using magnetic forces.

According to an embodiment, the mass element 16 and the spring arrangement 22 form at least part of a spring-mass system that has an oscillation eigenfrequency. This can commonly be described, neglecting the attenuation, as $$\omega_0 = \sqrt{\frac{c}{m}},$$

wherein ω0 is the eigen angular frequency, c is the spring stiffness of the spring element/the spring arrangement and m is the mass of the mass element for the case of a single-mass oscillator.

Embodiments are not limited to a single-mass oscillator, but can also be implemented for multi-mass oscillators without limitations.

Figure 1B:
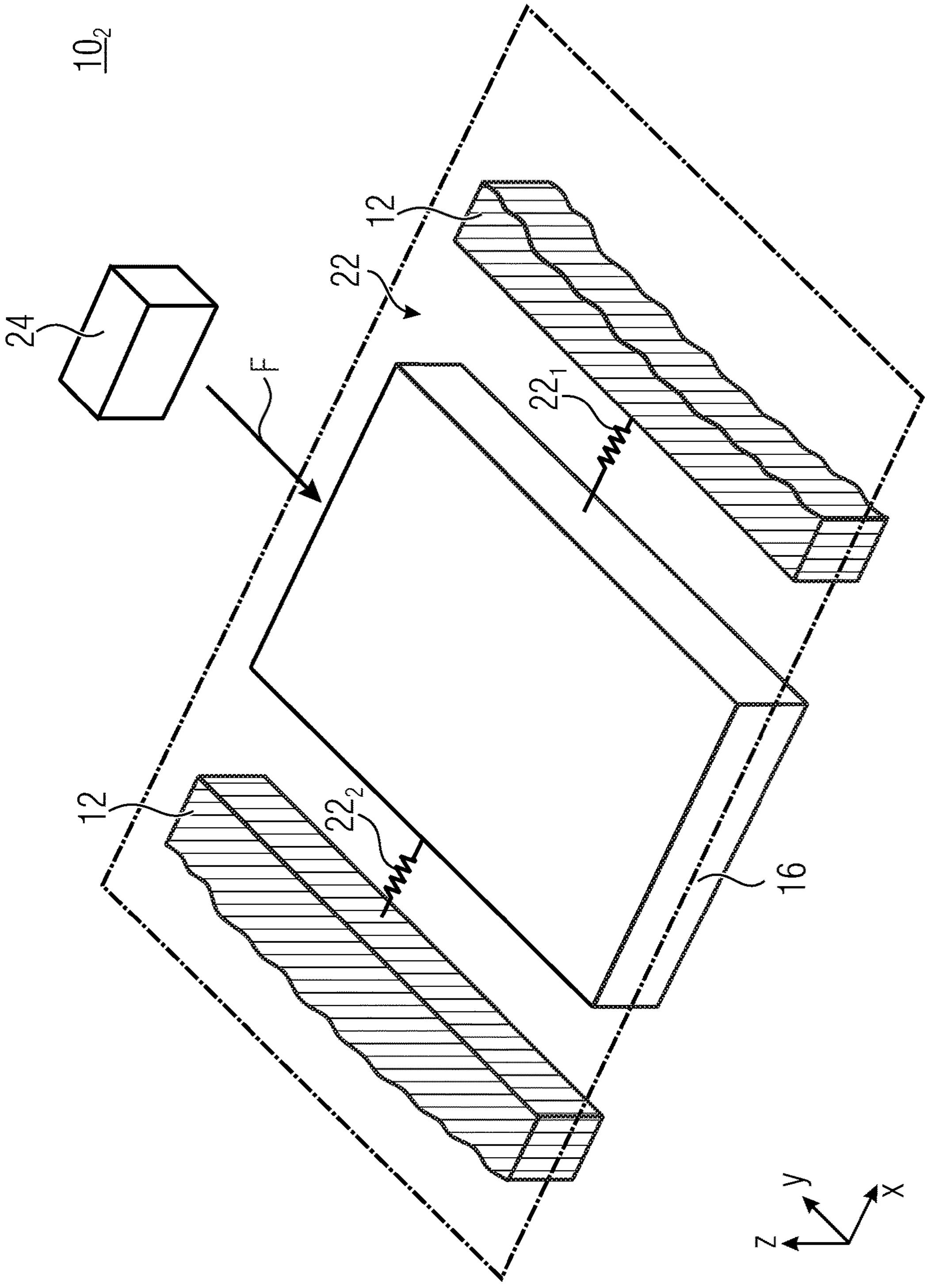
FIG. 1*b* is a schematic perspective view of an MEMS device according to an embodiment, wherein a mass element is suspended on two sides.

FIG. 1*b* shows a schematic perspective view of an MEMS device $\mathbf{10}_2$ according to an embodiment. As described for the MEMS device $\mathbf{10}_1$, the mass element 16 and the spring structure 22 can comprise at least part of a spring-mass system having an oscillation eigenfrequency that can be excited by the actuator structure 24. Compared to the MEMS device $\mathbf{10}_1$, the MEMS device $\mathbf{10}_2$ can comprise a spring structure 22, two spring elements $\mathbf{22}_1$ and $\mathbf{22}_2$ connecting the mass element 16 to the substrate 12 on both sides, that is, the spring elements $\mathbf{22}_1$ and $\mathbf{22}_2$ can be considered as common spring structure connected in series. This can increase a stability of the movement and/or position of the mass element 16, as the mass element 16 is supported on both sides.

While the mass element 16 is suspended on one side in the MEMS device $\mathbf{10}_1$, it is suspended on at least two sides in the MEMS device $\mathbf{10}_2$ on two opposite sides by means of the spring arrangement 22.

Figure 1C:
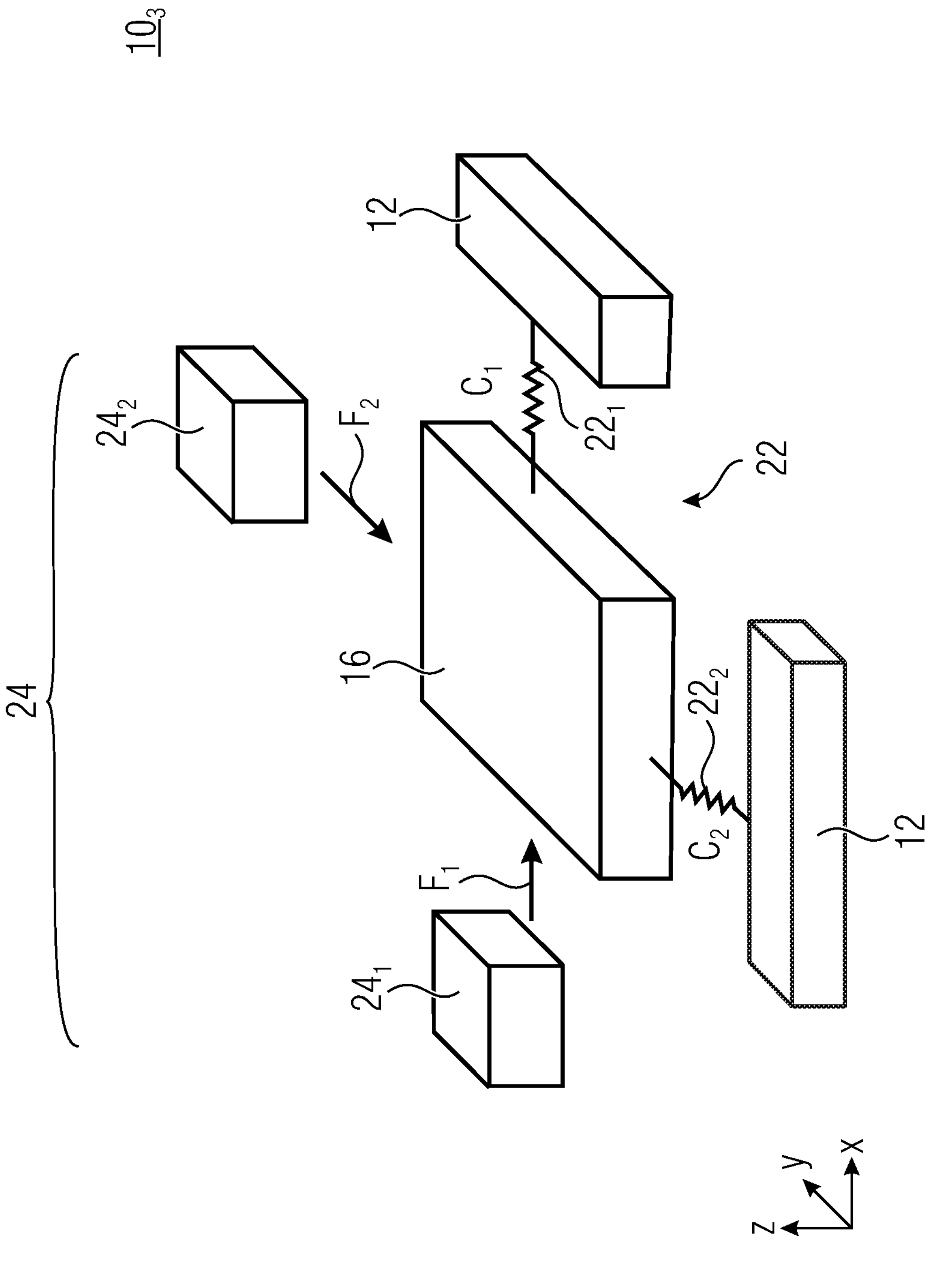
FIG. 1*c* is a schematic perspective view of an MEMS device according to an embodiment, wherein the mass element is suspended by means of a spring arrangement so that the same can oscillate along two different oscillation directions.

FIG. 1*c* shows a schematic perspective view of an MEMS device $\mathbf{10}_3$ according to an embodiment, wherein the mass element 16 is suspended by means of the spring arrangement 22 so as to be able to oscillate along two different oscillation directions. For this purpose, for example, one spring element $\mathbf{22}_1$ is mechanically coupled along the x-direction and a second spring element $\mathbf{22}_2$ is mechanically coupled perpendicularly thereto, for example parallel to the y-direction between the substrate 12 and the mass element 16.

The two directions can, but do not have to be perpendicular to each other, any other directions different from each other can be implemented, which are arranged, for example, within or parallel to the x/y plane or are also different from each other in three-dimensional space.

The spring element $\mathbf{22}_1$ can comprise a spring stiffness $c_1$, while the spring element $\mathbf{22}_2$ comprises a spring stiffness $c_2$ for an expansion or compression along the pendulum direction or oscillation direction x for the spring element $\mathbf{22}_1$ or y for the spring element $\mathbf{22}_2$. The two spring stiffnesses $c_1$ and $c_2$ can influence a respective oscillation eigenfrequency of the mass element 16 along the respective spring direction, wherein transverse stiffnesses of the respective other spring element can be taken into account. By providing different spring stiffnesses $c_1$ and $c_2$, a resonant frequency along the oscillation direction x can be different from a resonant frequency along the oscillation direction y by the spring stiffness $c_2$.

The different suspension forms of the MEMS devices $\mathbf{10}_1$, $\mathbf{10}_2$ and $\mathbf{10}_3$ can be combined with each other. For example, an additional spring element can be provided, which is arranged on the opposite side of the mass element 16 with respect to the spring element $\mathbf{22}_2$ and/or opposite to the spring element $\mathbf{22}_1$. Alternatively or additionally, further additional spring elements can be provided to suspend the mass element 16.

To excite the mass element 16 from the rest position, the actuator structure 24 can comprise one or more partial elements $\mathbf{24}_1$ and/or $\mathbf{24}_2$ configured to generate forces $F_1$ parallel to the x-direction and/or $F_2$ parallel to the y-direction. Even when the force direction is not parallel to the respective spring direction, at least force vectors of the generated force can generate a deflection along this direction.

Optionally, by combining the arrangement of different spring elements $\mathbf{22}_1$ and $\mathbf{22}_2$ along different directions, it is further possible to enable oscillation along a diagonal direction, such as in the x/y plane.

The actuator structure can be arranged at least partially in a common plane parallel to the substrate plane and laterally adjacent to the mass element along a deflection direction of the deflection to provide the force $F_1$ and/or $F_2$ at least partially parallel to the substrate plane.

Although the MEMS devices $\mathbf{10}_1$, $\mathbf{10}_2$ and $\mathbf{10}_3$ are described such that the spring arrangement 22 each provides individual spring elements 22, $\mathbf{22}_1$ and/or $\mathbf{22}_2$, each of these spring elements can be supplemented by further spring elements connected in series and/or in parallel, so that each of these spring elements can also be considered as spring arrangement comprising at least one spring element. At least two spring arrangements are provided in the MEMS devices $\mathbf{10}_2$ and $\mathbf{10}_3$, which are coupled at different locations between the substrate 12 and the mass element 16 and are configured to deform based on the deflection. The mass element 16 is thereby arranged between the first spring arrangement and the second spring arrangement.

Figure 2A:
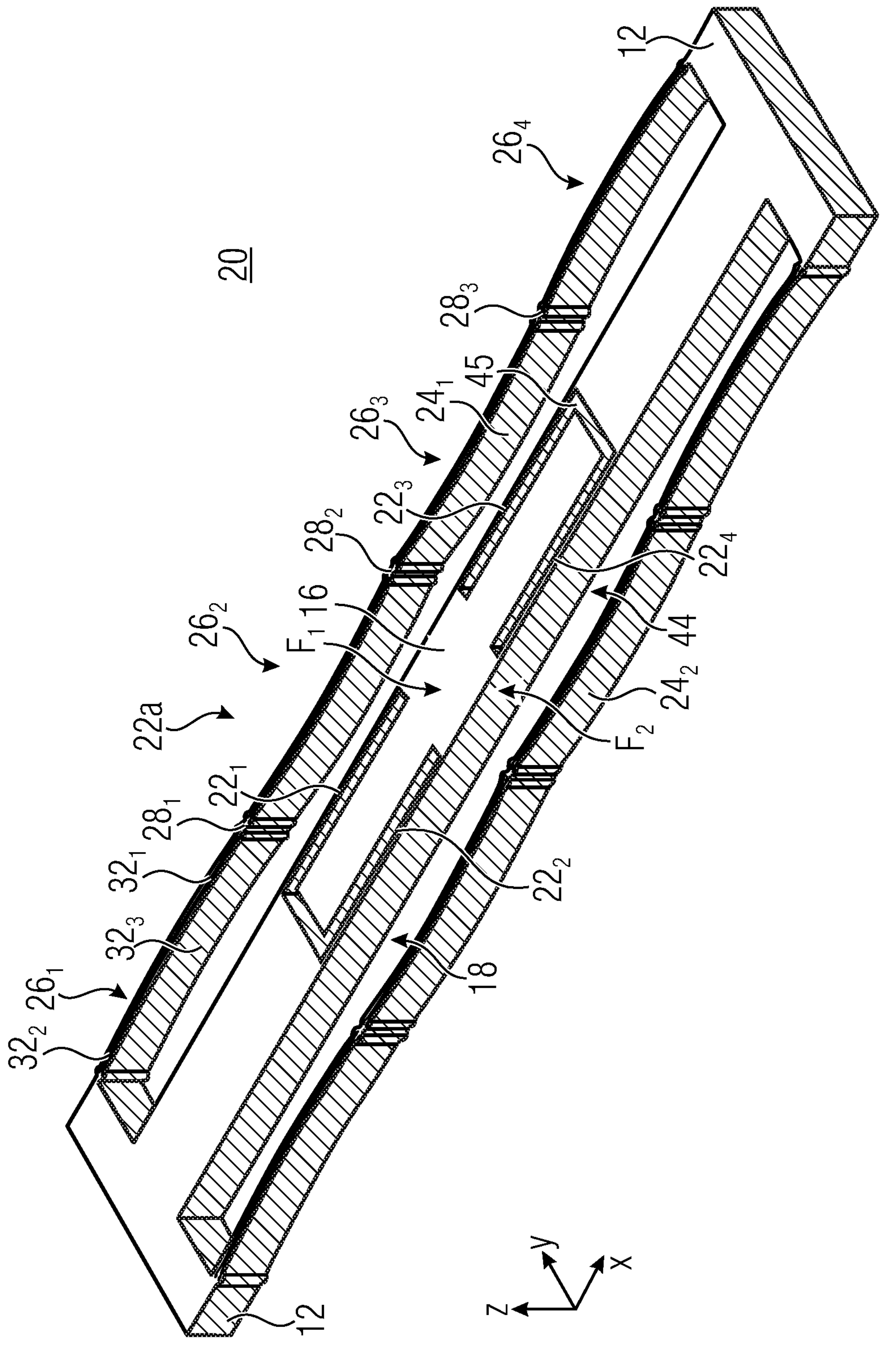
FIG. 2*a-d* are different views of a micromechanical transducer with a non-adjustable microresonator according to an embodiment.

FIG. 2*a* shows a schematic perspective view of an MEMS device 20 according to an embodiment. The mass element 16 is connected to the substrate 12 on opposite sides by means of spring arrangements 22*a* including spring elements $\mathbf{22}_1$ and $\mathbf{22}_2$ as well as $\mathbf{22}_b$ comprising spring elements $\mathbf{22}_3$ and $\mathbf{22}_4$. Actuator structures $\mathbf{24}_1$ and $\mathbf{24}_2$ are arranged along a positive and negative y-direction with respect to the mass element 16, so that the mass element 16 is arranged between the actuator structures $\mathbf{24}_1$ and $\mathbf{24}_2$.

A specific embodiment of the actuator structures $\mathbf{24}_1$ and/or $\mathbf{24}_2$ will be discussed in detail below, but they can be, for example, structures in which actuator segments $\mathbf{26}_1$, $\mathbf{26}_2$, $\mathbf{26}_3$ and $\mathbf{26}_4$ are mechanically coupled together in series and via discrete regions $\mathbf{28}_1$, $\mathbf{28}_2$ and $\mathbf{28}_3$, wherein each of these segments can include three beam elements $\mathbf{32}_1$, $\mathbf{32}_2$ and $\mathbf{32}_3$ electrically isolated from each other at discrete regions, mechanically coupled to each other and deformable, for example, based on individual actuation and/or electrostatic forces between the beam elements.

Thereby, a movement of the actuator structures $\mathbf{24}_1$ and/or $\mathbf{24}_2$ along positive and/or negative y-direction can be obtained, so that fluid 18 is set in motion between the actuator structures $\mathbf{24}_1$ and $\mathbf{24}_2$, compression and/or decompression takes place and thus forces $F_1$ and/or $F_2$ can act on the mass element 16 to deflect the same along the positive and/or negative y-direction.

An oscillation eigenfrequency, for example a first eigenfrequency, but also the higher order eigenfrequencies can be adjusted via the spring stiffnesses of the spring elements $\mathbf{22}_1$ to $\mathbf{22}_4$ as well as a mass of the mass element 16, neglecting the attenuation. Based on constant masses and/or spring stiffnesses, the resonant frequency can remain essentially unchanged or change slightly within the framework, for example due to temperature changes or the like.

The spring arrangement or the spring elements and the mass element 16 can be integrally formed, for example by selectively forming or etching out of a material, which subsequently also provides the substrate 12 at least partly. For example, any MEMS material can be provided for this purpose. The spring elements can be formed by a recess in the MEMS material. The recess can be formed, for example, in a slit-shaped straight line or have another geometry. In the embodiment according to FIG. 2*a*, the recess 45 has a U-shaped geometry, for example in that two outer legs are connected by a central leg arranged therebetween. At least one of the spring elements is formed at the region of an outer leg 45A and/or 45B, as shown for the spring elements $\mathbf{22}_3$ and $\mathbf{22}_4$ in FIG. 2*d*. There, the legs 45A and 45B are connected to each other via the central legs 45C. The recess 45 can also have an additional or different geometry, for example an H-shaped geometry, which can be understood to mean that the leg 45C extends in a central area of the legs 45A and 45B, or that a further U-shaped geometry is provided which is axially symmetrical about the leg 45C.

Figure 2B:
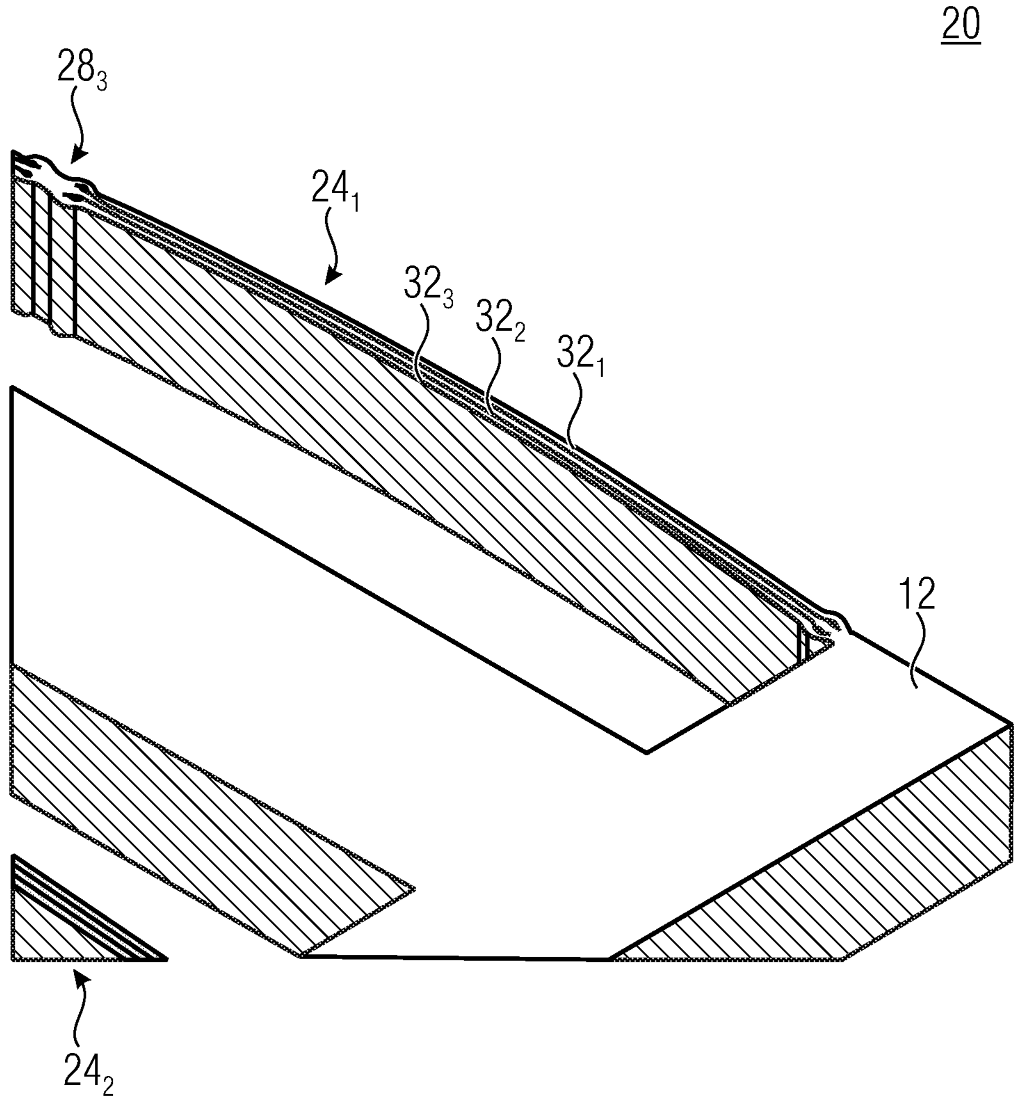

FIG. 2*b* shows a perspective view of a section of the MEMS device 20 of FIG. 2*a* to illustrate the arrangement of three substantially parallel beams $\mathbf{32}_1$, $\mathbf{32}_2$ and/or $\mathbf{32}_3$ coupled in segments at discrete regions 28, represented by discrete region $\mathbf{28}_3$. As explained, the actuator structure $\mathbf{24}_1$ and/or $\mathbf{24}_2$ can include electrostatic, piezoelectric and/or thermomechanical electrodes, or can be based on other actuator principles.

Figure 2C:
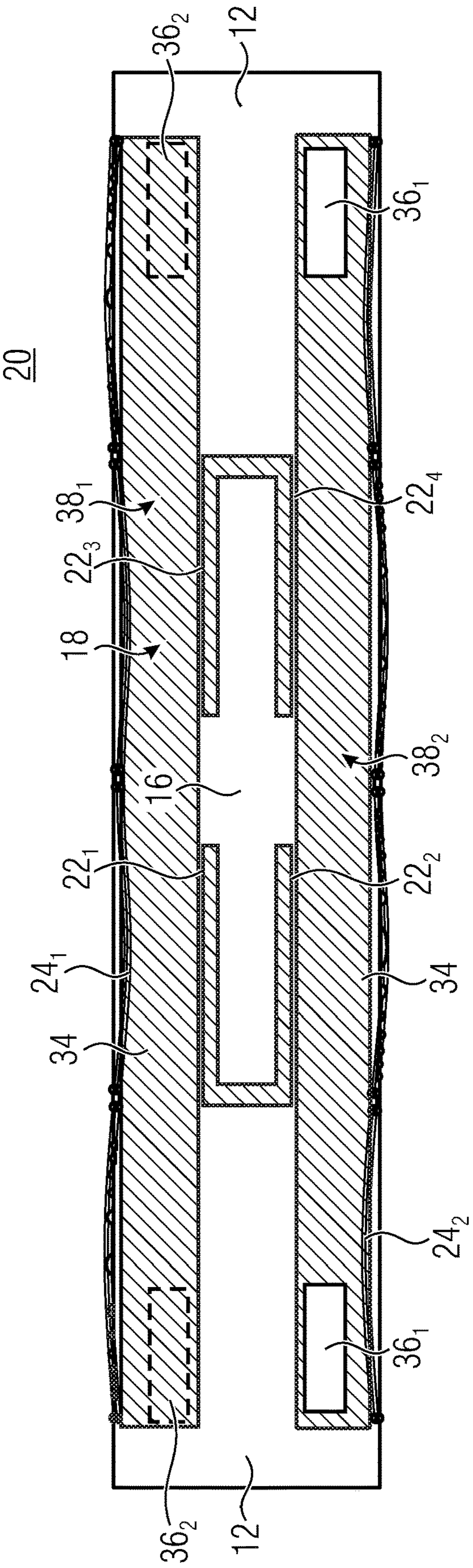

FIG. 2*c* shows a schematic top view of the MEMS device 20 according to an embodiment, wherein it is further illustrated that the MEMS device is part of a layer structure. Exemplarily, a boundary layer 34 is provided, which can confine a cavity in which the fluid 18 is arranged along the negative z-direction. A further boundary layer can be provided along the positive z-direction. This is illustrated exemplarily by openings $\mathbf{36}_2$ in the additional boundary layer along the positive z-direction, which is not illustrated. The boundary layer 34 can also have openings $\mathbf{36}_1$. The mass element 16, together with the spring elements $\mathbf{22}_1$ to $\mathbf{22}_4$ and the remnants of the substrate 12, can divide the cavity, which is at least partially defined by the actuator structures $24_1$, $24_2$ as well as the boundary layers, into partial cavities $38_1$ and $38_2$, which are exemplarily connected to an environment of the MEMS device along different directions +z/−z by openings $36_2$ and $36_1$, respectively.

In the illustrated embodiment, the openings $36_1$ and $36_2$ connect the cavity inside the MEMS device to different, opposite sides of the MEMS device. According to embodiments, the partial cavity $38_1$ is fluidically connected to an environment of the MEMS actuator on a first side of the mass element 16 perpendicular to the deflection direction y through at least one first opening. The partial cavity $38_2$ is fluidically connected to the environment of the MEMS device on a second side, which is arranged opposite the first side starting from the mass element 16, through at least one further opening $36_2$, wherein the first opening and the second opening are arranged opposite each other on different sides of the MEMS device.

The mass element 16 can be arranged between the first boundary layer 34 and the second boundary layer, which is not illustrated, in the layer structure. A distance between the mass element 16 and the boundary layer 34 and/or the further boundary layer, which is not illustrated, can be selected such that an acoustic short circuit between the partial cavities $38_1$ and $38_2$ is prevented at least during operation outside the resonance range.

Figure 2D:
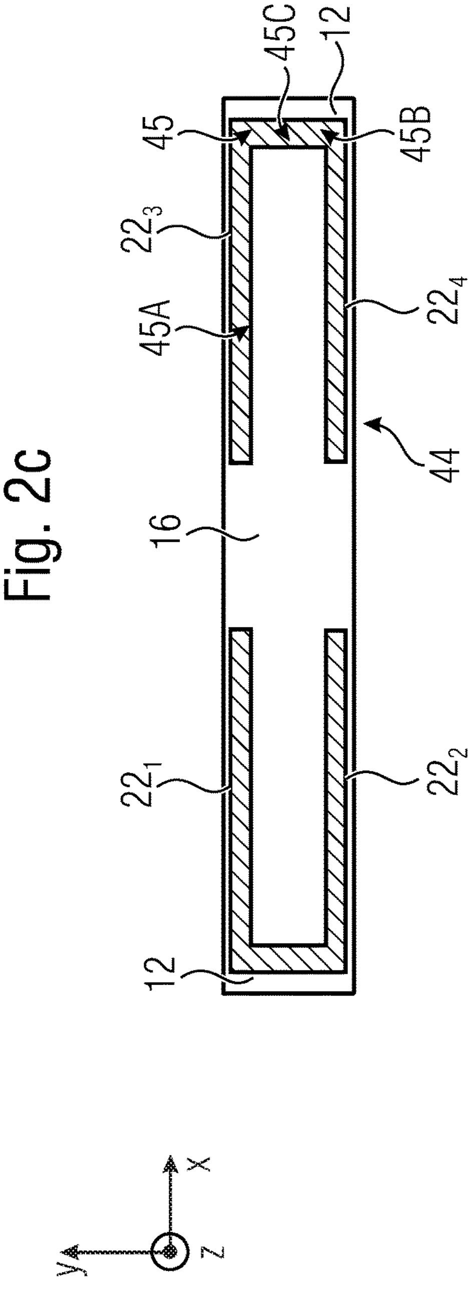

FIG. 2*d* shows a schematic top view of a part of the MEMS device of FIG. 2*c*, exemplarily without the boundary layer 34, i.e. for example without the bottom wafer. It can be seen that the mass element 16 is suspended on both sides via two spring elements $22_1$ and $22_2$ or $22_3$ and $22_4$, respectively, which are connected in parallel to each other. Embodiments provide MEMS devices comprising spring arrangements comprising more than two spring elements connected in parallel to each other. For example, three, four, five or also a higher number of spring elements can be connected in parallel to each other.

In other words, FIGS. 2*a* to 2*d* show a microresonator in correspondence with a basic principle, which is not adjustable with respect to its eigenfrequency.

FIGS. 2*a-d* show in an embodiment a micromechanical transducer with a non-adjustable microresonator 44 with the mass element 16 and connecting springs 22 in a first basic principle. Here, the microresonator 44 is arranged between two actively deflectable elements $24_1$ and $24_2$, as shown for example in FIG. 2*a*. The microresonator 44 follows the movements of the actively deflectable elements $24_1$/$24_2$ via a fluidic coupling through the fluid 18. Mechanically, the microresonator 44 is connected to the surrounding substrate 12 via the connecting elements $22_1$ to $22_4$. In a first time interval, the active elements $24_1$ and $24_2$ deflect in a first direction, parallel to the substrate plane and convey fluid out of the bottom wafer via the openings $36_1$. In the same time interval, fluid is conveyed into the cavities via the openings $36_2$ in the lid wafer. In a second time interval, the active elements $24_1$ and $24_2$ deflect in a second direction opposite to the first direction. Fluid is thus conveyed out of the cavities via the openings $36_2$ in the lid wafer and conveyed into the cavities via openings $36_1$ in the bottom wafer.

A height or dimension of the actuators along the z-direction can lie, for example, in a range of at least 1 μm and/or at most 1 mm, the stated values inclusive in each case, advantageously between 30 μm and 150 μm, particularly advantageously at about 75 μm.

In embodiments, a height of the microresonators can be in a range between from 1 μm and 5 mm, advantageously in a range between 400 μm and 650 μm.

The stiffness of the connecting elements $22_1$ to $22_4$ can have a significant influence on the achievable resonant frequency. Similarly, the specific mass of the mass element 16 can influence the resulting resonant frequency, see FIG. 2*a*. In resonance, the large oscillation amplitude of the resonator (mass 16 and spring elements $22_1$ to $22_4$) significantly reduces its effect as a partition, which can cause an acoustic short circuit between the two air chambers or partial cavities $38_1$ and $38_2$. As a result, the sound wave is no longer guided into the exit openings $36_1$ and $36_2$ and a sink in the frequency response occurs in the frequency range around the resonance.

Figure 3A:
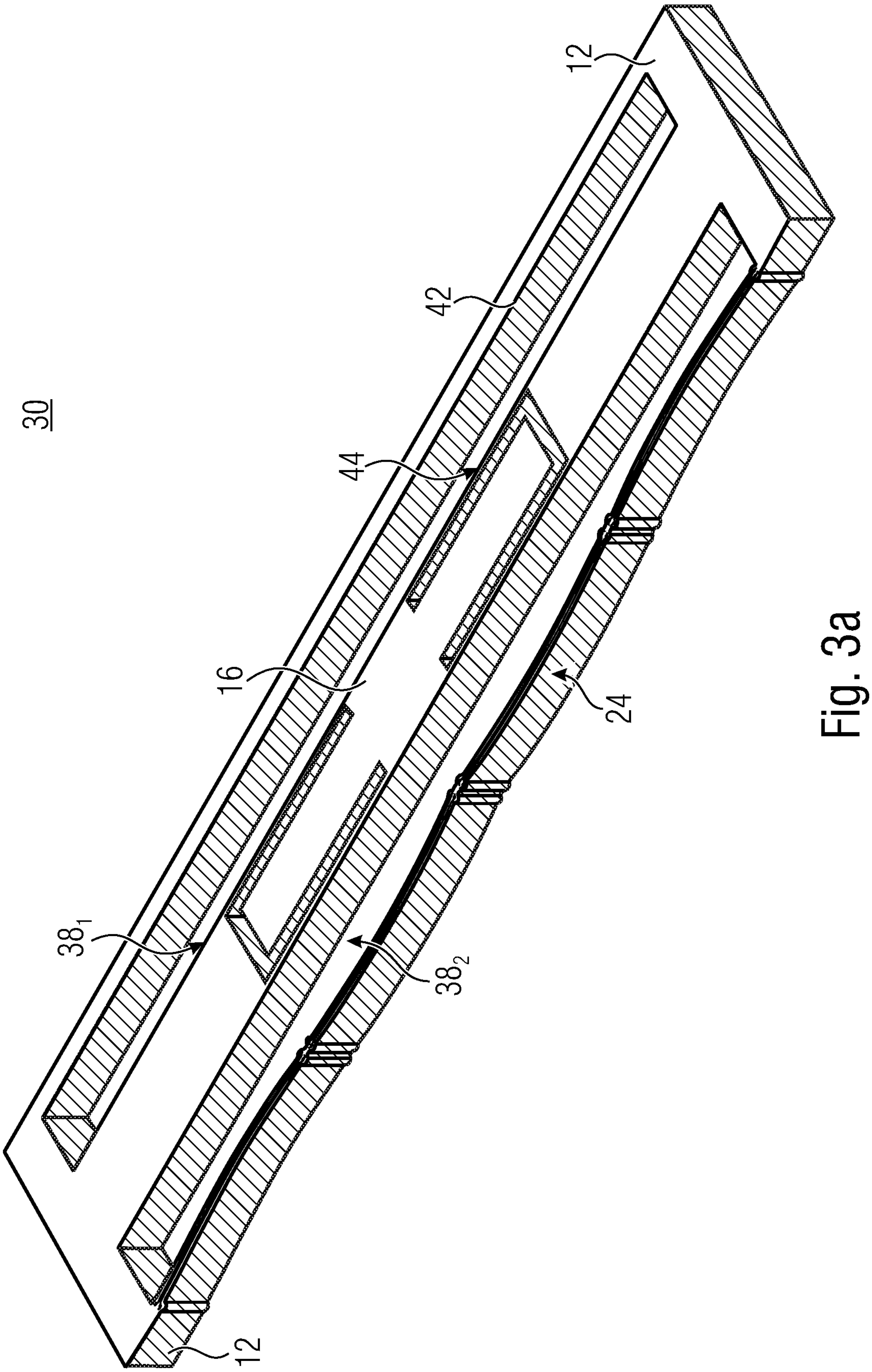
FIG. 3*a-c* are different views of a micromechanical transducer with a non-adjustable microresonator according to an embodiment, wherein a microresonator is arranged between an actively deflectable element and a passively configured boundary.

FIG. 3*a* shows a schematic perspective view of an MEMS device 30 according to an embodiment. This differs from the embodiment of the MEMS device 20 in that, for example, instead of an actuator structure, a comparatively rigid, passive substrate extension or another rigid element is formed as a boundary structure for the partial cavity 381 starting from the resonator 44. The mass element 16 can be unilaterally excited to oscillate via the actuator structure 24. As described in connection with the MEMS device 20, the mass element 16 can limit, parallel to the deflection direction y, a first partial cavity $38_1$, which is at least partially enclosed by the mass element or a structure connected thereto on the one hand and with a first boundary structure on the other hand. The partial cavity $38_1$ can be fluidically connected to an environment of the MEMS device through at least one first opening, such as the openings $36_2$ of FIG. 2*c*. The mass element can at least partially enclose, parallel to the deflection direction and opposite the partial cavity $38_1$, a second partial cavity 382 with a second boundary structure, which is fluidically connected to the environment of the MEMS device through at least one second opening, such as the opening $36_1$. At least one of the boundary structures is arranged movably, wherein it is possible, but not necessary, that it is actively formed. As described in connection with other embodiments, it can be an electrically passive element that is moved via an actuator element located elsewhere, such as in a different MEMS plane compared to the mass element 16. Optionally, both boundary structures are arranged movably, and further optionally, at least one of the boundary structures is formed actively to deform based on the control.

Figure 3B:
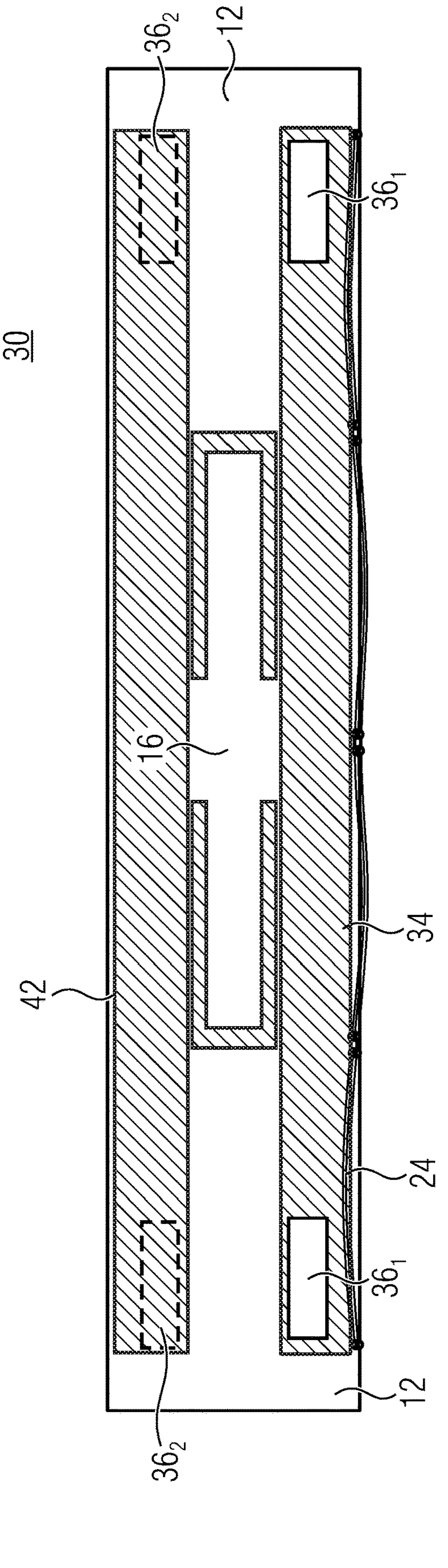

FIG. 3*b* shows a schematic top view of the MEMS device 30 of FIG. 3*a*.

Figure 3C:
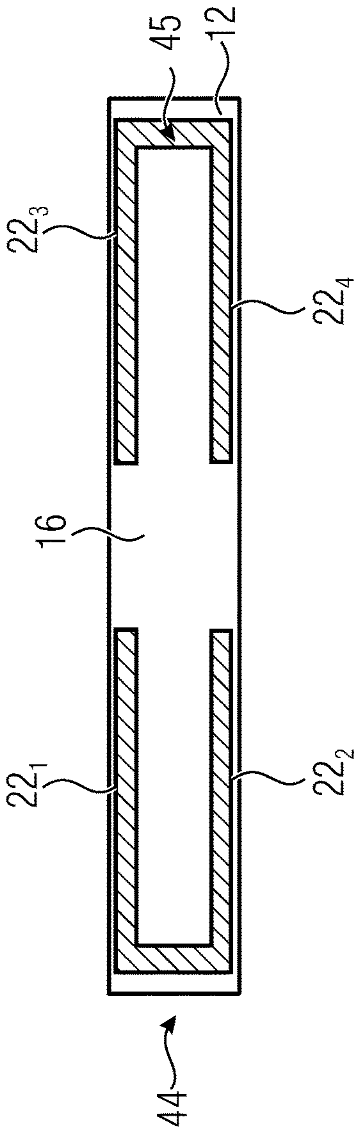

FIG. 3*c* shows a schematic top view of the resonator 44 of the MEMS device 30 of FIGS. 3*a* and/or 3*b*, which can be unchanged from the resonator of the MEMS device 20.

In other words, the MEMS device 30 relates to a microresonator 44 according to a basic principle in a further variation, wherein the resonant frequency is not adjustable. Bottom and/or top wafers can be provided. Thus, FIGS. 3*a-c* illustrate an alternative basic principle of the micromechanical transducer with a non-adjustable microresonator 44. Within the layer plane, the microresonator 44 is formed between an actively deflectable element 24 and a passively configured boundary 42 of a partial cavity. Compared to FIGS. 2*a-d*, the microresonator 44 does not differ. Also, the mechanical coupling of the weight 16 via the connecting elements $22_1$ to $22_4$ with the surrounding substrate 12 is ensured. The partial cavity formed by the active element 24 and the microresonator 44 can constitute a rear volume for the actively deflectable element 24. Advantageously, in the partial cavity 381 between the fixed boundary and the microresonator 44, an increase in frequency in the area of the resonance of the resonator 44 occurs in the frequency response.

Figure 4A:
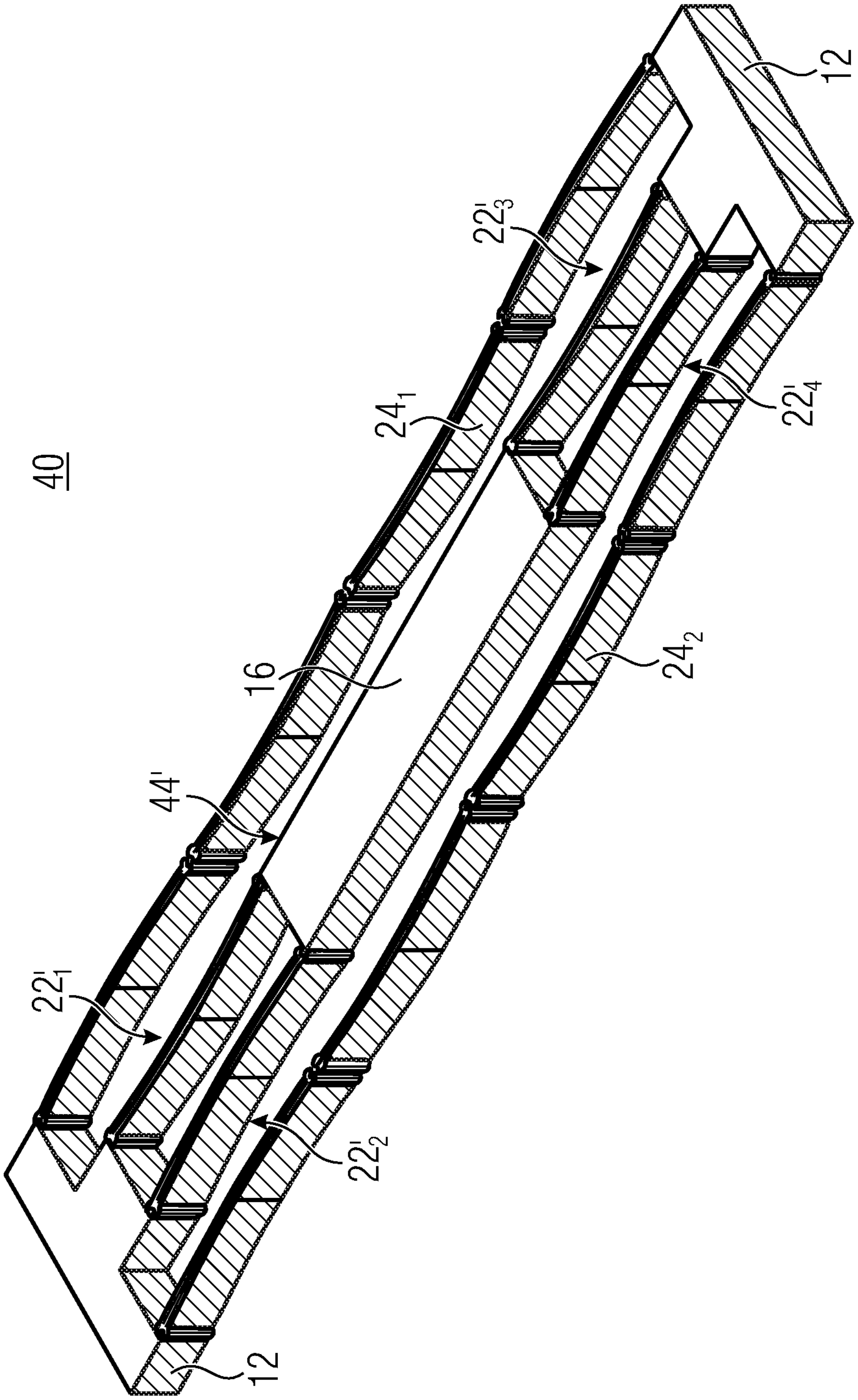
FIG. 4*a-c* are different views of an MEMS device according to an embodiment with a microresonator that is adjustable with respect to the resonant frequency.

FIG. 4*a* shows a schematic perspective view of an MEMS device 40 according to an embodiment, wherein the spring arrangement is formed actively and is configured to provide a variable spring stiffness for the deflection of the mass element 16 based on a variable control of the spring arrangement. That is, instead of passive spring elements, active spring elements $22'_1$, $22'_2$, $22'_3$ and/or $22'_4$ can be provided, wherein all, but possibly only some of the spring elements are actively controllable. Based on electrostatic forces, piezoelectric forces, magnetic forces or thermal forces, effective spring stiffnesses of the spring elements $22'_1$ to $22'_4$ can be changed, wherein the resonant frequency of an actively controllable resonator $44^I$ obtained in this way can also be adjustable. This means that the resonant frequency can be changed using the active spring elements $22'_1$ to $22'_4$ even after the configuration or manufacture has been completed, for example to enable adaptation to a variable operating state and/or a variable operating state itself. The resonant frequency can thus be actively adjustable, whereas for passive spring elements a passive adjustability can take place via the structural configuration. Such a concept can be implemented, for example, by means of the so-called "virtual stiffness". According to an embodiment, one or several of the spring elements $22'_1$ to $22'_4$ can also comprise three beam elements running parallel or side-by-side, as described in connection with the actuator structure $24_1$ and $24_2$. These actuator springs can be controlled individually and independently of the actuator structures $24_1$ and $24_2$. The mass element and the spring arrangement can form at least part of a spring mass system that comprises an oscillation eigenfrequency. The MEMS device 40 can be configured to provide a variable oscillation eigenfrequency based on the variable spring stiffness. The variable oscillation eigenfrequency can also be easily implemented for a deflection of the mass element 16 along multiple directions, as described in connection with FIG. 1*c*.

Figure 4B:
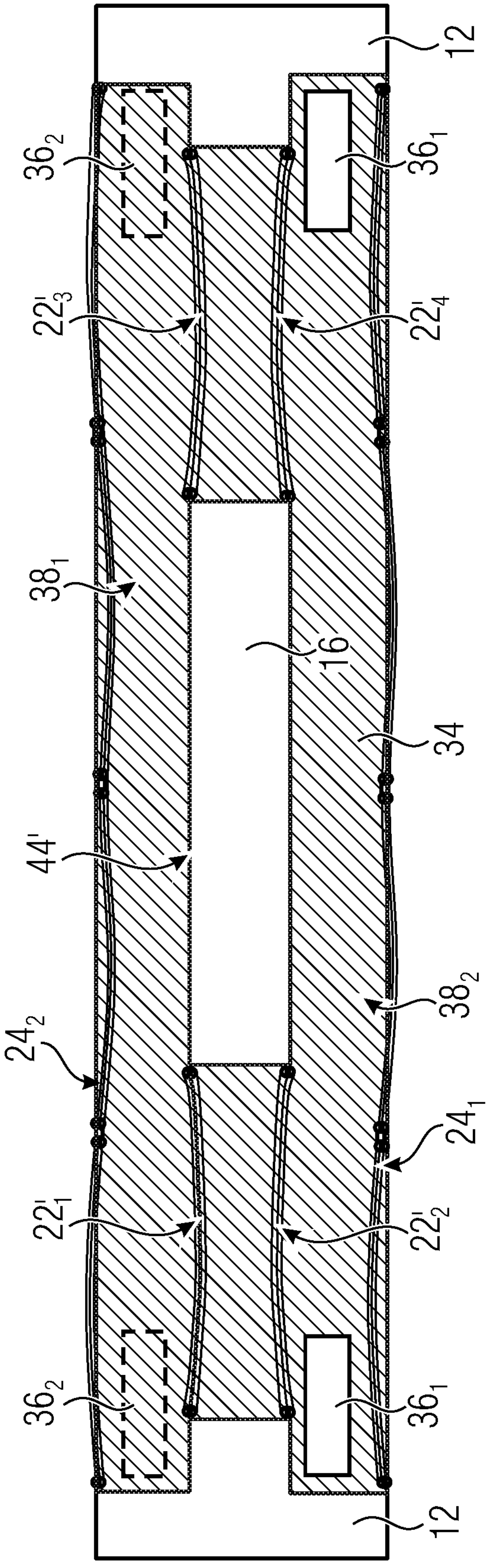

FIG. 4*b* shows a schematic top view of the MEMS device 40. Compared to the MEMS devices 20 and/or 30, the spring arrangements or spring elements are formed as active spring elements $22'_1$, to $22'_4$.

Figure 4C:
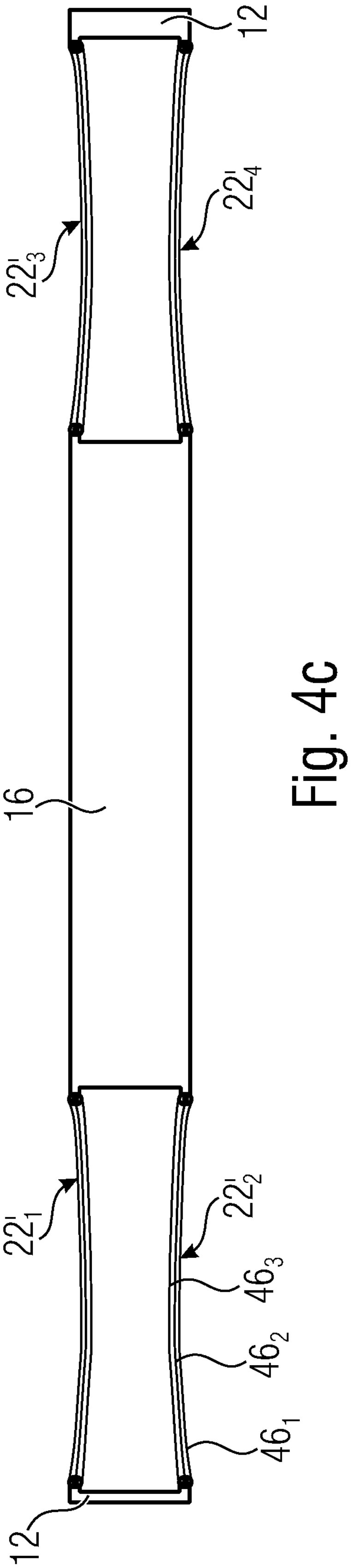

FIG. 4*c* shows a schematic top view of the resonator 44'. In the top view, the configuration of the active spring elements $22'_1$ to $22'_4$ can be clearly seen. Three adjacent beams 461, 462 and $46_3$ can be fixed at discrete regions electrically isolated from each other and can perform movement based on a control, the movement acting as a variable effective virtual stiffness. That is, the spring arrangement can comprise an active structure having a plurality of movable layer arrangements. Each movable layer arrangement can include first, second and third beams $46_1$ to $46_3$. The beam $46_2$ is arranged between the beams $46_1$ and $46_3$ and is arranged in a fixed manner and electrically isolated from the same at discrete areas. The layer arrangement is configured, for example, to perform movement along a direction of movement parallel to the substrate plane in response to an electric potential between the beam 462 and the beam $46_3$ or in response to an electric potential between the beam $46_2$ and the beam $46_1$ to influence the spring stiffness. Exemplary actuators that can be used to influence the spring stiffness are described, for example, in WO 2012095185 A1, WO 2020078541 A1, DE 10 2015 206 774 A1, DE 10 2014 225 934 A1 or DE 10 2015 215 919 A1.

For the spring arrangement, an active structure with at least one bending transducer as an actuator comprising a deflectable element can comprise: a microelectromechanical transducer extending along a centroid phase of the deflectable component and deflecting the deflectable component in a first direction upon application of a first electric signal; and a second micromechanical transducer extending along the centroid phase and deflecting the deflectable component in a second direction opposite to the first direction upon application of a second electric signal. The centroid phase is located between sides of the first and second microelectromechanical transducers facing away from each other. An electric control configured to vary the first electric signal and the second electric signal in dependence on an input signal is provided such that a variation of the first electric signal and a variation of the second electric signal is dependent on the electric input signal. The phases of the first and second electric signals are offset relative to each other.

Alternatively or additionally, the spring arrangement includes a layer structure having a cavity arranged in the layer structure and fluidically coupled to an external environment of the layer structure through at least one opening in the layer structure. Further, the layer structure comprises an interaction structure arranged in the first MEMS plane and movable in the cavity along a plane direction that is configured to interact with a fluid in the cavity, wherein a movement of the interaction structure is causally related to a movement of the fluid through the at least one opening. An active structure arranged in a second MEMS plane perpendicular to the plane direction is provided, mechanically coupled to the interaction structure, and configured such that an electric signal at an electric contact of the active structure is causally related to a deformation of the active structure. The deformation of the active structure can be causally related to a movement of the fluid.

In other words, FIGS. 4*a* to 4*c* show a microresonator that is adjustable with respect to the resonant frequency and for which, for example, ANED (asymmetric nanoscopic electrostatic drives) are used. FIG. 4*b* shows a top view with openings in the cavity in the bottom wafer and in the lid wafer, the latter being dashed. The micromechanical transducer or MEMS device 40 is arranged between the laterally adjacent sound transducers $24_1$ and $24_2$ in a manner comparable to the previously illustrated examples of microresonators, whereby partial cavities $38_1$ and $38_2$ are formed in the layer of the MEMS. In contrast to the MEMS devices 20 and/or 30, the mechanical coupling of the mass 16 is performed via micromechanical actuators $22'_1$ to $22'_4$. By applying a signal, the stiffness of the connecting element can be influenced. The active connecting elements can be formed by NED actuators known here, wherein FIG. 4*a-c* describe a so-called ANED configuration.

Figure 5A:
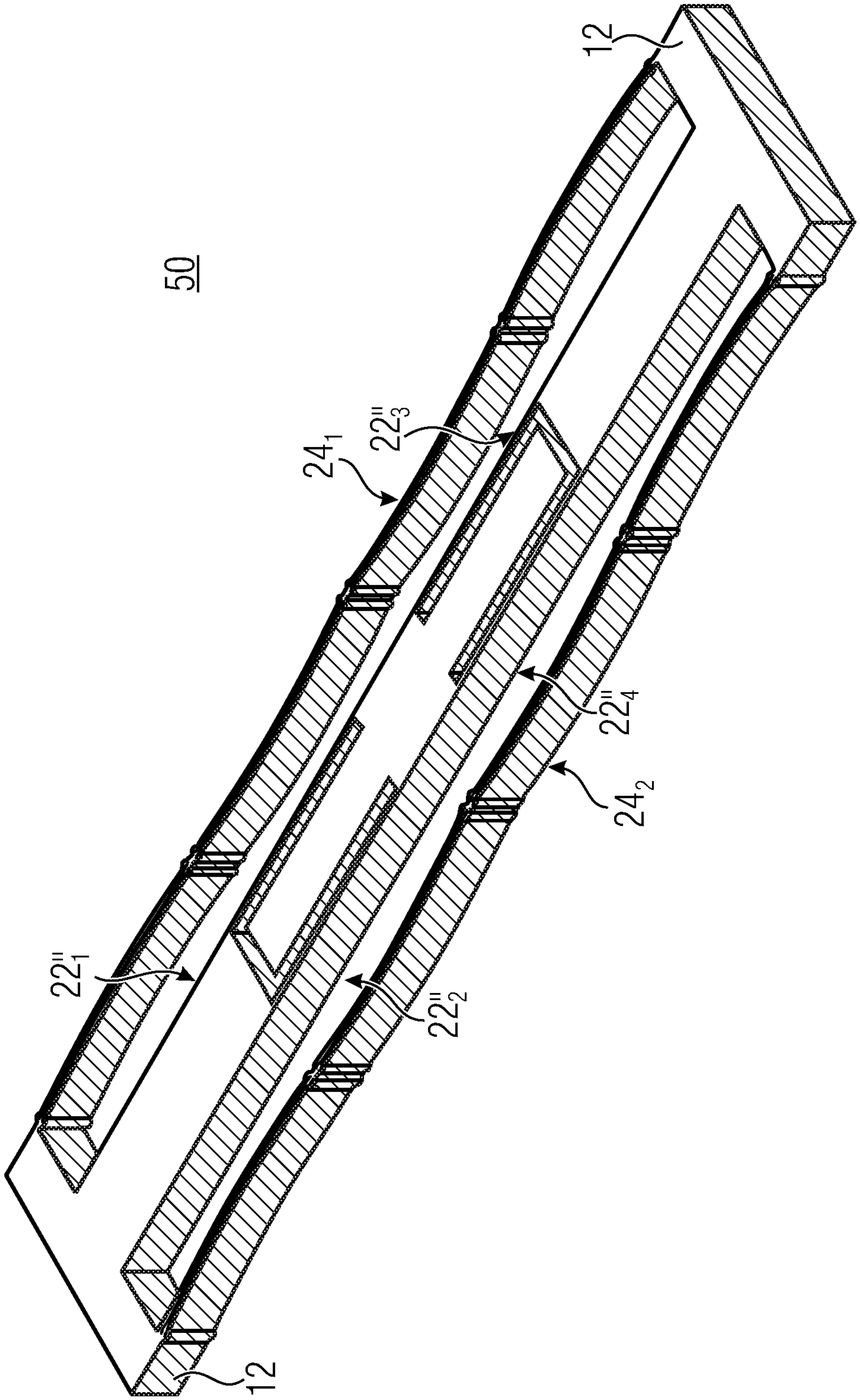
FIG. 5*a-c* are different views of an MEMS device according to an embodiment with actively deflectable spring elements, which are formed as a so-called micromuscle.

FIG. 5*a* shows a schematic perspective view of an MEMS device 50 according to an embodiment, which also has actively deflectable spring elements $22''_1$ to $22''_4$ formed as so-called micromuscle.

Figure 5B:
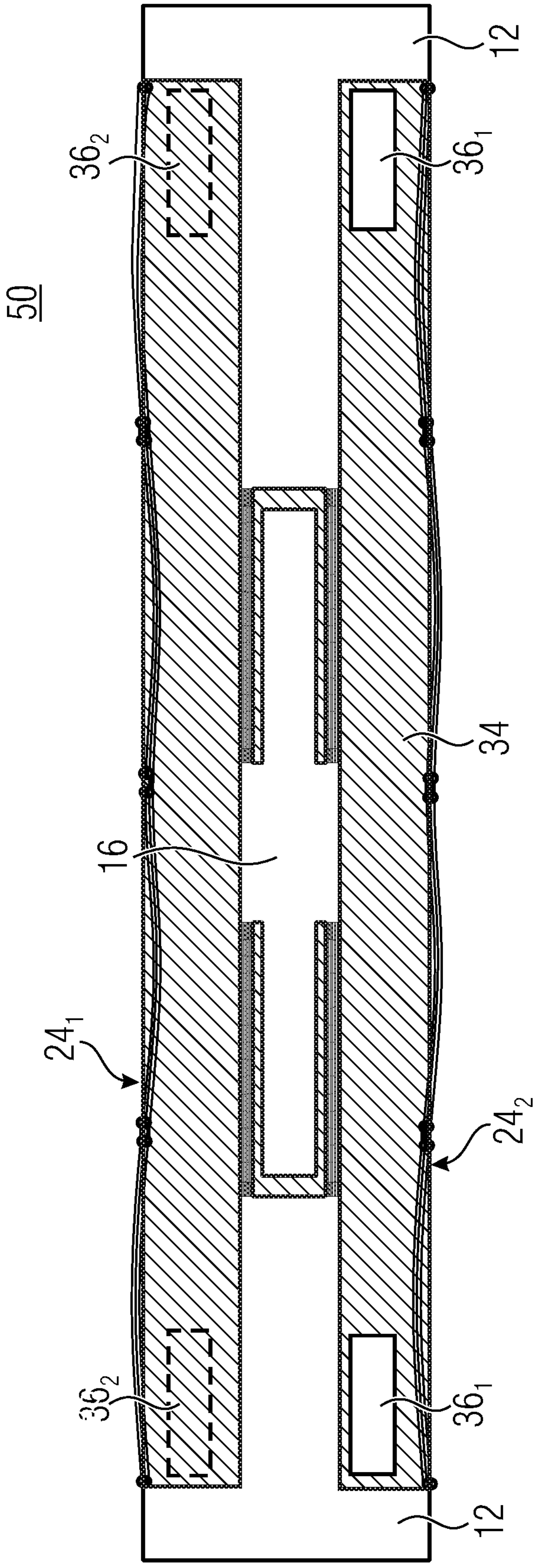

FIG. 5*b* shows a schematic top view of the MEMS device 50 of FIG. 5*a*.

Figure 5C:
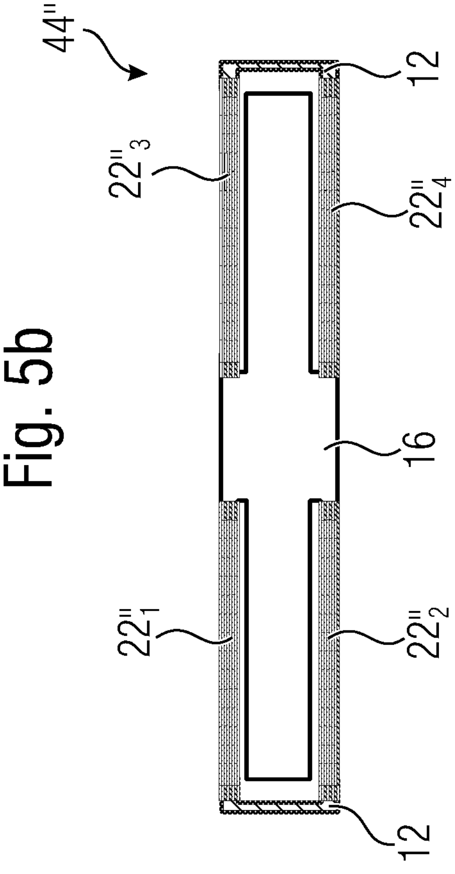

FIG. 5*c* shows a schematic top view of the microresonator 44" of the MEMS device 50. There, details of the muscle actuators for the spring elements $22''_1$ to $22''_4$ are already illustrated, which are further detailed in FIGS. 5*d*, 5*e* and 5*f*.

Figure 5D:
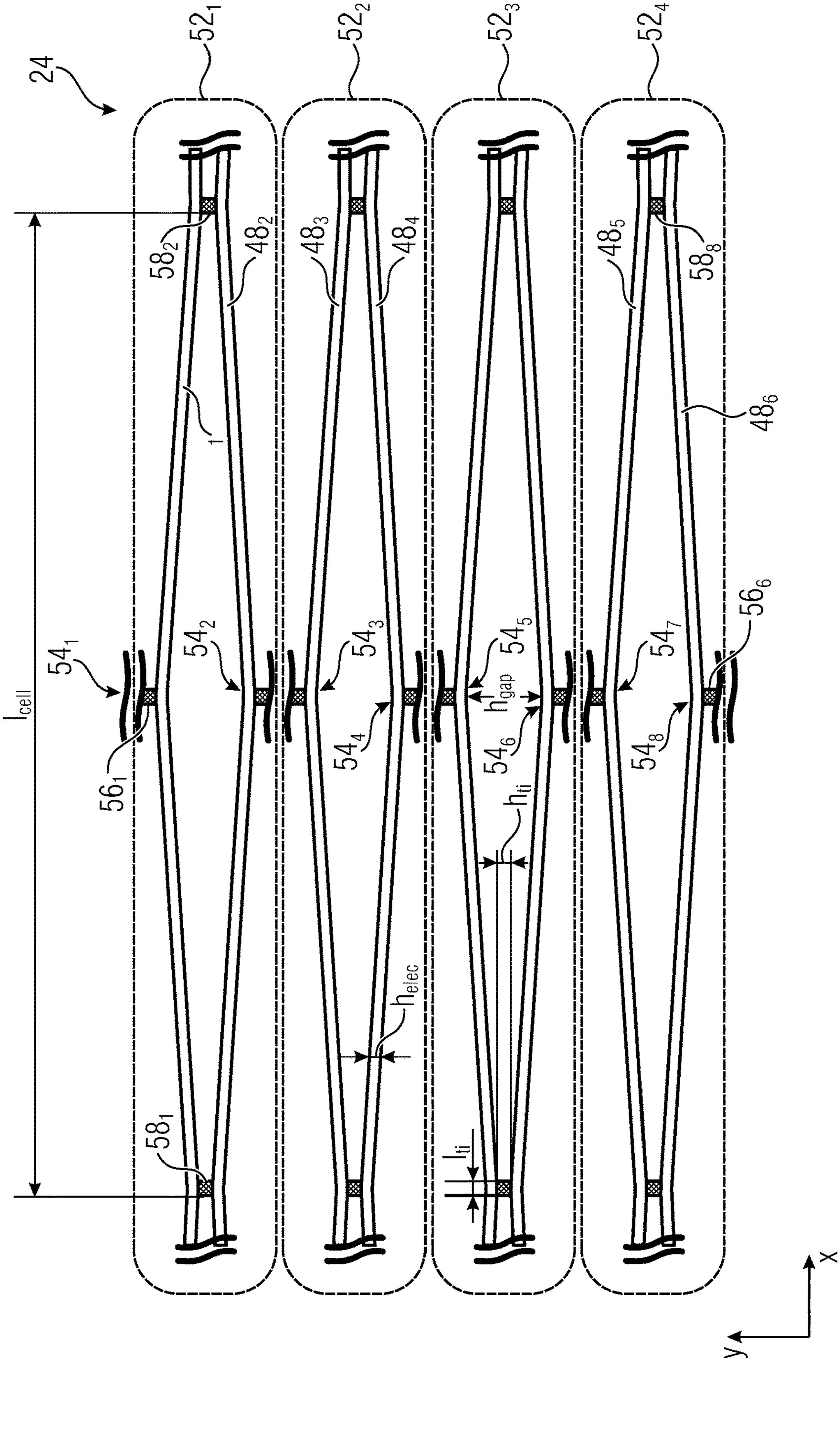
FIG. 5*d-f* are different views of possible implementations of micromuscles according to embodiments.

FIG. 5*d* shows a schematic top view of a part of a possible actuator structure 24, which can be referred to as a micromuscle, for example. The actuator structure or active structure 24 can include a plurality of electrode elements $48_1$ to $48_6$ arranged side by side, wherein a total number of electrode elements can be greater than 2, greater than 4, greater than 6, greater than 8, greater than 10, or greater than 20, greater than 30, greater than 50 or higher. The electrodes can be formed as plate-like structures which are approximately parallel to each other in a, possibly theoretical, reference state, such that the main sides of the electrodes face each other. A main side is understood to be a side that has a comparatively large area extension compared to two secondary sides connecting the main sides. In some embodiments, the electrodes can be pre-deflected from this reference state, as shown in FIG. 3*a*, for example.

Main sides of adjacent electrode pairs, such as $\mathbf{52}_1$ and $\mathbf{52}_2$, $\mathbf{52}_2$ and $\mathbf{52}_3$ or $\mathbf{52}_3$ and $\mathbf{52}_4$ can also be arranged facing each other. A respective electrode pair $\mathbf{52}_1$ to $\mathbf{52}_4$ can be configured such that when an electric potential is applied, for example by means of the signal 32, a distance $h_{gap}$ between the electrodes is at least locally reduced to provide at least part of an actuator stroke. By connecting several pairs in series, a high total stroke of the active structure 24 can be obtained.

In central areas $\mathbf{54}_1$ to $\mathbf{54}_8$ of the electrodes, a respective electrode pair can be connected to an adjacent electrode pair or to the surrounding substrate or a supporting structure. Spacing elements $\mathbf{56}_1$ to $\mathbf{56}_6$ can be arranged for this purpose, which can optionally also be formed in an electrically insulating manner in order to provide electric insulation of adjacent electrodes. Alternatively, electric insulation can be provided as well as coating on the electrode elements and/or by electrically insulating electrodes of the same electrode pair 52 from each other, such as by spacing elements $\mathbf{58}_1$ to $\mathbf{58}_8$. However, alternatively or additionally, the spacing elements $\mathbf{58}_1$ to $\mathbf{58}_8$ can be realized by means of the surrounding substrate, such as the layer $\mathbf{12}_3$. Thus, electric insulation can also be provided via the surrounding medium (or vacuum) in cooperation with the substrate instead of the spacing elements $\mathbf{58}_1$ to $\mathbf{58}_8$. It is also possible to apply the same potential to adjacent electrodes of different pairs, which means that electric insulation of this location for these electrodes can also be omitted if needed.

That is, the electrode elements of an electrode pair can both be mechanically fixed by discrete outer spacing elements 58 in an edge region of the electrode elements and/or the electrode elements can be mechanically fixed in an edge region thereof with the layer structure in order to adjust a distance $h_{ti}$ between the electrode elements which is otherwise adjustable via the spacing elements 58.

In the edge region, the distance hi can be kept small, for example in a range from 0.01 μm to 200 μm, advantageously from 0.3 μm to 3 μm and especially advantageously in a range of 1.3 μm.

By means of the inner spacing elements $\mathbf{54}_1$ to $\mathbf{54}_6$, a comparable or equal distance can be adjusted between the electrode pairs as between individual electrodes obtained by means of the outer spacing elements 58.

Applying an electric potential between electrode elements of an electrode pair 52 can cause a change in length of the electrode pair along a direction within the MEMS plane $\mathbf{14}_2$, for example along y, and thus a stroke of the active structure 24, which can be transmitted to the interaction structure 24.

Due to the arrangement of the at least partly optional spacing elements 56, in central areas 54, the same can be referred to as inner spacing elements. The optional spacing elements 58 in the outer region or edge regions can be referred to as spacing elements.

The active structure 24 can comprise a plurality of electrode pairs 52, each of which is mechanically fixed in a central area to electrode elements of adjacent electrode pairs at discrete locations, such as by the inner spacing elements 54.

In other words, FIG. 5*d* shows a part of a deflectable element of the active structure 24, which can also be referred to as a micromuscle and which can include a plurality of discretely spaced conductive beams/electrodes 48. In an embodiment, these beams are a doped semiconductor material and each represent at least one electrode, for example of metal or silicon, but advantageously silicon. Opposing beams are connected to each other via an electrically non-conductive medium. The non-conductive medium can also be an insulating spacer layer segmented in a first and a second direction of extension of the deflectable element. That is, the beams can be connected by an insulating spacer 56 and/or 58. Further embodiments include gaseous, liquid or solid non-conductive media. In the case of gaseous and liquid spacer layers, the deflectable elements can additionally be attached to the substrate. In the case of a solid non-conductive medium, the elasticity is less than the elasticity of the solid conductive medium. The beams are supplied with an electric voltage so that a potential difference exists between two adjacent deflectable elements of an electrode pair, such as $\mathbf{48}_1$ and $\mathbf{48}_2$. This potential difference generates an electrostatic force and the beams are attracted to each other. The elasticity of the non-conductive medium or segmented insulating spacer layers 56 and/or 58 can provide a restoring force. A restoring force can also be obtained from the elasticity of the conductive beams 48. For this purpose, insulating solids corresponding to the insulating spacers 58 can be arranged between the conductive solids, such as by implementing the spacers 56. One possible arrangement of the spacing elements 56 and 58 is, for example, a so-called "brick pattern", whereby the support locations between the conductive media alternate from row to row, so that the next support location is located between two support locations of the adjacent row. The corresponding structure is a periodic structure of repeating single cells 52, but this is not mandatory. When generating a potential difference between the adjacent conductive solids, the overall structure can be deformed.

In FIG. 5*d*, $I_{cell}$ denotes a dimension of a muscle cell along the x-direction, $I_{ti}$ a dimension of a support location along the x-direction, $h_{ti}$ a dimensioning of a support location along the y-direction, $h_{elec}$ a dimensioning of an electrode along the y-direction and $h_{gap}$ a distance between two electrodes along the y-direction. The mentioned parameters can be implemented individually and independently, but can also be matched to each other. Each of these parameters can be within a range of at least 0.01 μm and at most 200 μm, $I_{cell}$ e.g. also up to 1500 μm. Particularly advantageous for a special implementation are, for example, $I_{cell}$=124 μm, $I_{ti}$=4 μm, $h_{gap}$ (in a reference state of minimum or maximum actuator deflection)=1.3 μm, $h_{elec}$=1 μm and/or $h_{ti}$=1 μm, in each case modifiable and/or within certain tolerances.

During actuation, a change of the value $h_{gap}$ (for example a shortening) can take place along the y-direction and, depending on the geometric configuration, a change of the value $I_{cell}$ along the x-direction. Depending on how the coupling to a possibly passive resistance element or coupling part element is realized, one of the deformation directions x or y is transmitted to the coupling part element 28*b*. By means of a coupling, the force can be transmitted to another MEMS plane. By juxtaposing the further cells next to each other along the y-direction and/or the x-direction, the displacement of the direction or the force of the individual cell can be satisfied or multiplied by the number of cells.

The geometry of the deflectable element 24 (in other words, the muscle cell or micromuscle) can be used to specifically adjust the stiffness in the x-direction and/or y-direction. In addition, the force per deflection can be adjusted or optimized, for example to a "stress-strain curve". In sound generation, initially a lot of deflection with relatively little force is needed for the initial situation. When the displaced volume increases, the restoring force of the fluid (for example air) on the muscle increases. It is then needed to generate more force for deflection. The choice of cell geometry allowed the change in force during the deflection process to be adjusted. Further, the ratio of length change in y- to x-direction (effective Poisson's ratio of the structure) can be adjusted via the cell geometry. By choosing the right cell geometry, muscles with an effective Poisson's ratio of less than 0 can be designed. Such structures, called auxetic structures, can show very special properties when bent. These properties offer potential for improvements to the muscle in terms of vertical pull-in.

Figure 5E:
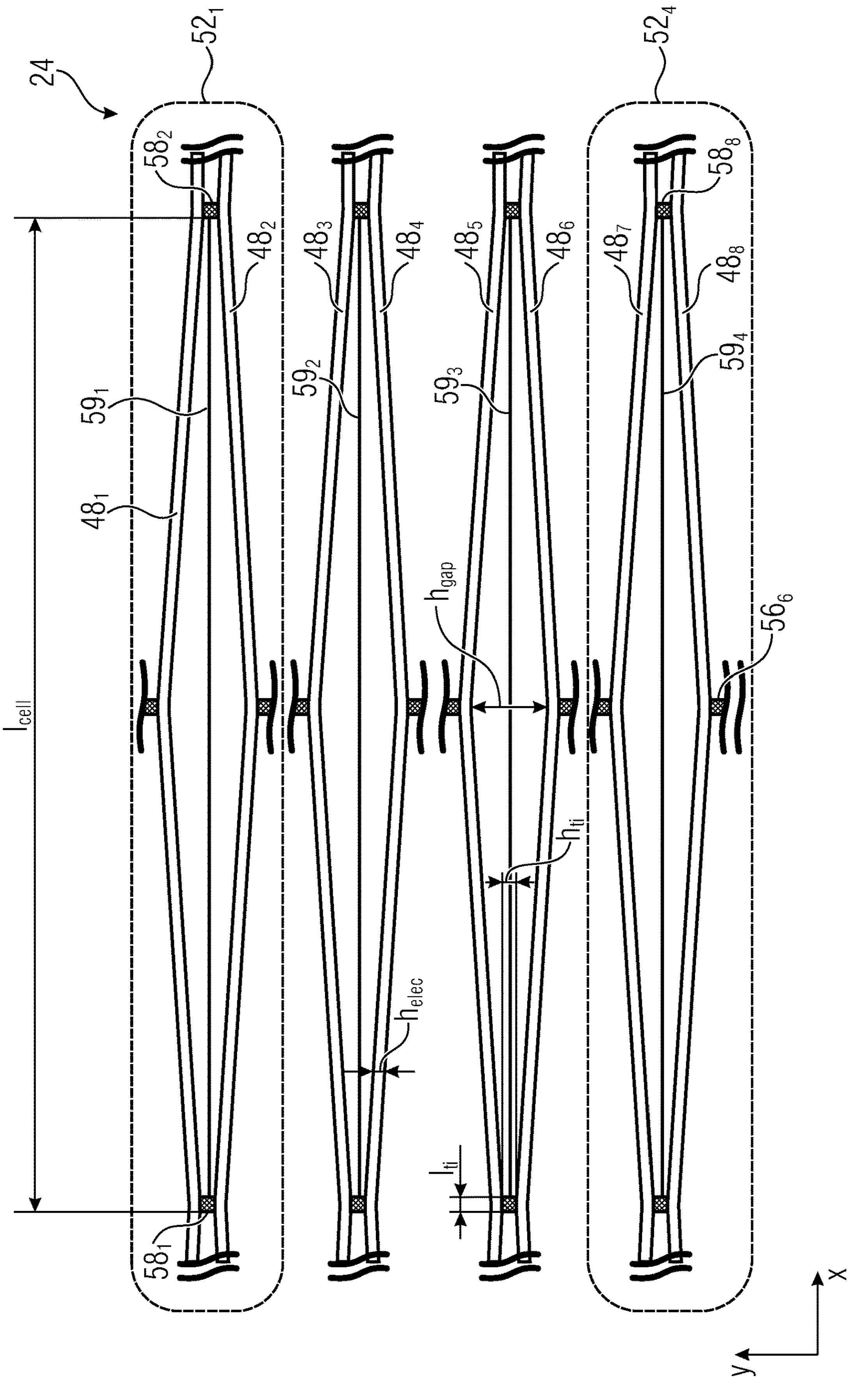

FIG. 5*e* shows a schematic top view of a part of a possible configuration of an actuator structure 24 according to an embodiment. Compared to FIG. 5*d*, the same elements can be provided and, in addition, an electrically insulating layer $\mathbf{59}_1$, $\mathbf{59}_2$, $\mathbf{59}_3$ or $\mathbf{59}_4$ can be provided between adjacent electrodes $\mathbf{48}_1$ and $\mathbf{48}_2$, $\mathbf{48}_3$ and $\mathbf{48}_4$, $\mathbf{48}_5$ and $\mathbf{48}_6$ and/or $\mathbf{48}_7$ and $\mathbf{48}_8$. The insulating layers 59 can include electrically insulating materials, such as silicon oxide, silicon nitride or other insulating materials, in particular $Al_2O_3$.

Although the electrically insulating layers $\mathbf{59}_1$ to $\mathbf{59}_4$ are shown to have a dimension along the y-direction that is thinner than the outer spacers 58, they can alternatively have an equal or greater thickness/extension, allowing, for example, an end position to be adjusted or influenced during actuation. The thickness can be uniform or variable along the x-direction.

The electrically insulating layers $\mathbf{59}_1$ to $\mathbf{59}_4$ can be suspended between the outer spacing elements arranged in an edge region of the electrodes of the electrode pair $\mathbf{52}_1$ to $\mathbf{52}_4$ to mechanically fix the electrodes. Alternatively, an arrangement of the insulating layers $\mathbf{59}_1$ to $\mathbf{59}_4$ can be provided on the substrate or other fixed structures. Alternatively or additionally, a corresponding configuration can also be obtained by arranging the outer spacing elements 58 as a continuous, possibly locally thinned-out layer between the electrodes.

In other words, FIG. 5*e* shows another embodiment with an insulating spacer layer. The illustrated alternative spacer 59 provides a connection between the spacers 58 and, for example, is firmly connected thereto. In an embodiment, the spacers 58 and 59 are made of the same material. Advantageously, this increases the dielectric constant in the gap. In addition, there is also an improvement with regard to the stiffness of the deflectable elements in their thickness direction. Likewise, short circuits between the electrodes can be avoided, for example during lateral pull-in. Further, the reliability of the active structure 24 can be improved because the so-called cold anodisation can be reduced or avoided.

Figure 5F:
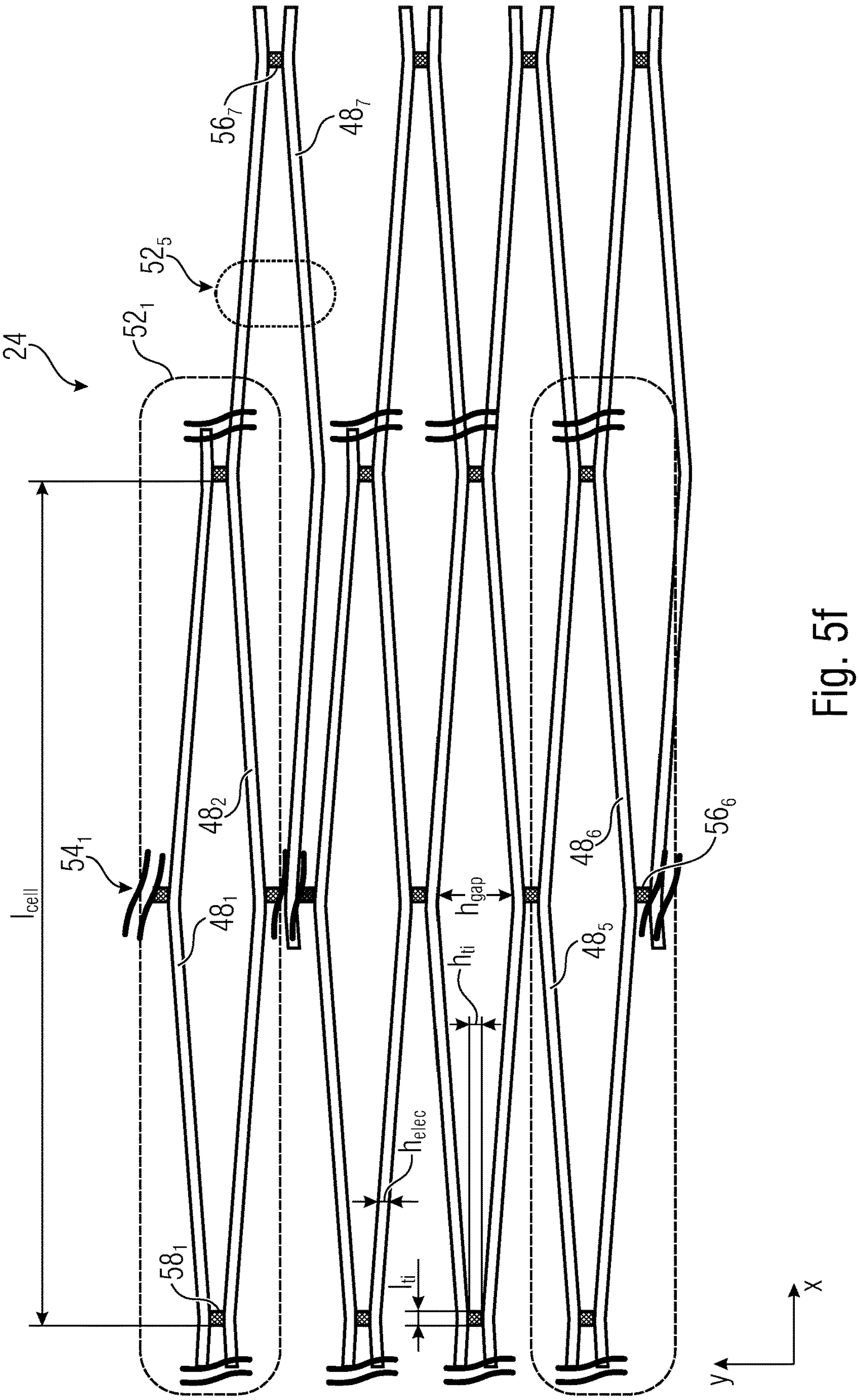

FIG. 5*f* shows a schematic top view of a part of the active structure 24 according to a further embodiment, which continues the embodiment of FIG. 5*d*. In a region of the elements referred to as inner spacers 54 in connection with FIG. 5*d*, further electrodes, such as electrode $\mathbf{48}_7$, can be arranged to form a further electrode pair $\mathbf{52}_5$ with one or more electrodes or portions thereof, for example by applying different potentials. In other words, a further electrode pair can be defined by appropriate spacing and fixing by means of electrodes of different electrode pairs. A kind of honeycomb pattern can be obtained, which provides high forces with simultaneously high stability.

In other words, FIGS. 5*a* to 5*f* show a further embodiment of a micromechanical sound transducer or a micromechanical pump with an adjustable microresonator. Comparable to the previous microresonators, the mass 16 is mechanically coupled to the surrounding substrate 12 via deflectable elements $\mathbf{22}''_1$ to $\mathbf{22}''_4$. The deflectable element is a wipe actuator.

Advantageously, the use of this new type of actuator results in a high force that can be applied to the actuator.

Figure 6A:
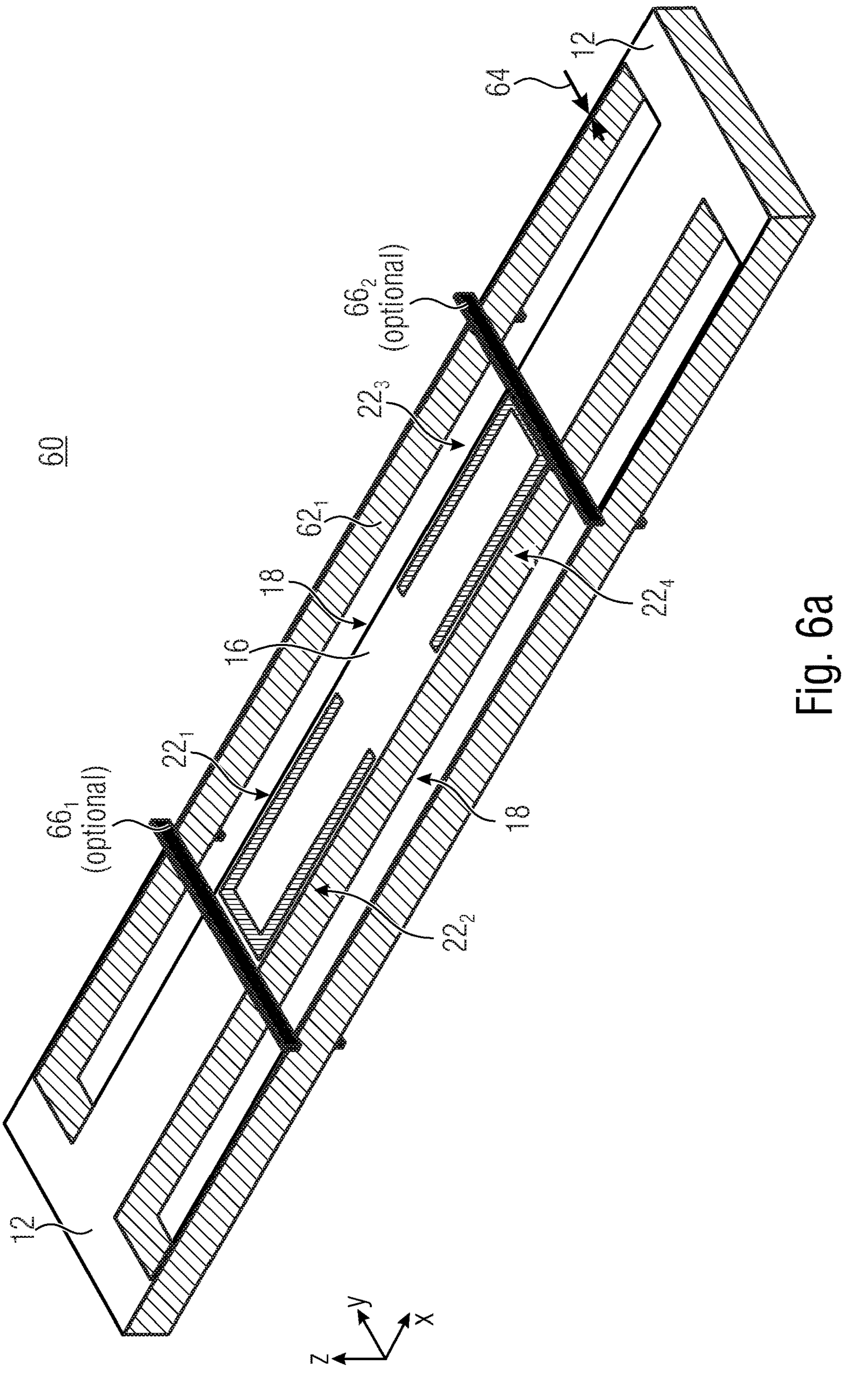
FIG. 6*a-c* are different views of an MEMS device according to an embodiment, which comprises passive limiting elements instead of the active elements, which are arranged adjacent to the mass element.

FIG. 6*a* shows a schematic perspective view of an MEMS device 60 according to an embodiment. Compared to the MEMS device 20, instead of the active elements $\mathbf{24}_1$ and $\mathbf{24}_2$, passive limiting elements $\mathbf{62}_1$ and $\mathbf{62}_2$ can be provided, which can be configured in an electrically passive manner, as described in connection with the rigid element 42. However, unlike the rigid element 42 of the MEMS device 30, the limiting elements $\mathbf{62}_1$ and $\mathbf{62}_2$ can be configured in a flexible manner, for example by providing a dimension along the direction of movement y that is at most 5 μm, at most 10 μm or at most 20 μm, while the rigid element 42 has, for example, a dimension of at least 15 μm or less, at least 30 μm or at least 45 μm, when using comparable materials, such as silicon. In the case of rigid elements, it can be a configuration criterion to select this dimension as small as possible, for example due to the packing density. For example, the configuration can start at about 15 μm, since, depending on the length of the element, even 15 μm, or possibly less, can be sufficient for the element to act as rigid or to have sufficient bending stiffness. Alternatively, it is also possible to consider the mechanical stiffness, which, for the limiting elements 62, can be in the range of at least 1 N/m and at most 10,000 N/m, while the rigid element 42 can be considered a solid.

The limiting elements $\mathbf{62}_1$ and $\mathbf{62}_2$ can be individually coupled to actuator structures, for example actuator structures $\mathbf{24}_1$ and $\mathbf{24}_2$, which are arranged along positive or negative z-direction in the MEMS device, exemplarily, that is, in a different MEMS plane than the mass element 16. Optionally, coupling elements $\mathbf{66}_1$ and/or $\mathbf{66}_2$ can be provided that are mechanically fixed to the limiting elements $\mathbf{62}_1$ and $\mathbf{62}_2$ to mechanically couple a movement of one of the limiting elements $\mathbf{62}_1$ and $\mathbf{62}_2$ to a movement of the other element, so that a movement of one of these elements or the coupling element also results in a movement of the other element. This allows, for example, the arrangement of a common actuator coupled to at least one of the coupling elements $\mathbf{66}_1$ or $\mathbf{66}_2$ to trigger a movement of the limiting elements $\mathbf{62}_1$ and $\mathbf{62}_2$. A different number of only one or more than two coupling elements can be provided.

The limiting elements $\mathbf{62}_1$ and $\mathbf{62}_2$ can be understood as interaction elements that can also move the fluid 18 by means of their movement. The limiting elements $\mathbf{62}_1$ and $\mathbf{62}_2$ can thus be passive elements for sound generation. The MEMS device 60 can also be set up with actively configured spring elements for adjusting the resonant frequency.

The limiting elements $\mathbf{62}_1$ and $\mathbf{62}_2$ can thus be part of the actuator technology regardless of a possibly passive configuration and can be understood as an actuator structural element. Optionally, one of the limiting elements $\mathbf{62}_1$ and $\mathbf{62}_2$ can also be implemented as a rigid element 42, in which case coupling of the elements by means of coupling elements 66 can be omitted. One or both of the actuator structural elements 62 can be arranged in a common plane with the mass element 16 to at least partially define the partial cavities $\mathbf{38}_1$ and $\mathbf{38}_2$ together with the mass element 16 and the resonator, respectively. The actuator structure elements and/or limiting elements $\mathbf{62}_1$ and/or $\mathbf{62}_2$ can be mechanically coupled to an active structure via coupling elements $\mathbf{66}_1$ and/or $\mathbf{66}_2$. This active structure can be configured to mechanically deflect the actuator structure elements $\mathbf{62}_1$ and $\mathbf{62}_2$ via the coupling element $\mathbf{66}_1$ and $\mathbf{66}_2$, respectively, to generate a movement in the fluid 18 that causes the deflection of the mass element 16 by means of the coupling.

In other words, FIG. 6*a* shows an MEMS device 60 with a microresonator which is formed to be not actively adjustable with respect to the resonant frequency, so that the resonant frequency of the MEMS device is comparatively invariable, for example during operation, and can have one or more coupling rods arranged orthogonally to a course of the springs. The drive, which is implemented exemplarily as the aforementioned micromuscle, as formed, for example, in connection with the spring elements 22"$_1$ to 22"$_4$ is not illustrated. The coupling elements 66$_1$ and 66$_2$ can remain movable relative to the microresonator 44, so that a relative movement can take place between the microresonator 44 and the coupling elements. Optionally, at least one of the coupling elements 66$_1$ and/or 66$_2$ can also be coupled in a mechanically fixed manner to the microresonator 44 or the movable substrate extension.

Figure 6B:
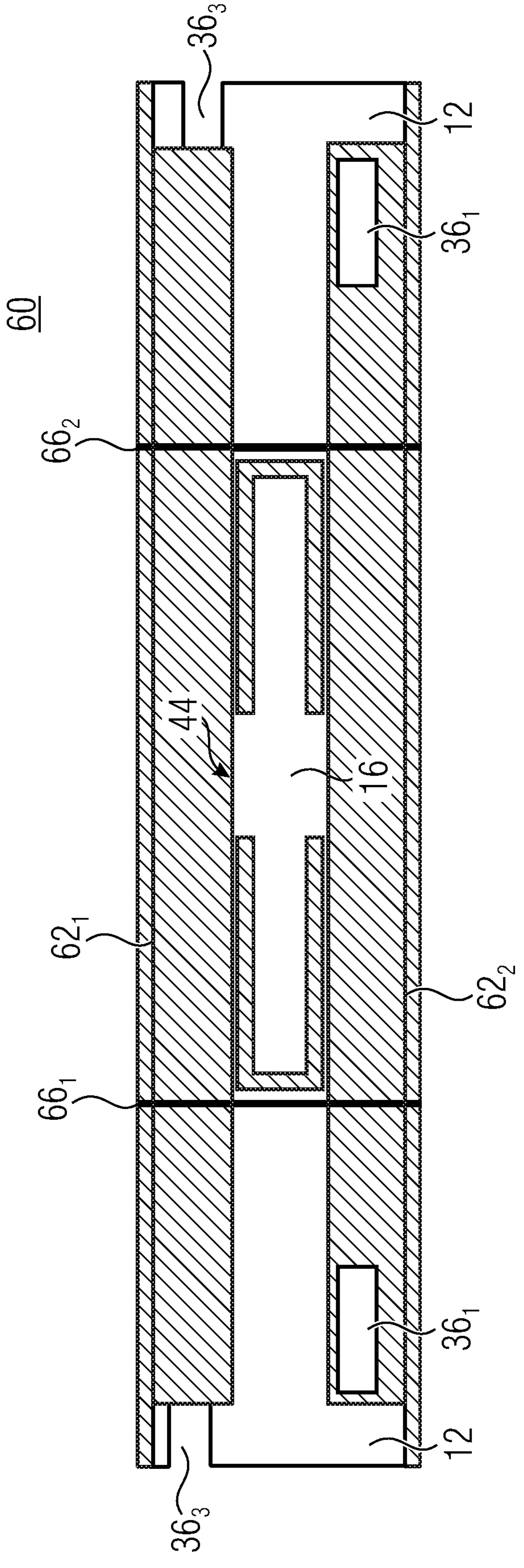

FIG. 6*b* shows a schematic top view of the MEMS device 60, wherein it is also apparent that openings 36$_3$ can also easily connect the cavity laterally in the surrounding substrate to an environment, that is, the openings 36$_3$ can be located in the MEMS plane where the mass element 16 is also partially located.

Providing the openings in a lateral arrangement, as an alternative to or in addition to being positioned in a boundary layer or lid layer, is easily combinable with other MEMS devices described herein, such as MEMS device 10, 20, 30, 40 and/or 50.

Figure 6C:
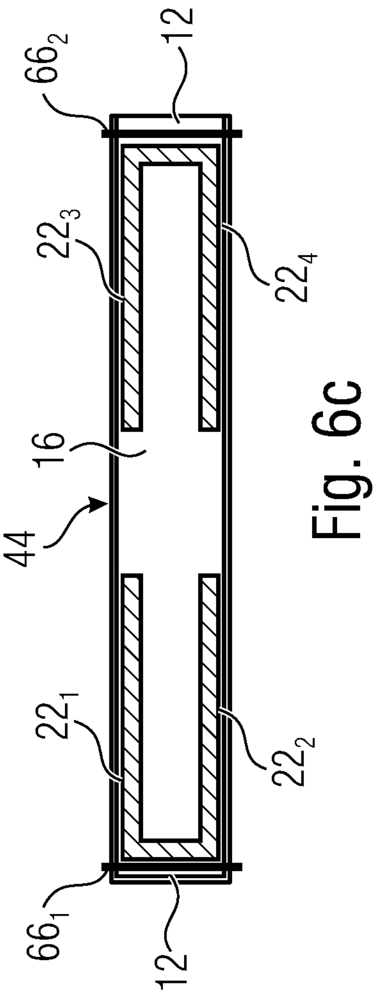

FIG. 6*c* shows a schematic top view of the resonator 44, wherein additionally parts of the coupling elements 66$_1$ and 66$_2$ are illustrated.

In other words, in a further embodiment, FIGS. 6*a* to 6*c* show the arrangement of passively deflectable elements 62$_1$ and 62$_2$ in a further layer of the MEMS layer system. In a first layer, the actively deflectable elements are arranged, such as the muscle actuator or actuator described in connection with FIGS. 5*d* to 5*f*, as described in WO 2012/095185 A1, WO 2020/078541 A1, DE 10 2015 206 774 A1, DE 10 2014 225 934 A1 and/or DE 10 2015 210 910 A1. In a second adjacent layer are passive deflectable elements 62$_1$ and 62$_2$, which can be connected to the actively deflectable elements of the first layer via coupling elements 66$_1$ and 66$_2$. The passively deflectable elements 62 are fluidically coupled to the resonator 44. With respect to the method for operating the resonators, the mode of operation remains comparable to other MEMS devices described herein.

Figure 7:
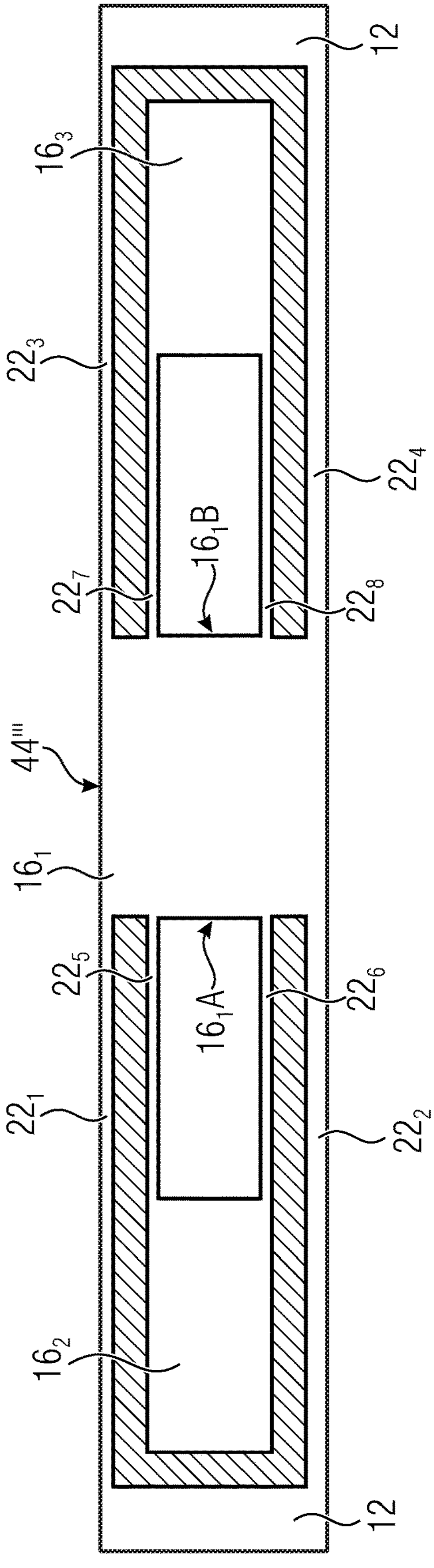
FIG. 7 is a schematic top view of a resonator according to an embodiment.

FIG. 7 shows a schematic top view of a resonator 44$^{III}$ as it can be used in connection with embodiments described herein, such as in an MEMS device 10, 20, 30, 40, 50 and/or 60. The resonator 44$^{III}$ is configured such that the spring arrangement is part of a plurality of spring arrangements arranged in an interleaved manner. The interleaved structure allows several mass elements to be provided, which can provide a multi-mass resonator from a single mass resonator. For example, a mass element 16$_2$ or 16$_3$, referred to as an inner mass element, can be mechanically fixed to the mass element 16$_1$ or one side thereof, respectively, via an additional spring arrangement including spring elements 22$_5$ and 22$_6$. On another, opposite side, the mass element 16$_3$ can be mechanically fixed to the mass element 16$_1$ via spring elements 22$_7$ and 22$_8$ of a further inner spring arrangement.

Embodiments provide for further interleaved configurations. For example, additional mass elements can be mounted on one side 16$_1$A and/or 16$_1$B, for example via additional spring elements. Alternatively or additionally, an arrangement of additional masses can be provided at the mass elements 16$_2$ and/or 16$_3$. Although the microresonator 44$^{III}$ is illustrated symmetrically with respect to the mass arrangement, an asymmetrical configuration is also possible, for example by arranging different masses and/or by omitting a mass on one side.

By providing a multi-mass oscillator, several differing resonant frequencies for the spring-mass system can be obtained, such that a resonant frequency of an oscillation of the mass element 16$_1$ is different from a resonant frequency of an oscillation of the mass element 162 and/or 16$_3$.

In other words, FIG. 7 shows a further development of the resonator into a spring-mass system with several degrees of freedom. By coupling a second mass 16$_2$ and/or 16$_3$, a multi-mass oscillator can be obtained. Advantageously, this results in the possibility of generating and/or exciting a second or even further resonant frequency in addition to the first resonant frequency of the resonator. The additional mass is mechanically coupled to the mass 16$_1$ via passive connecting elements.

Embodiments provide that one or more of the springs 22$_1$ to 22$_8$ are formed as mechanically active springs for adjusting the spring stiffness.

Some of the embodiments described above refer to straight mechanical passive springs. In addition to an active configuration of spring elements, further embodiments alternatively or additionally provide that a spring element is curved and/or meandering and/or has a variable dimension perpendicular to a spring extension direction, for example a variable spring width and/or spring height.

Figure 8A:
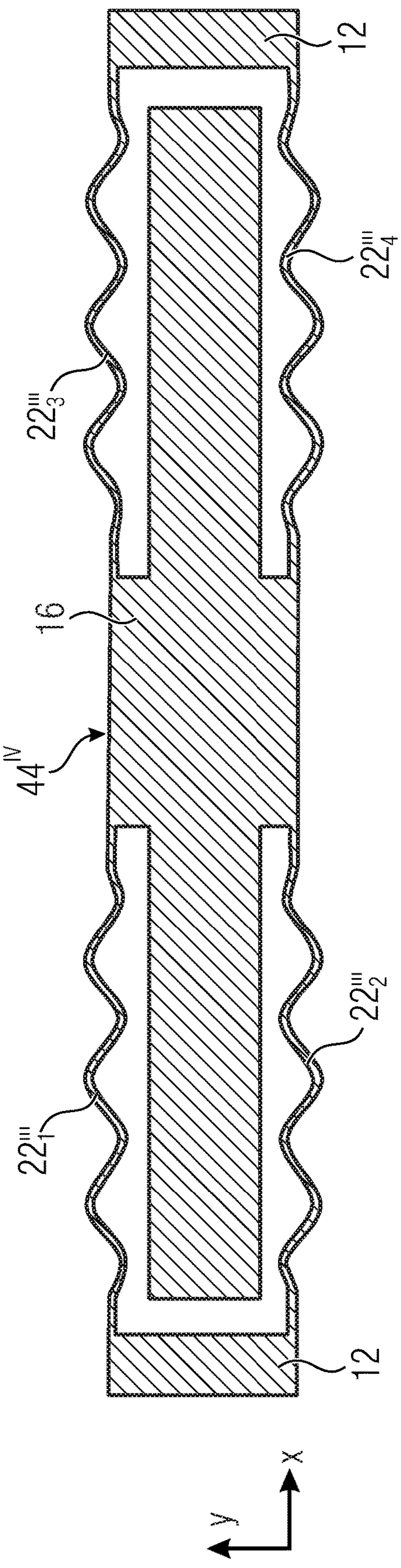
FIG. 8*a-c* are schematic top views of microresonators with different spring structures.

FIG. 8*a* shows a schematic top view of a microresonator 44$^{IV}$ that can be arranged in MEMS devices according to embodiments. Spring elements 22'''$_1$ to 22'''$_4$ of the microresonator 44$^{IV}$ can have a curved, approximately wave-shaped geometry. This enables a comparatively longer configuration of the spring elements, which can enable a lower effective spring stiffness and/or larger deflections.

Figure 8B:
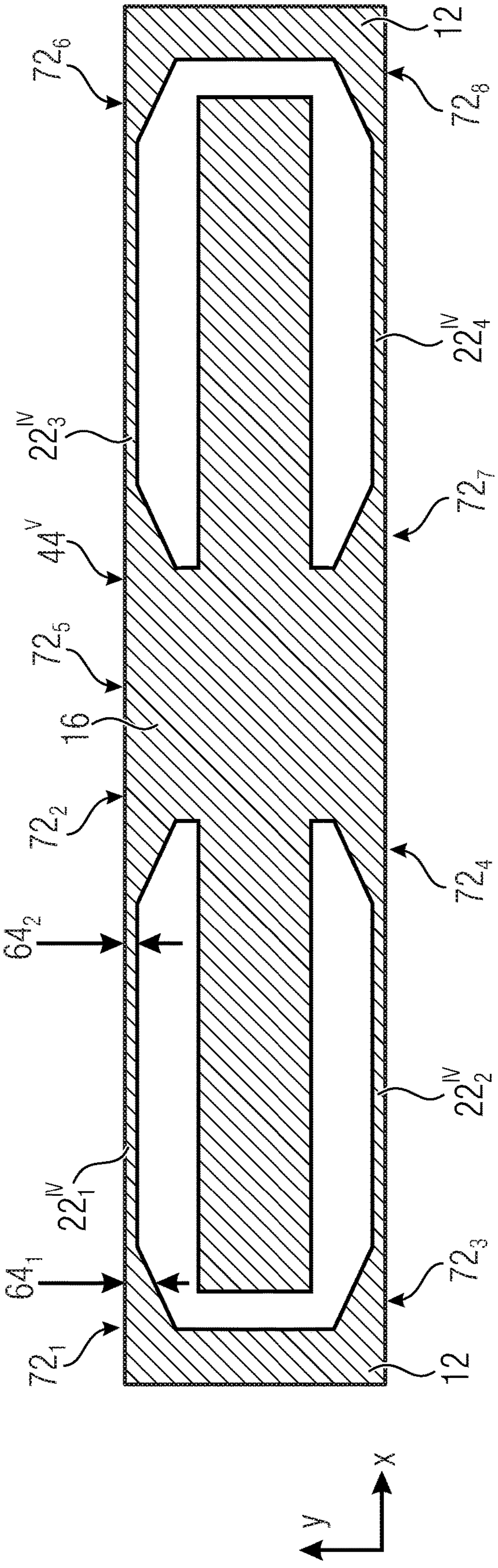

FIG. 8*b* shows a schematic top view of a microresonator 44$^{V}$ that can be easily used in embodiments described herein. Compared to the microresonator 44, the microresonator 44$^{V}$ comprises spring elements 22$^{IV}_1$ to 22$^{IV}_4$ that are thickened or reinforced at one or both ends, that is, have a comparatively larger dimension 64$_1$ compared to a dimension 64$_2$ in a center or central area of the spring elements. This allows, for example, increased robustness of the structure, as additional material is provided at locations of force peaks, such as can occur at the ends of springs.

In other words, mechanical reinforcements 72$_1$ to 72$_8$ can be provided at one or several spring ends.

Figure 8C:
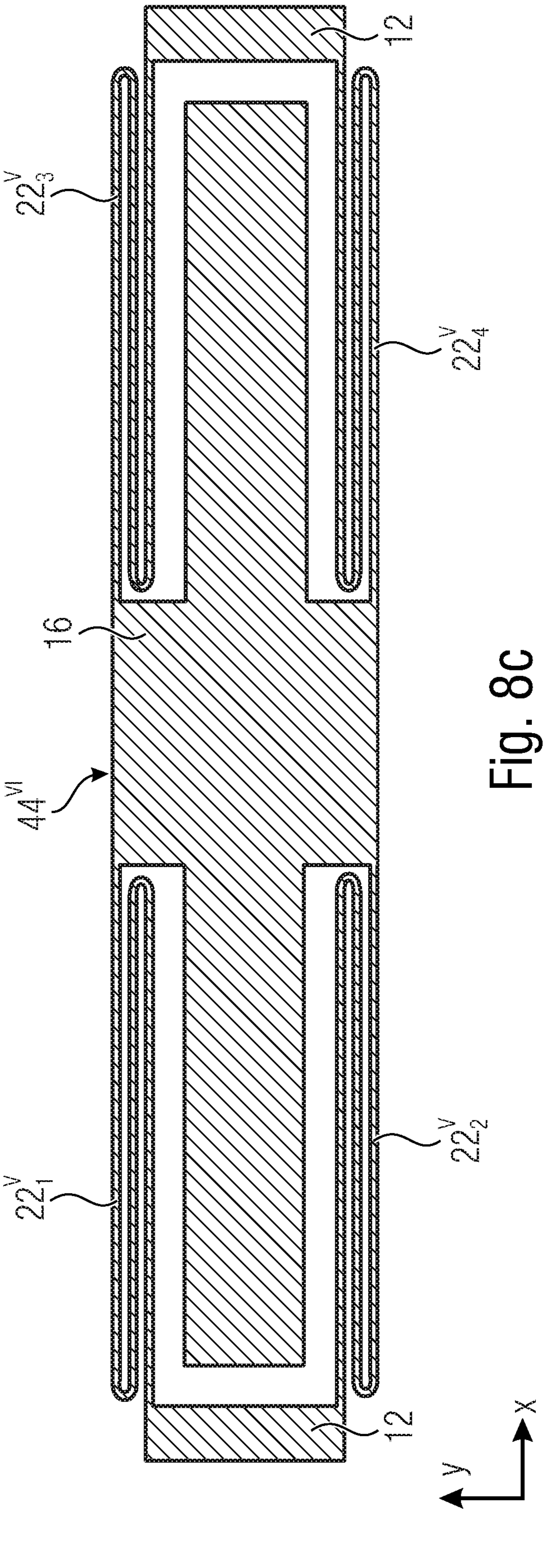

FIG. 8*c* shows a schematic top view of a microresonator 44$^{VI}$ that can be easily used in embodiments described herein. Compared to other microresonators, the spring elements 22$^{V}_1$ to 22$^{V}_4$ are formed in a meandering manner, which can lead to long spring lengths, which on the one hand can enable high deflections and on the other hand can enable force peaks to be avoided in a course of the springs.

In other words, FIGS. 8*a* to 8*c* show embodiments of alternative resonators. The same relate to the geometric design of the passive connecting elements or springs. The geometry of the connecting elements can be used to specifically influence the stiffness of these connecting elements as part of the configuration and/or the design process. For example, the geometry can be curved in a top view, see FIG. 8*a*. The width of the connecting elements can be variable and can be thickened or reinforced, especially in the area of the connection to the substrate and/or to the mass 16, as shown in FIG. 8*b*. This has the advantage that excess stresses in the connecting elements resulting from the movement of the resonator are minimized. Although the variable geometries are shown in top view, according to further embodiments, variable geometries can also be provided in a side sectional view, for example to account for possible torsional movements of the mass element 16.

Further embodiments provide a configuration of an MEMS device as an array comprising a plurality of mass elements, which can be arranged, for example, in the form of a plurality of microresonators 44 arranged adjacent to each other. Embodiments described herein relate in particular to the microresonator 44, although any other configurations of the microresonator can also be used, such as the microresonator $44^{I}$, $44^{II}$, $44^{III}$, $44^{IV}$, $44^{V}$ and/or $44^{VI}$. Although the microresonators are shown as being formed identically, differing microresonators can also be used.

Figure 9A:
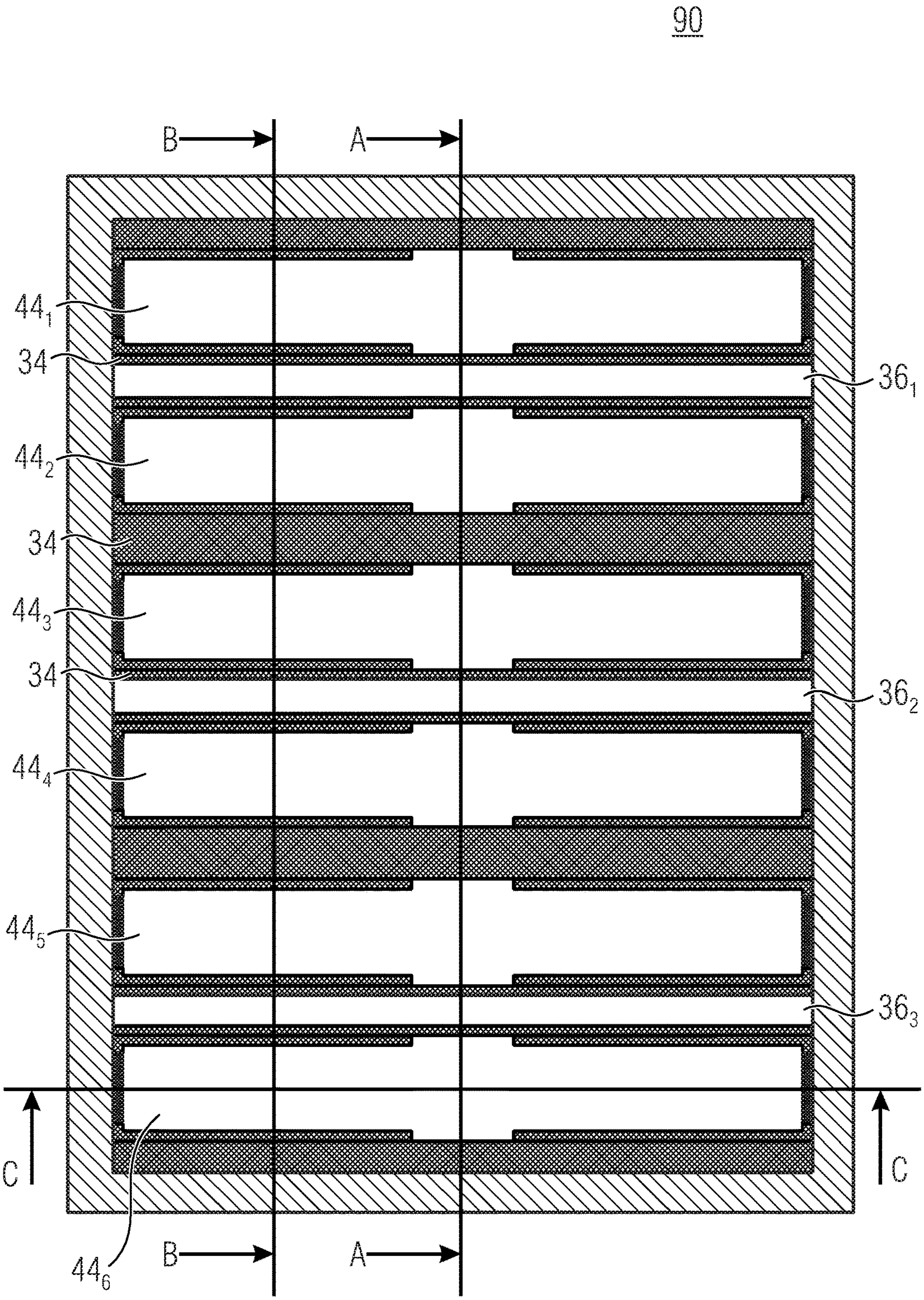
FIG. 9*a-e* are different views of an MEMS device according to an embodiment comprising a plurality of mass elements.

FIG. 9*a* shows a schematic top view of an MEMS device 90 according to an embodiment, which comprises a plurality of mass elements. These mass elements cover actuator structures, which, in simplified terms, can be arranged below the resonators $44_1$ to $44_6$, wherein this can relate to a structure passively moved by means of an actuator and/or to an active structure itself. For example, an actuator group or actuator structure with a coupling element is arranged below each mass element. It is understood here that terms such as up, down, left, right, above or below can be arbitrarily variable or interchangeable depending on how the structure is rotated or positioned in space and thus do not have a restrictive effect. FIG. 9*e* shows the plane (substrate layer $12_1$ in FIG. 9*b*) that is positioned below the plane with the resonators (substrate layer $12_2$ in FIG. 9*b*).

Figure 9B:
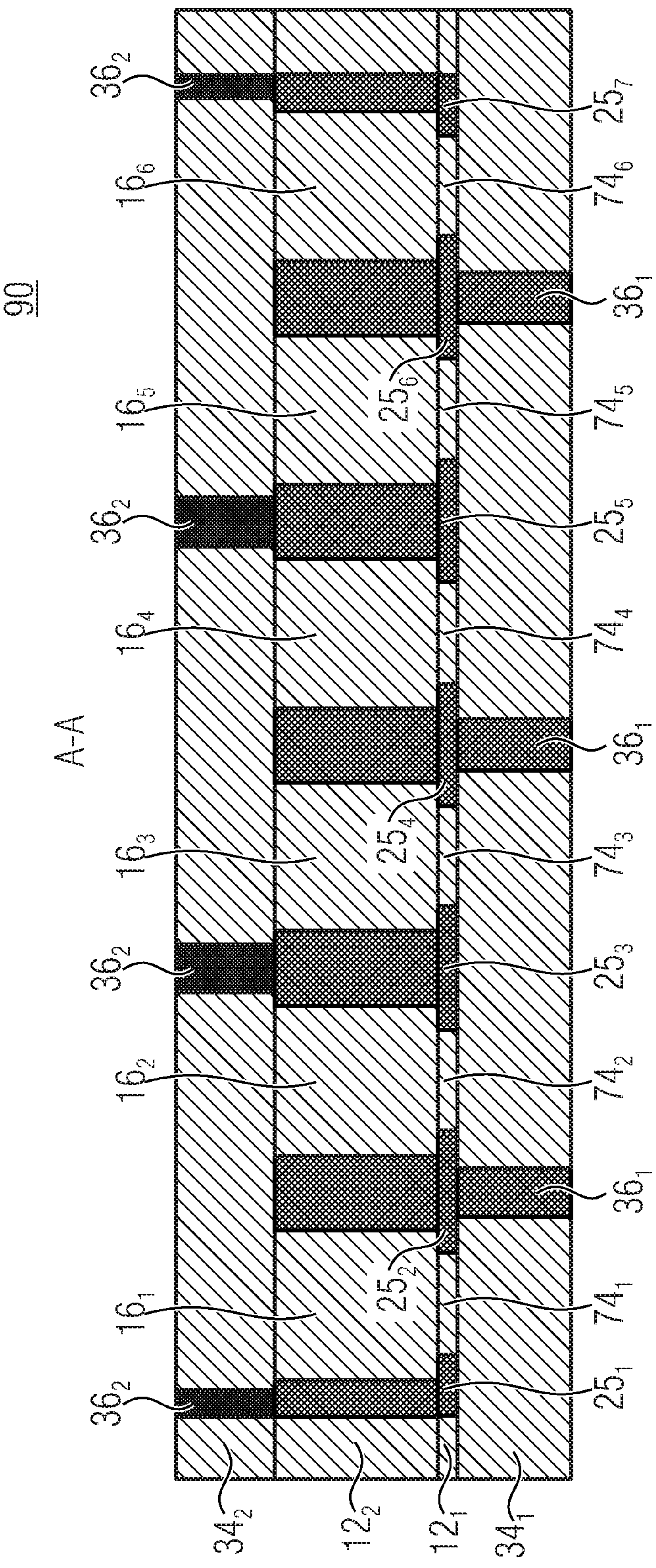

FIG. 9*b* shows a schematic side sectional view of the MEMS device 90 in a sectional plane A-A of FIG. 9*a*.

Exemplarily, a layer arrangement of the MEMS device having two boundary layers $34_1$ and $34_2$ is illustrated, which can be understood as bottom wafer $34_1$ and top wafer $34_2$ by way of example, although this does not exclude an additional or alternative arrangement of other or additional layers. Two substrate layers $12_1$ and $12_2$ are arranged, for example, between the boundary layers $34_1$ and $34_2$. The substrate layer $12_1$ can have, for example, one or several partial cavities or voids $25_1$ to $25_7$ arranged therein.

Mechanically rigid coupling elements 74 can be arranged between adjacent actuator structures to couple the movement of the actuator structures to each other and/or to couple the movement of at least one actuator element to a mass element connected thereto, such as the mass element $16_1$.

Although the layer sequence between layers $12_2$ and $12_1$ on the one hand and $34_2$ on the other hand is shown to be extremely small or zero distances are provided to allow low-energy movement of the moving masses relative to adjacent solid layers. This distance is selected to be small in order to prevent fluidic short circuits. At the same time, a distance between the mass element 16 and an adjacent boundary layer, such as the boundary layer $34_2$, which partially limits the cavity in which the mass element is arranged, influences a Q-factor or attenuation factor of the transfer function, at least partially. The MEMS device exhibits an overshoot of at most 20% in a range of a resonant frequency of an oscillation of the mass element, as shown for example in connection with FIG. 9*f*. The distance is selected such that a corresponding Q-factor is obtained. In FIG. 9*f*, three different Q-factors Q1, Q2 and Q3 are shown by way of example, which increase in value with increasing index 1, 2, 3. With decreasing Q-factor, i.e. increasing attenuation, the frequency response shown in FIG. 9*f* becomes smaller with respect to the overshoots $Ü_1$ and/or $Ü_2$ in the range of the resonant frequency $f_{res}$. Embodiments relate to methods for manufacturing and/or configuring MEMS devices, in which the distance between a movable element, such as the mass element 16, and a boundary layer is adjusted and selected such that the MEMS device comprises an overshoot of at most 20% in the region of a resonant frequency of an oscillation of the mass element.

Figure 9C:
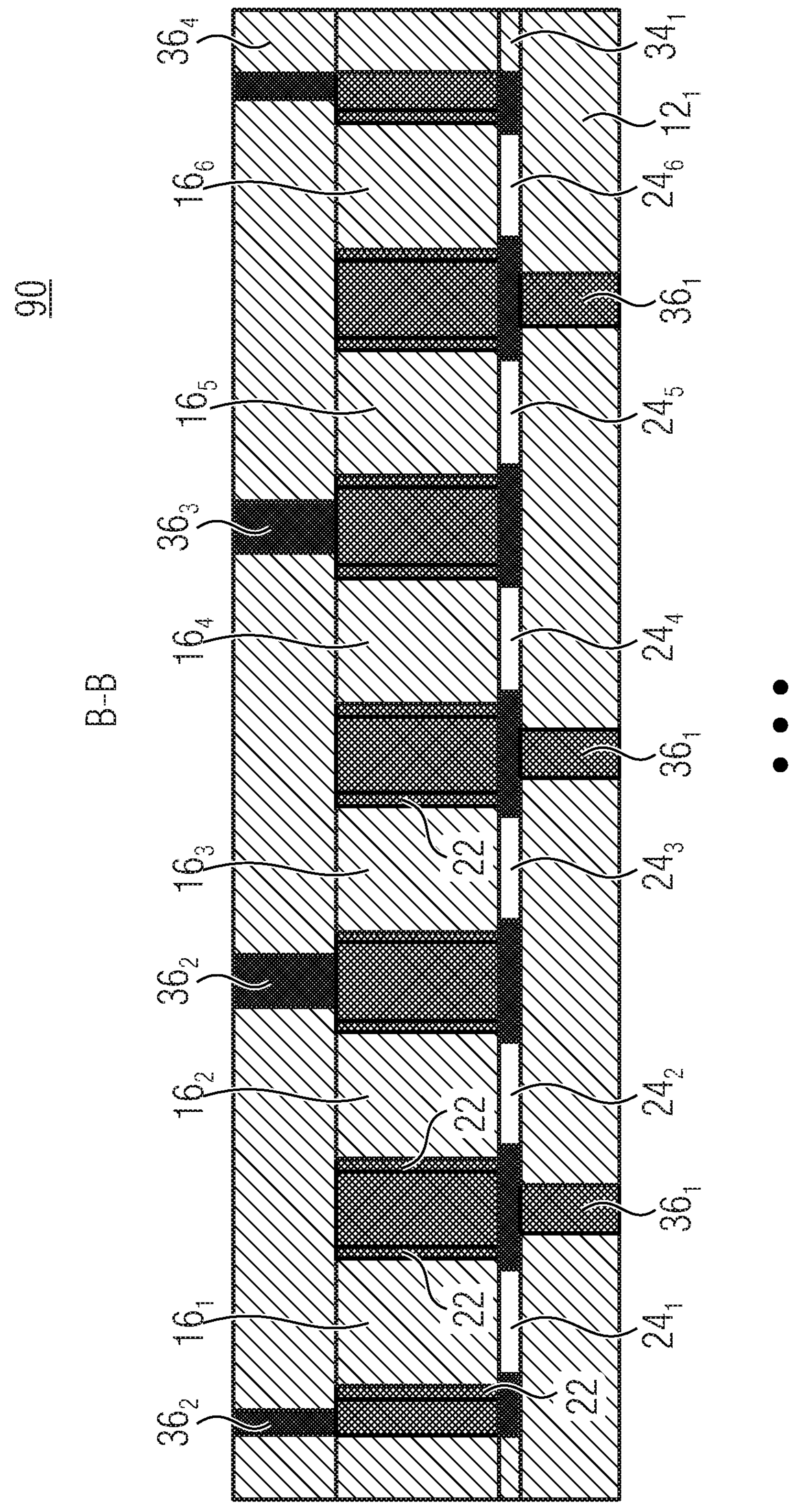

FIG. 9*c* shows a schematic side sectional view of the MEMS device 90 in a sectional plane B-B from FIG. 9*a*. The actuator structures $24_1$ to $24_6$ are shown there by way of example.

Figure 9D:
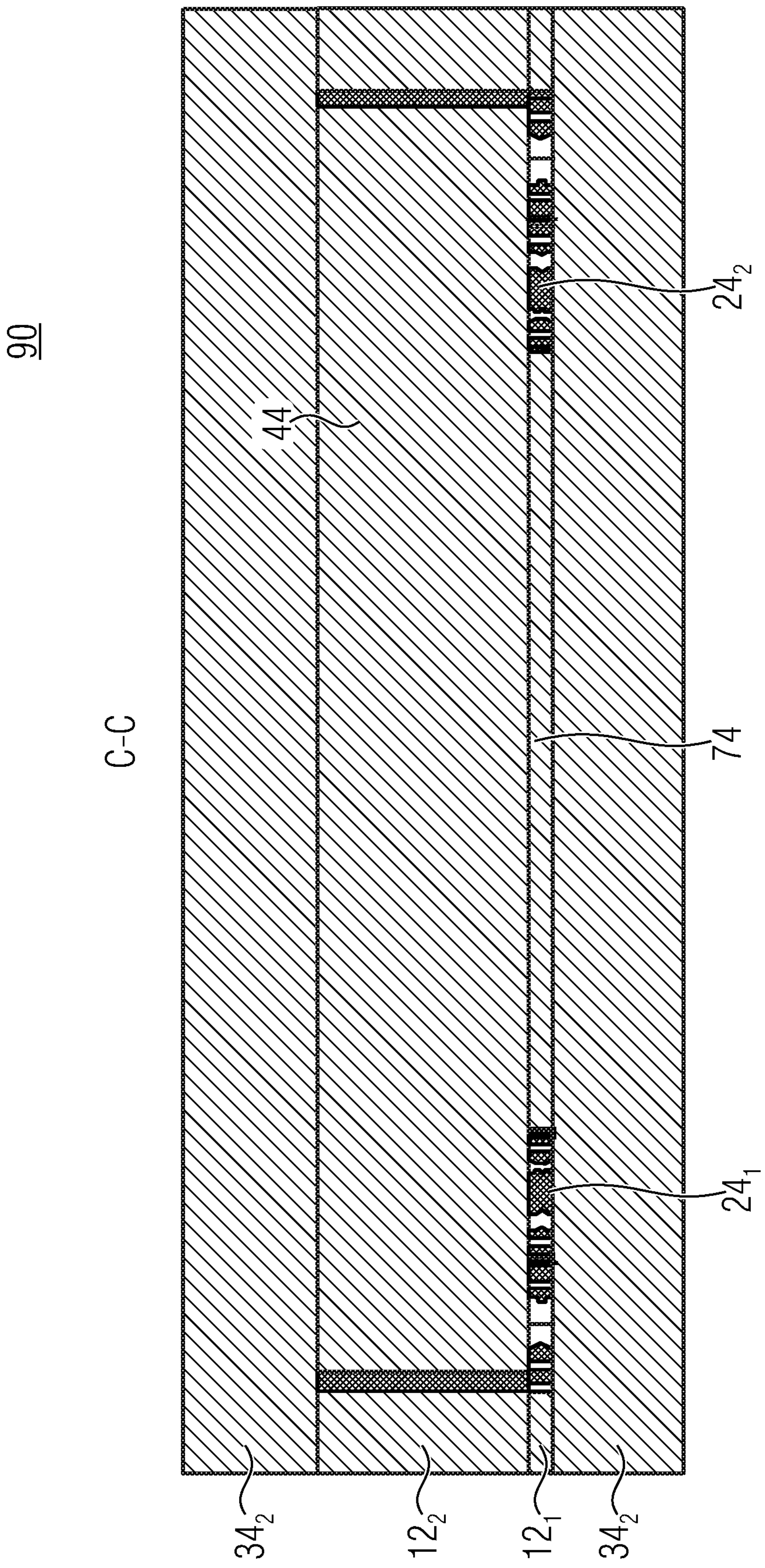
Figure 9E:
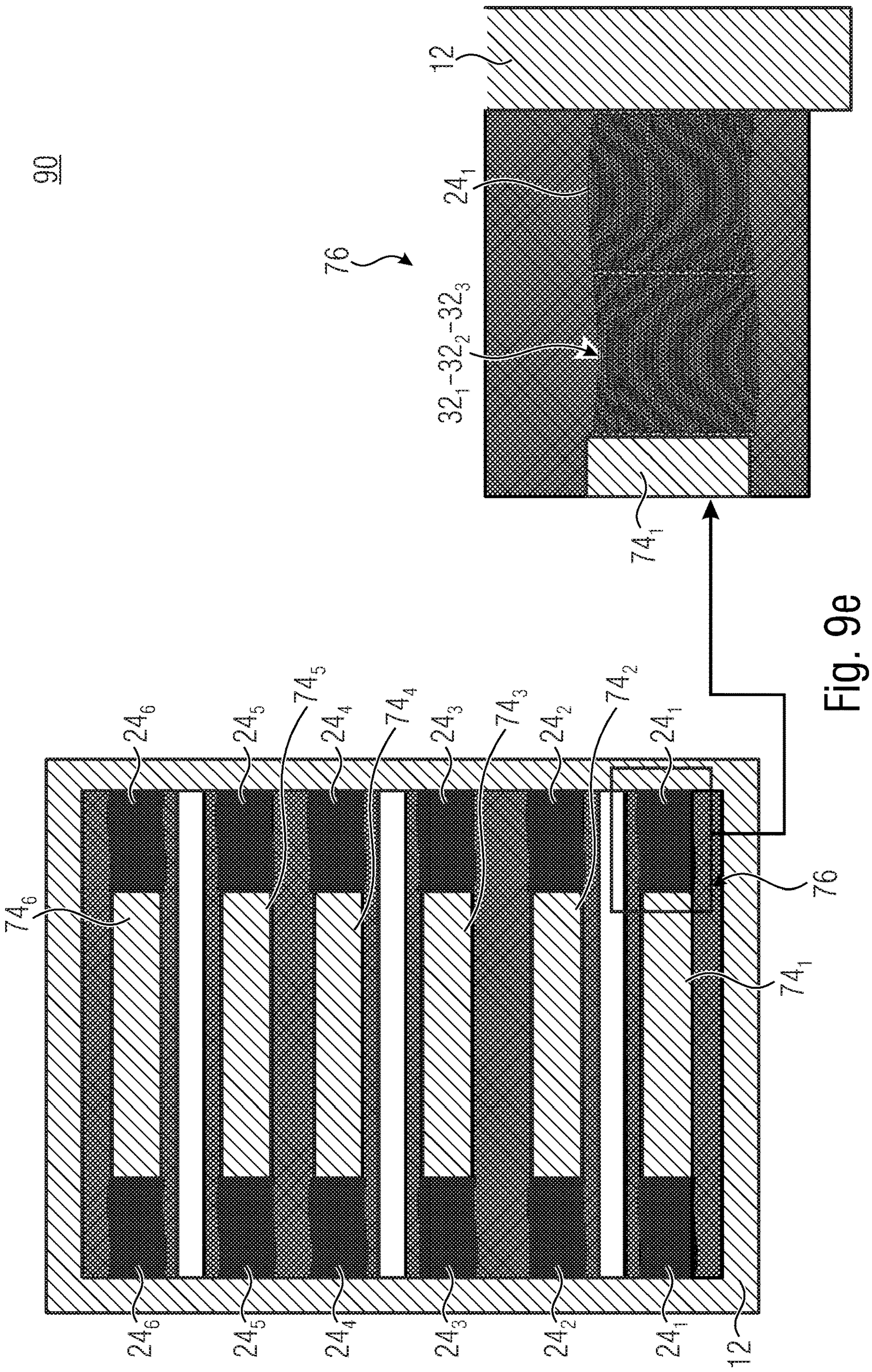
Figure 9F:
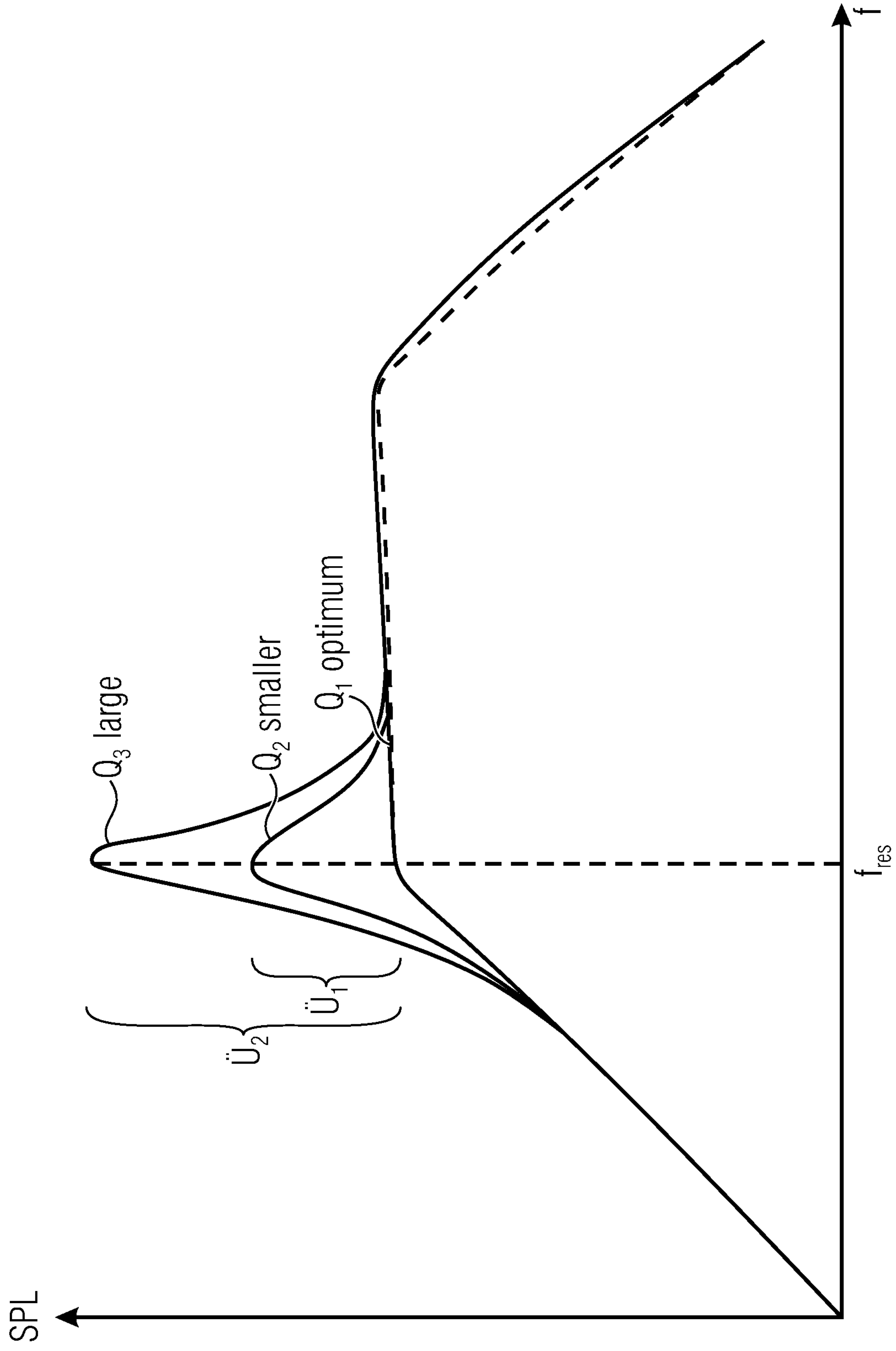
FIG. 9*f* is a schematic diagram explaining the frequency response of inventive MEMS devices in dependence on a Q-factor.

FIG. 9*d* shows a schematic side sectional view of the MEMS device 90 in a sectional plane C-C of FIG. 9*a*. Again, two adjacent actuator structures $24_1$ and $24_2$ are shown by way of example, coupled together by means of a rigid coupling element 74, wherein the coupling element 74 can be coupled to the resonator 44 or the mass element thereof to actively cause the deflection.

FIG. 9*e* shows a schematic top view of a configuration of the MEMS device 90 in one illustration, where both actuator structures $24_1$ to $24_6$ and coupling elements $74_1$ to $74_6$ are illustrated.

An enlarged representation of a section 76 is also illustrated to illustrate that the actuator structure $24_1$, as well as other actuator structures described herein, can include a plurality of beam elements arranged side-by-side, wherein each beam structure can represent a combination of two or several beam elements $32_1$, $32_2$, and $32_3$. An example is shown of an arrangement of twenty beam structures arranged side by side, each having two segments connected in series with each other and each segment being formed of three beam elements, which are fixed mechanically at discrete locations.

In other words, FIGS. 9*a* to 9*e* show an embodiment of a multilayer sound transducer comprising microresonators. Six microresonators $44_1$ to $44_6$ are illustrated, although any other lower or even higher number of at least 1, at least 2, at least 3, at least 4, at least 6, at least 7, at least 10 or higher can be implemented. The microresonators are connected to the surrounding substrate 12 with elements of defined stiffness 22. The microresonators are arranged in a layer $12_2$. Actively deflectable elements 24 are arranged in a further layer $12_1$ whose dimensions in the thickness direction (for example z-direction) are significantly smaller than the layer 122, for example by a factor of 0.5, 0.3, 0.2 or less. These actively deflectable elements can be rigidly connected to the resonators via coupling elements 74. Lid and/or bottom wafers $34_1$ and/or $34_2$ can be provided with openings $36_1$ and $36_2$, respectively, which connect the cavities formed by adjacent resonators to the environment. The openings can extend over the entire width of the resonators, as shown for example in FIG. 9*a*, or only over parts thereof, as shown for example in FIG. 10*b*. FIG. 8*e* shows a top view of a section parallel to the plane of the bottom wafer. The actively deflectable elements 24, which are connected to the surrounding substrate 12, are illustrated. On the opposite side, the deflectable elements 24 are connected to the coupling elements 74. The coupling elements have a stiffness that is greater than the stiffness of the deflectable elements 22.

According to embodiments, an active element is at least partially arranged in a plane offset from a plane of the mass element 16 and coupled to a part of the actuator structure, which is arranged in a common plane with the mass element.

Figure 10A:
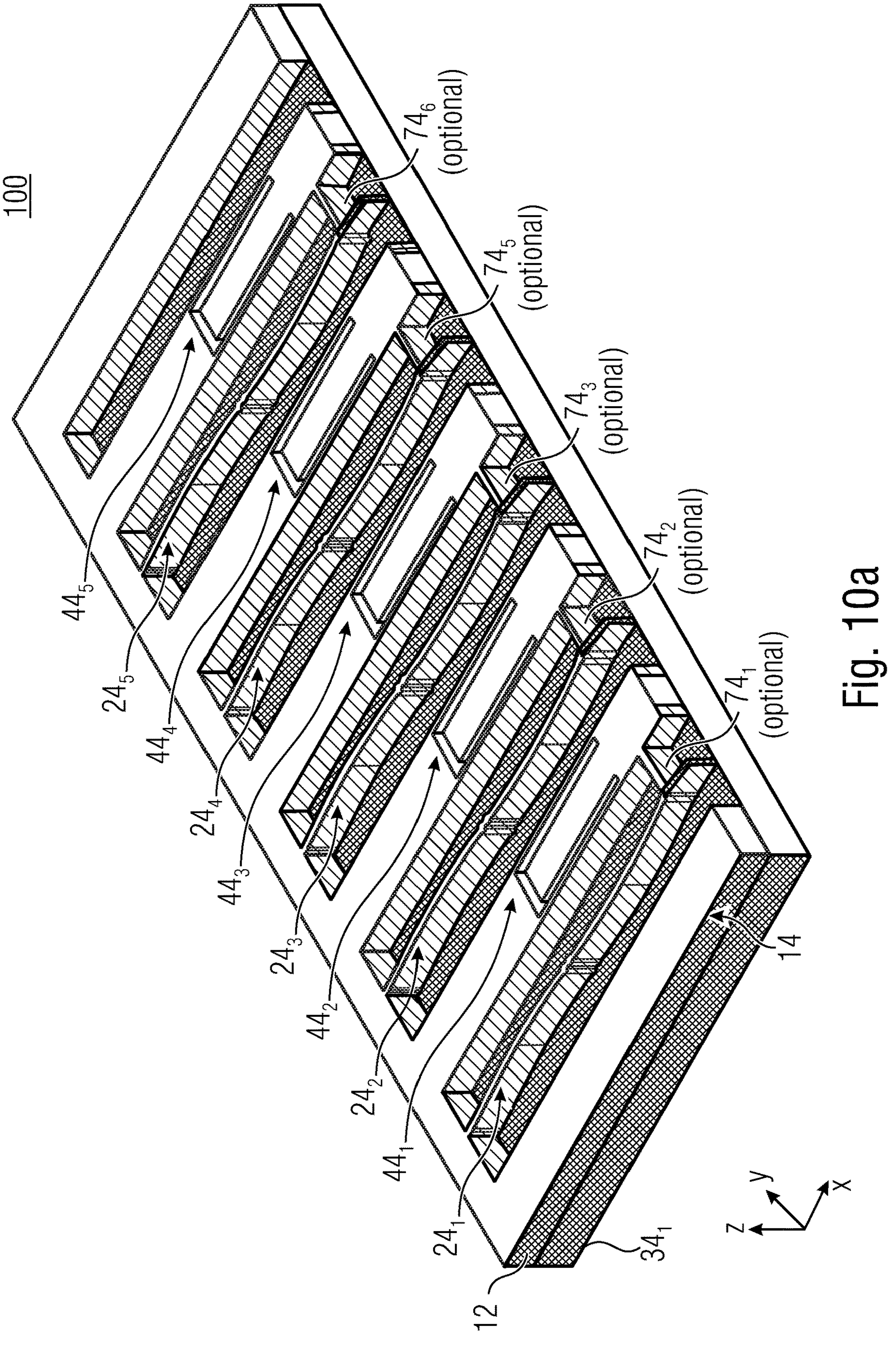
FIG. 10*a-b* are different views of an MEMS device according to an embodiment comprising a plurality of mass elements and providing a rigid coupling to an actuator structure.

FIG. 10*a* shows a schematic perspective view of an MEMS device 100 according to an embodiment. Only a part of the dimension of the MEMS device 100 along the x-direction is illustrated, and only a part of the layers to better illustrate an interior of the MEMS device 100. Microresonators $44_1$ to $44_5$, which can also be implemented by other microresonators as described in connection with all other embodiments, can be excited by an arrangement of elements in the substrate plane 14. Exemplarily, actuator structures $24_1$ to $24_5$ are provided, each actuator structure $24_1$ to $24_5$ being arranged between two adjacent resonators. These actuator structures can optionally be coupled to one or several adjacent microresonators via rigid connecting elements $74_1$ to $74_6$. Alternatively, the actuator structures $24_1$ to $24_5$ can be implemented in whole or in part by passive structures moved by actuator structures in a different plane. As an alternative to the rigid connecting elements $74_1$ to $74_6$, a fluidic soft coupling can also be provided, wherein excitation of the microresonators $44_1$ to $44_5$ can be performed by means of the movement of the structures $24_1$ to $24_5$ in an active or passive configuration.

That is, an actuator structure arranged between two adjacent mass elements can be mechanically coupled to one or both of the adjacent mass elements or configured to deflect one or both of the adjacent mass elements. Other than illustrated in FIG. 10*a*, at least two actuator elements or at least two mass elements can be connected to each other by a coupling element.

Other than illustrated in FIG. 10*a*, it is also possible that the one or more actuator structures are arranged in a first MEMS plane and the mass element is arranged in a second, different MEMS plane. The actuator structure can be mechanically coupled to the mass element by means of a coupling element, as described in connection with FIGS. 9*a* to 9*e*.

The microresonators $44_1$ to $44_5$ in the array can be formed to oscillate at the same resonant frequency but also to oscillate at a different resonant frequency. This can be done by a variation in the spring stiffness and/or by a variation in the mass of the mass element.

Figure 10B:
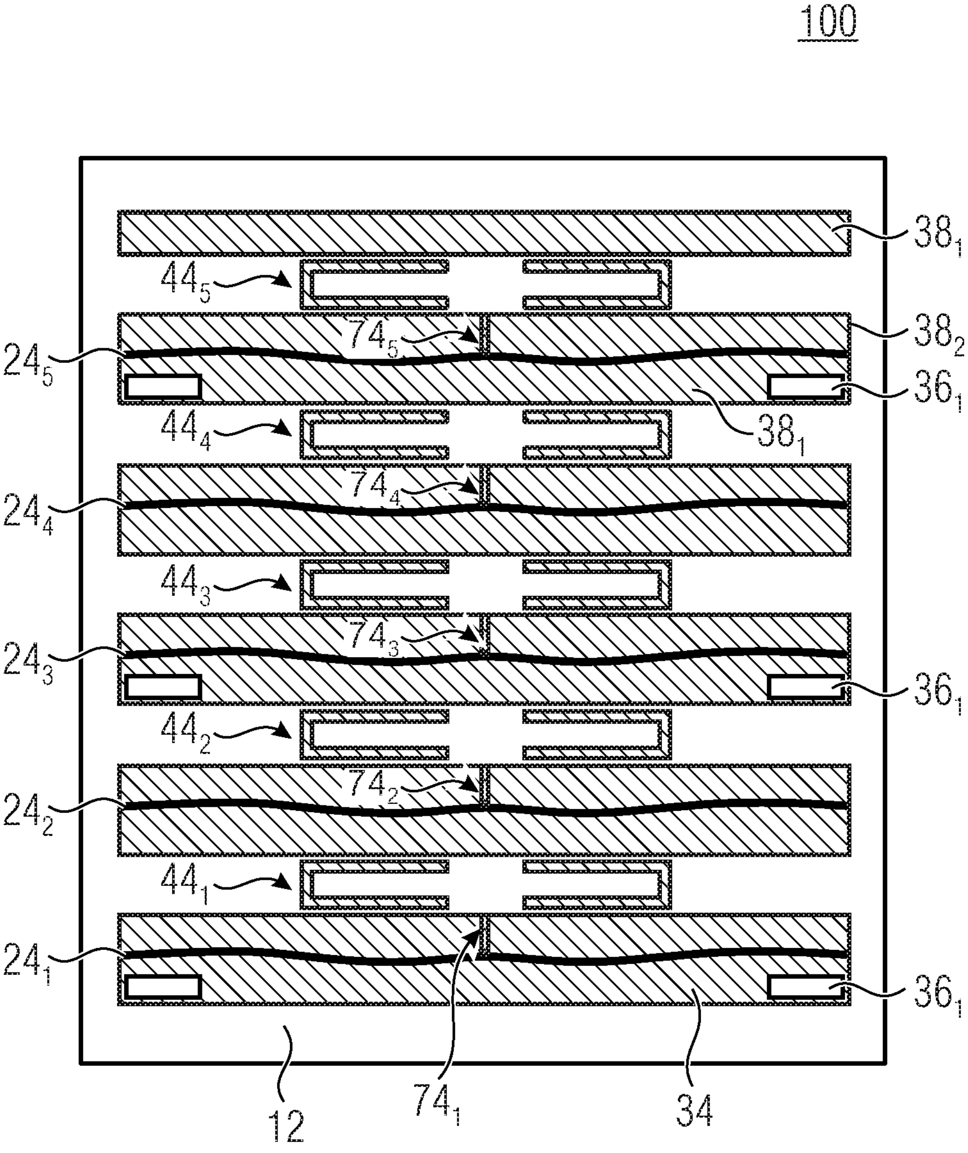

FIG. 10*b* shows a schematic top view of the MEMS device 100. It is illustrated that openings in the boundary layer 34 can also be implemented only in places, so that openings $36_1$ can be arranged only at edges of the partial cavities $38_1$ as an example. Alternatively, other locations, sizes and/or positions can be provided or some of the sub-cavities can be implemented without an opening, as shown for example for the sub-cavity 381 adjacent to the microresonator $44_5$.

In other words, FIGS. 10*a* and 10*b* show an embodiment of a multilayered sound transducer 100 characterized, among others, in that microresonators $44_1$ to $44_5$ are rigidly connected via optional coupling elements $74_1$ to $74_5$. Such elements have a higher stiffness than the deflectable elements 24. FIGS. 10*a* and 10*b* show a simplified representation. Further, alternative embodiments have thickenings in the area of the clamping, so that possible stresses in the material can be homogeneously dissipated into the resonator or into the deflectable element.

Figure 10C:
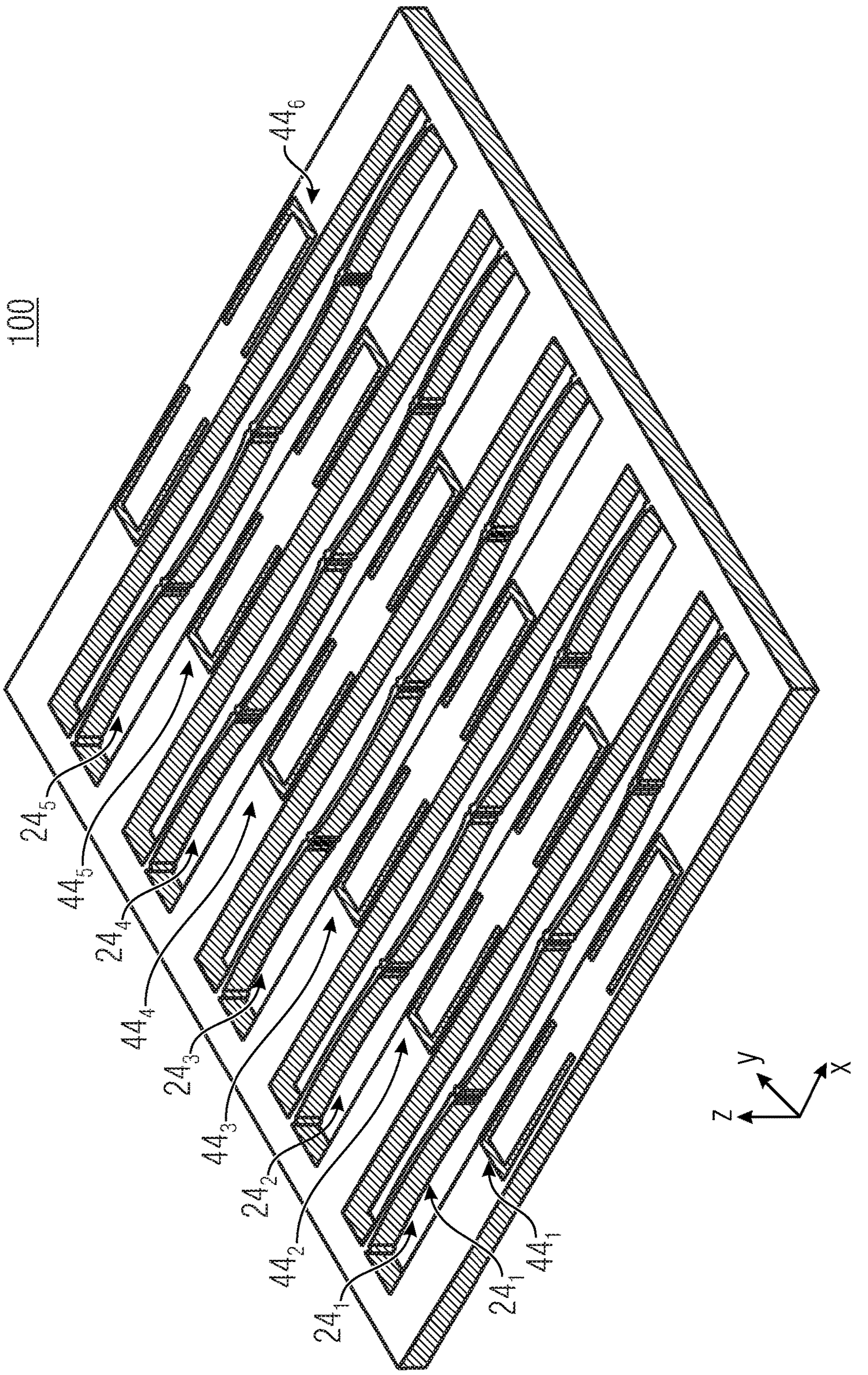
FIG. 10*c* is a schematic perspective view of an MEMS device according to an embodiment, comprising a plurality of mass elements and a fluidic coupling to a common actuator structure is provided between two mass elements.

FIG. 10*c* shows a schematic perspective view of a configuration of the MEMS device 100 without the optional rigid connecting elements. The actuator structures $24_1$ to $24_5$ can also be arranged between two adjacent resonators $44_1$ to $44_6$ and their mass elements, respectively, and can be configured to excite the resonators $44_1$ to $44_5$ by moving the actuator structures $24_1$ to $24_5$ by means of fluidic coupling.

Figure 11A:
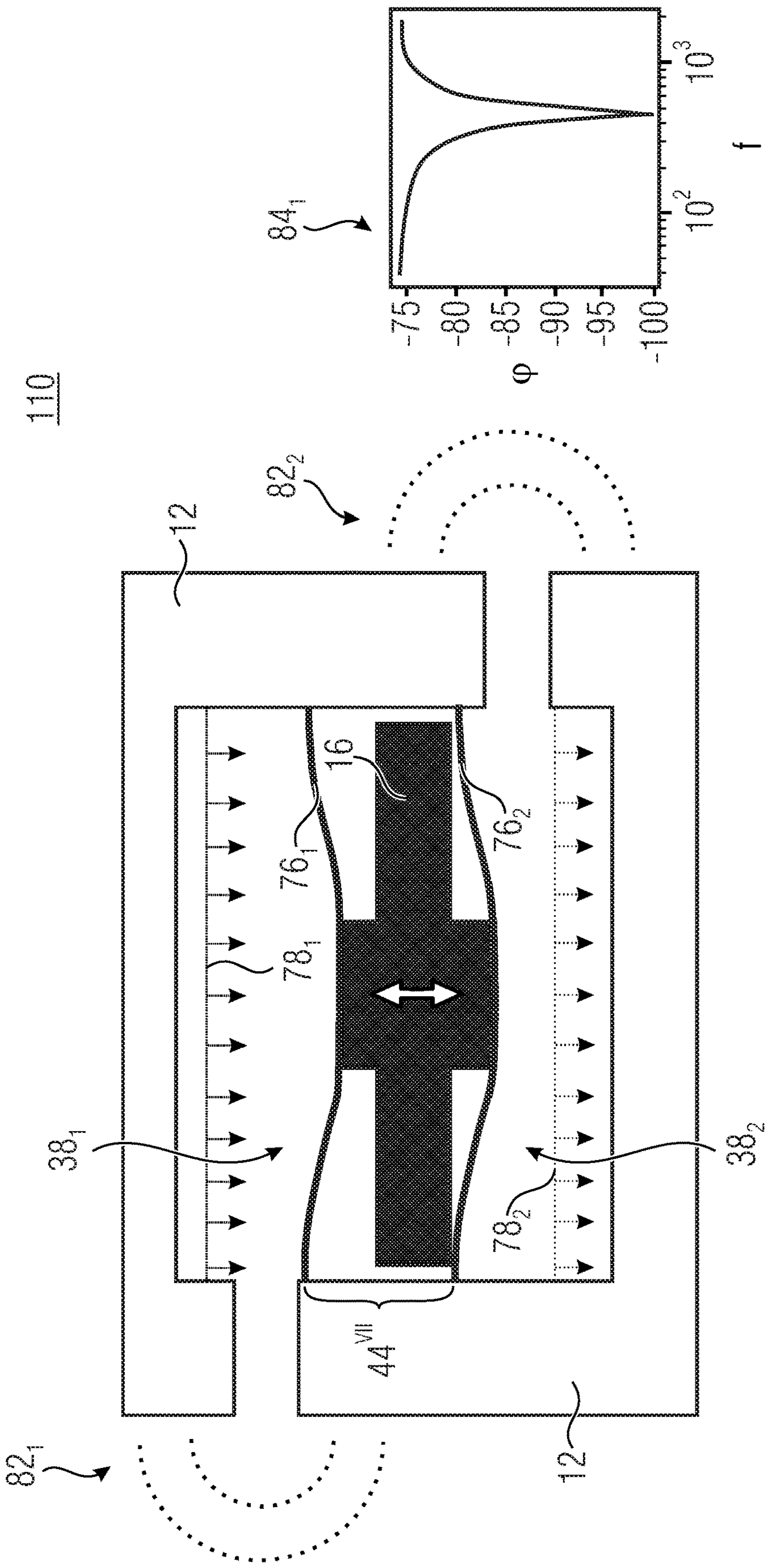
FIG. 11*a-b* are schematic top views of MEMS devices according to embodiments arranged in a housing.
Figure 11B:
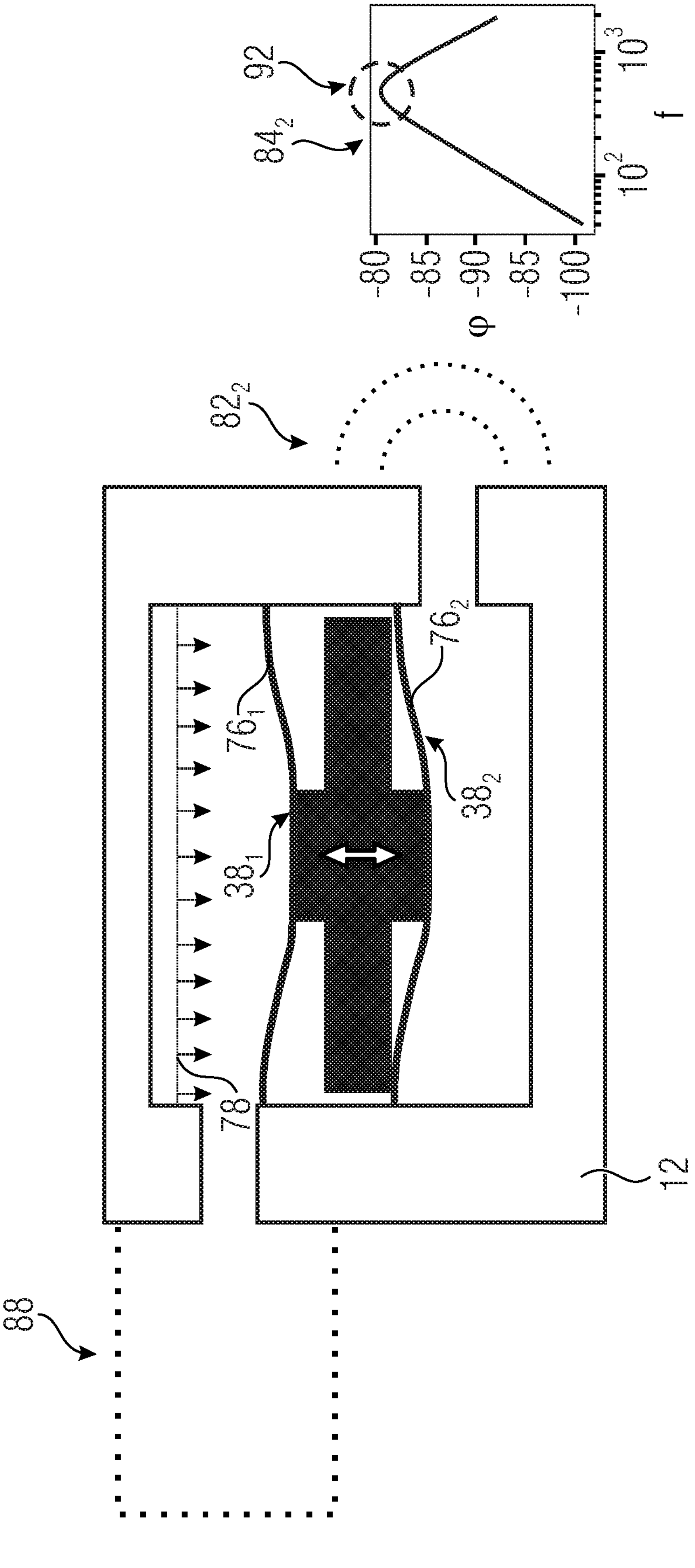

FIG. 11 a shows a schematic top view of an MEMS device 110 according to an embodiment. A resonator $44^{VII}$ has a synergetic structure. Thus, the mass element 16 is mechanically connected to a surrounding substrate 12 in an oscillating manner via active spring elements $76_1$ and $76_2$. The spring elements $76_1$ and $76_2$ are configured to actively cause a deflection of the mass element 16 by means of control. Alternatively, passive spring elements can also be arranged. A radiation $82_1$ and $82_2$ can take place along different directions. An exemplary frequency response is shown in diagram $84_1$ FIG. 11*b* shows a schematic top view of an MEMS device 110' according to an embodiment. Compared to the MEMS device 110, it includes a rear volume 88 at one of the openings of the substrate 12, approximately adjacent to the partial cavity $38_1$. This changes the frequency responses of the MEMS device 110', so that an increase 92 in the frequency response can be obtained, as exemplarily shown in a diagram 842. This is located in the resonance region of the microresonator. This allows the remaining radiation or sound pressure level $82_2$ to be adjusted.

Figure 12:
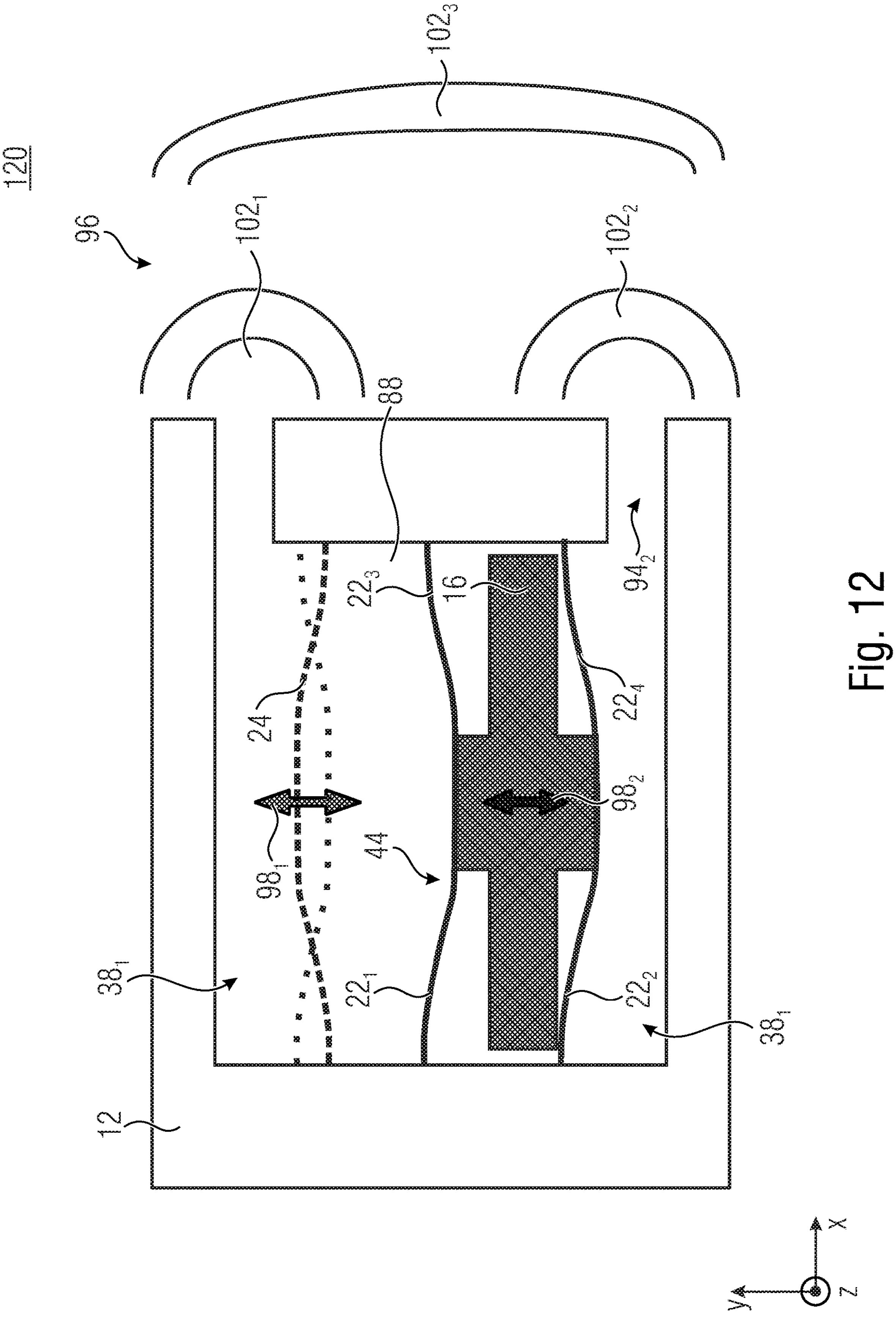
FIG. 12 is a schematic top view of an MEMS device according to an embodiment, wherein openings of a housing to different partial cavities are arranged on a same side of the housing.

FIG. 12 shows a schematic top view of an MEMS device 120 according to an embodiment, wherein a boundary or structure made of substrate 12 encloses the microresonator including spring elements $22_1$ to $22_4$ and mass element 16. The different partial cavities $38_1$ and $38_2$ are connected to an environment 96 of the MEMS via openings $94_1$ and $94_2$. The two openings $94_1$ and $94_2$ can each provide a fluidic connection of the partial cavity $38_1$ and $38_2$, respectively, located behind the same on a same side of the MEMS device 120. The actuator structure 24 can be excited to move along a direction of motion $98_1$, for example parallel to the y-direction. This can cause, by means of fluidic coupling, a movement of the mass element 16 along a direction of movement $98_2$, which can also be parallel to the y-direction, by means of orientation and/or configuration of the spring elements $22_1$ to $22_4$ but also point in a direction different therefrom. Likewise, the actuator 24 can provide movement along a direction that is not parallel to the y-direction. By enlarging or compressing the respective partial volumes $38_1$ and $38_2$, sound pressure levels $102_1$ and $102_2$ can be radiated into the environment 96 via the openings $94_1$ and $94_2$, respectively. There, the sound pressure levels $102_1$ and $102_2$ can overlap to form a total sound pressure level $102_3$. In other words, the actuator structure 24 can be coupled to a volume of the environment 96 via a first path, for example via the partial cavity $38_1$. The mass element 16 can be coupled to the volume of the environment 96 via a second path, for example via the partial cavity $38_2$, on a side facing away from the actuator structure.

The rear volume 88 can be arranged between the actuator structure 24 and the resonator 44. This can be comparatively larger or more voluminous than the partial cavities $38_1$ and/or $38_2$.

In other words, FIG. 12 shows an MEMS device 120 according to an embodiment and simultaneously a method for generating pressure differences in a cavity by means of actively deflectable bending transducers 24 and a passively deflected microresonator 44. The first pressure difference is generated by the bending transducer 24 and results in a first frequency spectrum/sound pressure level $102_1$. The second pressure difference is generated by the microresonator 44 and results in a second frequency spectrum/sound pressure level $102_2$. The method is characterized, among others, in that an actuator 24 is coupled to a resonator 44 via a fluid located in the rear volume 88. In other words, movement of the actuator 24 causes movement of the resonator 44. Here, the first frequency spectrum/sound pressure level differs from the second frequency spectrum/sound pressure level. In an embodiment, the frequencies/sound pressure levels $102_1$ are lower than the frequencies/sound pressure levels $102_2$. In further embodiments, the frequencies/sound pressure levels can be conversely greater or equal. The size of the rear volume 88 can be adjusted in a system-dependent manner and can be selected, for example, to obtain out-of-phase motion of the actuator 24 and the microresonator 44 in a predetermined frequency spectrum.

Exemplary applications of resonators described herein and/or structures obtained therewith, such as loudspeakers, can be provided in mobile phones, radio devices, tablets or laptop computers. Further applications also include loudspeakers for ultra-mobile terminals, for example hearables or hearing aids. Notwithstanding the above, embodiments can also be used in other devices for moving a fluid, for example in the field of pumps.

Thus, embodiments provide a near-field loudspeaker having an MEMS device according to embodiments described herein. Alternative embodiments provide a hearable having an MEMS device according to any of the embodiments described herein. Further embodiments provide an MEMS pump having an MEMS device according to embodiments described herein.

Figure 13B:
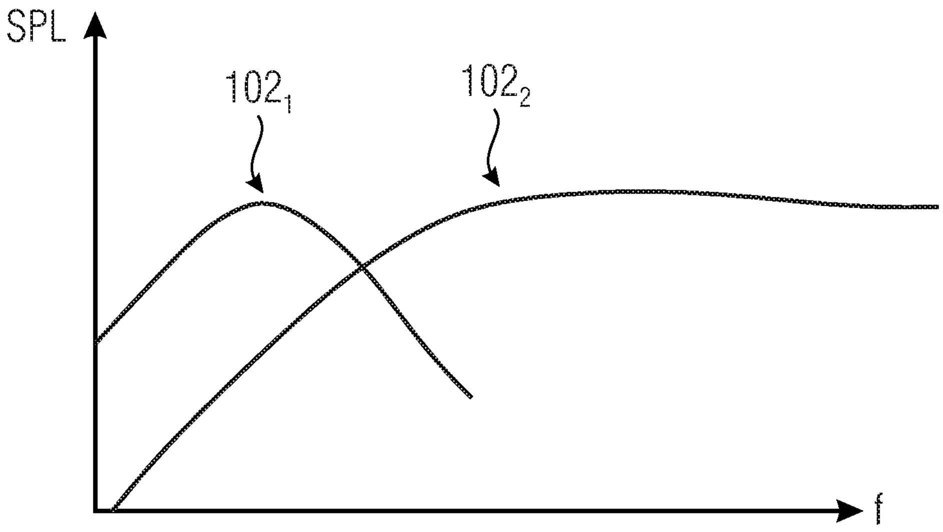
FIG. 13*b* is a schematic diagram of two different frequency ranges that can be obtained by the method of FIG. 13*a*, according to an embodiment.

FIG. 13*a* shows a schematic flow diagram of a method 1300 according to an embodiment. The method 1300 can be used to control or drive an MEMS device, for example, an MEMS device in accordance with embodiments described herein. The MEMS device includes, for example, a substrate having a substrate plane, a mass element having a rest position and configured to perform a deflection from the rest position parallel to the substrate plane and in a fluid surrounding the mass element.

Further, the MEMS device includes a spring arrangement coupled between the substrate and the mass element and configured to deform based on the deflection. Further, an actuator structure is arranged which is coupled to the mass element by means of a coupling and is configured to apply a force to the mass element by means of the coupling to cause the deflection and to cause movement of the fluid. The actuator structure is coupled to the volume via a first path and the mass element is coupled to the volume at a side opposite the actuator structure via a second path, as illustrated for example for the MEMS device 120. The method 1300 includes a step 1310: In step 1310, driving the actuator structure takes place to radiate a first sound pressure level having a first frequency range into the volume via the first path, and to radiate a second sound pressure level having a second frequency range, different from the first frequency range, into the volume via the second path. Optionally, further, additional sound pressure levels can be generated in additional frequency ranges, so that at least three, at least four or more frequency ranges are combined with each other.

At least two resonators can be provided by this. For example, a combination of at least two resonators with at least two different resonant frequencies or frequency responses can be used to obtain sound pressure levels of different frequency responses. Alternatively or additionally, it is possible for a resonator to have more than one resonant frequency and/or to radiate frequency responses, such as that obtained using MEMS device $\mathbf{10}_3$.

The first sound pressure level and the second sound pressure level can be the same or different. Although the first frequency range and the second frequency range can also be the same, embodiments provide for differences in the frequency ranges, which can be obtained by at least one of the two frequency ranges having frequencies within which at most negligible sound pressure levels are generated in the other frequency range, as shown for example in FIG. 13*b* for sound pressure levels $\mathbf{102}_1$ and $\mathbf{102}_2$. Although the sound pressure level $\mathbf{102}_1$ includes lower frequencies than the sound pressure level $\mathbf{102}_2$, this can also be the other way round and/or a partial overlap of the frequencies can occur and/or different bandwidths can be provided. A bandwidth of the first and/or second frequency range can be the same or different and can be, for example, at least 5 Hz and at most 4 kHz, at least 10 Hz and at most 3 kHz, or at least 50 Hz and at most 2.5 kHz, these values being merely exemplary and not limiting.

The generation of sound pressure levels in two or more frequency ranges can alternatively or additionally be achieved by controlling a corresponding number of resonators acoustically coupled to each other. Advantageously, the resonant frequencies of the resonators are selected such that they complement each other well to optimally in the overall spectrum according to a configuration criterion and adjust or expand the reproduction bandwidth of the system accordingly. The differences with regard to the resonant frequencies and/or the quality can be adjusted by constructive tuning of the involved mechanical stiffnesses and resonating masses.

The at least two resonators can be arranged in a common volume and/or use a common front volume or rear volume, such as in the MEMS device 120.

Embodiments described herein, particularly with respect to the loudspeakers, are directed to MEMS and thus to structures including silicon material. In particular, the substrate 12 can include silicon material. Other elements or sub-elements can also include silicon material.

Embodiments described herein can be used to provide sound radiation in the fluid. The sound radiation can have frequencies in a range between 300 Hz and 3400 Hz and thus be applicable, for example, to the frequency range of human speech.

According to embodiments, there is provided a control unit, for example a microcontroller, a field programmable gate array (FPGA), a central processing unit (CPU) or an application-specific integrated circuit (ASIC), configured to provide control of the actuator structure so as to deflect the mass element. According to embodiments, the control unit is configured to cause deflection of the actuator structure by controlling the same so as to generate a first frequency spectrum in the fluid and provide an oscillation of the mass element, such that the oscillation of the mass element provides an increase in amplitude of the resulting sound in a second frequency spectrum of the cavity in which the MEMS device is arranged. For example, the individual elements can be tuned so that the actuator structure radiates a particular frequency spectrum corresponding to a resonant frequency of the microresonator or vice versa. In this way, lower frequencies can be radiated through a first frequency range of the actuator structure than by means of the mass element or vice versa.

In other words, one of the objectives of the present invention is to extend the transmission range of the sound sources. Sound sources within the meaning of this application are loudspeakers for in-ear and near-field applications (for example in mobile phones or tablets). The two fields of application are to be distinguished.

In the in-ear application, the space between eardrums and the hearable represents a pressure chamber, which can be regarded to be dense. The transmission range is limited at high frequencies by the position of the resonant frequency, so the target is to create additional resonances above the actual actuator resonance in order to extend the transmission range towards high frequencies. For low frequencies, the so-called Harman curve for in-ear headphones shows a liking for higher sound pressure levels. The design of the frequency response can also be performed by resonator elements.

The picture is different for near-field loudspeakers. The transmission range is limited at the bottom by the position of the resonance. Below the resonance, the level decreases. By increasing the actuator mass, the resonant frequency of the actuator itself and the transmission range downwards can be increased. Further possibilities arise by coupling additional resonators whose resonance can be below the actual actuator resonance. A purely acoustic Helmholtz resonator in silicon is unsuitable for the extension towards low frequencies, since the resonating air mass would be too small to enable low resonant frequencies due to the small structural sizes. This problem is solved by the embodiments described herein, wherein resonating of mechanical structures is provided, for example analogous to a bass reflex box with one or more passive diaphragms. The object is solved by an MEMS layer system. Cavities can be formed in a plane of the layer system, in which deflectable elements are arranged, which are laterally spaced apart from each other.

In this or in a further plane of the layer system or in a combination thereof, an oscillating mass is arranged in the cavity, which is coupled to the surrounding substrate by means of connecting elements. The mass and the connecting elements together form a resonator. This resonator is arranged laterally spaced from the deflectable elements. The connecting elements are configured such that a lateral deformation in the plane is possible. Deformation perpendicular to the plane is prevented or inhibited by the geometry. The resonator is fluidically coupled to the deflectable elements. The deflectable element can be an actively deflectable element, which is the advantageous configuration. However, a passive configuration is also possible. In embodiments, the deflectable element can therefore be passive. The same can then be connected to an actively deflectable element via coupling elements. The actively deflectable elements are arranged in a different plane than the passively deflectable elements. This has the advantage that a higher number of these deflectable elements, referred to as actuators, can be arranged in the plane of the actively deflectable elements. This increases the force to be applied within the actuator plane. The distance between resonator and the surrounding substrate, perpendicular to the plane, can be minimal, so that an acoustic short circuit is prevented.

The use of rear sound radiation (cf. the bass reflex principle) and the coupling of the resonator enable 180° phase rotation and thus a deflection of the sound and radiation to the front or in another direction. The realization in MEMS, for example by passive beams, is possible, especially if the air mass is not sufficient. Embodiments allow a realization in silicon, which makes it possible to omit rear sound radiation and thus housing/encapsulation.

Embodiments relate, among others, to the following implementations:

Device
- MEMS consists of or comprises a layer system
- cavities are formed in a plane of the layer system, wherein deflectable elements are arranged that are laterally spaced apart from each other.
- in one plane of the layer system, an oscillating mass is arranged in the cavity, which is coupled to the surrounding substrate by means of connecting elements. The mass and the connecting elements together form a resonator.
  - The resonator is laterally spaced from the deflectable elements
  - the connecting elements are configured such that lateral deformation in the plane is possible. Deformation perpendicular to the plane is prevented by the geometry.
- The resonator is coupled with deflectable elements
  - coupling can be fluidic or through a rigid connection
  - the deflectable element can be an actively deflectable element, advantageously a micromechanical transducer
- The distance between resonator and surrounding substrate (top and bottom), perpendicular to the plane, is minimal so that an acoustic short circuit is prevented.

Examples of the resonator
- The resonator is arranged between a first and a second micromechanical transducer, the connecting elements are configured in a passive manner (FIG. 1, basic principle).
  - the stiffness of the connecting elements influences the resonant frequency of the resonator
  - the mass of the resonator influences the resonant frequency of the resonator
  - the stiffness of the connecting element is determined by their geometry. A wide variety of geometries are possible.
- The resonator is arranged between a micromechanical transducer and a cavity boundary in the layer plane (FIG. 2, basic principle variant B).
  - There is an increase in the resonance range of the resonator in the frequency response
- The adjustable resonator is arranged between a first and a second micromechanical transducer, the connecting elements are configured in an active manner (FIG. 3)
  - The connecting elements are configured in an active manner. The stiffness of the connecting element can be influenced by applying a signal.
  - The active connecting elements can be the known NED-based actuators. FIG. 3 shows the so-called ANED configuration.
- Another embodiment of an adjustable resonator is the arrangement of alternative actuators (FIG. 4)
  - The active connecting elements are configured as a "muscle". Advantageously, this results in a higher force to be applied by the active connecting element compared to an embodiment with a classic NED actuator. The higher force increases the adjustment range of the stiffness.
- Another embodiment relates to the arrangement of deflectable elements in a further layer of the MEMS layer system (FIG. 5).
  - Active deflectable elements are arranged in a first layer, passively deflectable elements are arranged in a second layer. The passively deflectable elements are fluidically coupled to the resonator.
  - The passive elements are coupled to the active elements.
- A further embodiment relates to the configuration of the microresonator (FIG. 6)
  - Microresonator with a first mass generates a first resonant frequency
  - Arrangement of a second mass within the first mass of the resonator generates a second resonant frequency that differs from the first resonant frequency
- Further embodiments relate to the geometry of the connecting elements between the mass of the resonator and the surrounding fluid (FIG. 7*a-c*)

The geometries can be curved, variable or meandering.

Variable geometry means a thickening in the area of the connection of the connecting elements to the substrate or to the mass in order to prevent excessive stress in the area of the clamping.

Connection of the cavity with the surrounding fluid

The openings connecting the cavity with the surrounding fluid can be arranged in the lid wafer and in the bottom wafer The arrangement is alternating. This means that one partial cavity is connected to the surroundings through the lid wafer. The "corresponding" partial cavity is connected to the surrounding fluid through openings in the bottom wafer.

The openings can run across the entire width of the resonator or only partially.

In alternative embodiments, the openings can also be arranged in the layer in the surrounding substrate.

Further embodiments relate to a multilayered structure. (FIG. 8*a*-*e*)

Resonator level and actuator level are separated from each other. Advantageously, this results in a better area usage of a chip Actuator and resonator are connected to each other via a coupling element. The coupling element has a stiffness that is at least higher than the actuators.

Height of the actuators=from 1 um to 1 mm, advantageously 30 um to 150 um, particularly advantageously 75 um Height of the microresonators=from 1 um to 5 mm, advantageously 400 um to 650 um Further embodiments relate to a single-layer structure with a rigid connection between resonator and deflectable element. (FIG. 9)

Method for Generating Low-Frequency Sound

A method (using the apparatus of, for example, FIG. 3*a*) of generating pressure differences in a cavity by means of actively deflectable bending transducers 1200 and a passively deflected microresonator 1100. The first pressure difference is generated by the bending transducer 1200 and results in a first frequency spectrum 200. The second pressure difference is generated by the one microresonator 1100 and results in a second frequency spectrum 300. The method is characterized in that an actuator 1200 is coupled to a resonator 1100 via a fluid located in a rear volume 100. In other words, a movement of the actuator 1200 causes a movement of the resonator 1100. The first frequency spectrum differs from the second frequency spectrum. In an embodiment, the frequencies of the first frequency spectrum are lower than the frequencies of the second frequency spectrum. In further embodiments, the frequencies of the first frequency spectrum can be higher or equal compared to the second frequency spectrum. The size of the rear volume 100 depends on the system and is selected, for example, to ensure out-of-phase movement of actuator 1200 and microresonator 1100 in an intended frequency spectrum.

Usage

Near-field loudspeakers for mobile internet-enabled terminals (smartphone, phone, tablet, laptop) and ultra-mobile internet-enabled terminals (hearables)

Configuration of a near-field loudspeaker in MEMS with a resonant frequency of approx. 300-400 Hz (or lower), or a resonator integrated in the loudspeaker, such that the transmission bandwidth of the near-field loudspeaker extends from approx. 300 Hz to at least 3.4 kHz and is thus suitable at least for the reproduction of speech signals.

Although some aspects have been described in relation to a device, it is understood that these aspects also constitute a description of the corresponding process, so that a block or component of a device is also to be understood as a corresponding process step or as a feature of a process step. Similarly, aspects described in relation to or as a process step also constitute a description of a corresponding block or detail or feature of a corresponding device.

In some embodiments, a programmable logic device (for example, a field programmable gate array, an FPGA) can be used to perform some or all of the functionalities of the methods described herein. In some embodiments, a field programmable gate array can cooperate with a microprocessor to perform any of the methods described herein. Generally, in some embodiments, the methods are performed on the part of any hardware device. This can be general-purpose hardware such as a computer processor (CPU), or hardware specific to the method, such as an ASIC.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A MEMS device, comprising:

a substrate with a substrate plane;

a mass element comprising a rest position and configured to perform deflection from the rest position in parallel to the substrate plane and in a fluid surrounding the mass element;

a spring arrangement coupled between the substrate and the mass element and configured to deform based on the deflection; and an actuator structure coupled to the mass element by means of a coupling and configured to apply a force to the mass element by means of the coupling to cause the deflection and to cause a movement of the fluid.

2. The MEMS device according to claim 1, wherein the coupling comprises a fluidic coupling and an actuation of the actuator structure provides a movement in the fluid which at least partly applies the force to the mass element.

3. The MEMS device according to claim 1, wherein the mass element is passive.

4. The MEMS device according to claim 3, wherein the mass element forms a resonator together with a passive spring arrangement and the actuator structure is fluidically coupled to the resonator.

5. The MEMS device according to claim 1, wherein a connecting element is arranged between the actuator structure and the mass element to provide the coupling.

6. The MEMS device according to claim 1, wherein the mass element and the spring arrangement form at least part of a spring-mass system comprising an oscillation eigenfrequency, wherein the actuator structure is configured to excite the oscillation eigenfrequency.

7. The MEMS device according to claim 1, wherein the actuator structure is arranged at least partly in a common plane parallel to the substrate plane, along a deflection direction of the deflection laterally adjacent to the mass element to provide the force at least partly parallel to the substrate plane.

8. The MEMS device according to claim 1, wherein the spring arrangement is a first spring arrangement and that further comprises a second spring arrangement coupled between the substrate and the mass element and configured to deform based on the deflection, wherein the mass element is arranged between the first spring arrangement and the second spring arrangement.

9. The MEMS device according to claim 1, wherein the mass element is suspended at least on one side using the spring arrangement.

10. The MEMS device according to claim 1, wherein the mass element is suspended in an oscillating manner using the spring arrangement along a first oscillation direction and at least a second oscillation direction different from the first oscillation direction.

11. The MEMS device according to claim 10, wherein the spring arrangement comprises a first spring stiffness along the first oscillation direction providing a first resonant frequency of an oscillation of the mass element along the first oscillation direction; and wherein the spring arrangement comprises a second spring stiffness along the second oscillation direction providing a second resonant frequency of an oscillation of the mass element along the second oscillation direction.

12. The MEMS device according to claim 1, wherein the spring arrangement comprises at least two spring elements connected in parallel.

13. The MEMS device according to claim 1, wherein the spring arrangement and the mass element are integrally configured and are formed comprising an MEMS material, and a spring element of the spring arrangement is formed by a recess in the MEMS material.

14. The MEMS device according to claim 13, wherein the recess comprises at least a U-shaped geometry with two outer legs and a central leg arranged therebetween, wherein the spring element is formed in an area of an outer leg.

15. The MEMS device according to claim 1, wherein the spring arrangement is actively formed and is configured to provide a variable spring stiffness for the deflection based on a variable control of the spring arrangement.

16. The MEMS device according to claim 1 that is part of a layer structure, further comprising a first boundary layer arranged perpendicular to a deflection direction of the deflection and limiting a volume for the fluid.

17. The MEMS device according to claim 16, wherein a first partial cavity of the MEMS device is fluidically connected to an environment of the MEMS device on a first side of the mass element in parallel or perpendicular to the deflection direction through at least a first opening; and a second partial cavity of the MEMS device is fluidically connected to the environment of the MEMS device on a second side of the mass element opposite to the first side through at least a second opening; wherein the first opening and the second opening are arranged opposite to one another on different sides of the MEMS device; or wherein the first partial cavity of the MEMS device is fluidically connected to the environment of the MEMS device on the first side of the mass element parallel to the deflection direction by at least a first opening; and the second partial cavity of the MEMS device is fluidically connected to the environment of the MEMS device on the second side of the mass element opposite to the first side through at least a second opening; wherein the first opening and the second opening are arranged on a same side of the MEMS device.

18. The MEMS device according to claim 1, wherein the actuator structure comprises a first actuator structure element and a second actuator structure element that are arranged parallel to the substrate plane in a common plane with the mass element, and the first actuator structure element at least partly defines a first partial cavity of the MEMS device together with the mass element, and the second actuator structure element at least partly defines a second partial cavity of the MEMS device together with the mass element, wherein the first actuator structure element and the second actuator structure element are mechanically connected by a coupling element that is configured to couple a deflection of the first actuator structure element and the second actuator structure element.

19. The MEMS device according to claim 1, comprising a plurality of spring arrangements comprising the spring arrangement that are arranged interleaved with each other.

20. The MEMS device according to claim 1, wherein a spring element of the spring arrangement comprises a straight, curved or meandering geometry and/or comprises a variable dimension perpendicular to a spring extension direction.

21. The MEMS device according to claim 1, wherein a spring element of the spring arrangement comprises a mechanical reinforcement at least one spring end.

22. The MEMS device according to claim 1, wherein the MEMS device comprises a plurality of mass elements, wherein at least one actuator structure is arranged between two adjacent mass elements.

23. The MEMS device according to claim 1, wherein the actuator structure is arranged in a first MEMS plane and the mass element is arranged in a second different MEMS plane and the actuator structure is mechanically coupled to the mass element.

24. The MEMS device according to claim 1, wherein a distance between the mass element and an adjacent boundary layer partly limiting a cavity where the mass element is arranged influences a Q factor and the MEMS device comprises an overshoot of at most 20% in a range of a resonant frequency of an oscillation of the mass element.

25. The MEMS device according to claim 22, wherein different mass elements are configured for oscillation with different resonant frequencies.

26. The MEMS device according to claim 1, comprising an active element arranged at least partly in a plane offset to a plane of the mass element and coupled to part of the actuator structure, which is arranged in a common plane with the mass element.

27. The MEMS device according to claim 1, wherein a control unit is arranged and configured to control the actuator structure to radiate a particular frequency spectrum corresponding to a resonant frequency of a resonator comprising a ground element, the spring arrangement and the actuator structure, or vice versa.

28. The MEMS device according to claim 1, comprising a control unit configured to provide a control of the actuator structure to deflect the mass element, wherein the control unit is configured to cause deflection of the actuator structure generating a first frequency spectrum in the fluid and providing an oscillation of the mass element; such that the oscillation of the mass element provides a second frequency spectrum in a cavity where the MEMS device is arranged.

29. The MEMS device according to claim 1, wherein the actuator structure is coupled to a volume via a first path and the mass element is coupled to the volume via a second path on a side facing away from the actuator structure.

30. An apparatus comprising the MEMS device according to claim 1, wherein the apparatus is configured as one of a near-field loudspeaker, a hearable and an MEMS loudspeaker.

31. A MEMS loudspeaker comprising the MEMS device according to claim 1.

32. A method for controlling an MEMS device comprising a substrate with a substrate plane; a mass element comprising a rest position and configured to perform deflection from the rest position in parallel to the substrate plane and in a fluid surrounding the mass element; a spring arrangement coupled between the substrate and the mass element and configured to deform based on the deflection; and an actuator structure coupled to the mass element and configured to apply a force to the mass element to cause the deflection and to cause a movement of the fluid, wherein the actuator structure is coupled to a volume via a first path and the mass element is coupled to the volume via a second path on a side facing away from the actuator structure; the method comprising:

controlling the actuator structure to radiate a first sound pressure level with a first frequency range into the volume via the first path; and to radiate a second sound pressure level with a second different frequency range into the volume via the second path.

33. The method according to claim 32, wherein the first sound pressure level and the second sound pressure level are excited with a frequency matching within a tolerance range of 5% and are superimposed in the volume.

* * * * *